United States Patent
Yamazaki et al.

(10) Patent No.: US 10,134,781 B2
(45) Date of Patent: Nov. 20, 2018

(54) CAPACITOR AND SEMICONDUCTOR DEVICE

(71) Applicant: Semiconductor Energy Laboratory Co., Ltd., Kanagawa-ken (JP)

(72) Inventors: Shunpei Yamazaki, Tokyo (JP); Junichi Koezuka, Tochigi (JP); Masahiro Katayama, Tochigi (JP); Masami Jintyou, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/462,994

(22) Filed: Aug. 19, 2014

(65) Prior Publication Data

US 2015/0053973 A1 Feb. 26, 2015

(30) Foreign Application Priority Data

Aug. 23, 2013 (JP) .................................. 2013-173867
Feb. 28, 2014 (JP) .................................. 2014-038563

(51) Int. Cl.
  *H01L 29/10* (2006.01)
  *H01L 27/12* (2006.01)
  *H01L 29/94* (2006.01)

(52) U.S. Cl.
  CPC ...... *H01L 27/1255* (2013.01); *H01L 27/1225* (2013.01); *H01L 29/94* (2013.01)

(58) Field of Classification Search
  USPC ............................................. 257/43; 438/104
  See application file for complete search history.

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Shaun Campbell
(74) *Attorney, Agent, or Firm* — Husch Blackwell LLP

(57) ABSTRACT

A semiconductor device has an insulating surface provided with a transistor and a capacitor. The transistor includes a gate electrode, an oxide semiconductor film overlapping with the gate electrode, a gate insulating film between the gate electrode and the oxide semiconductor film, and a first conductive film serving as a pair of electrodes in contact with the oxide semiconductor film. An oxide insulating film in contact with the oxide semiconductor film, a metal oxide film over the oxide insulating film, and a second conductive film serving as a pixel electrode which is in an opening in the metal oxide film and is in contact with the first conductive film are provided. The capacitor includes a film having conductivity over the gate insulating film, the second conductive film, and the metal oxide film provided between the film having conductivity and the second conductive film.

38 Claims, 31 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,187,031 B2 | 3/2007 | Azuma |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,102,476 B2 | 1/2012 | Son et al. |
| 8,324,027 B2 | 12/2012 | Yamazaki et al. |
| 8,441,011 B2 | 5/2013 | Yamazaki et al. |
| 8,476,625 B2 | 7/2013 | Kimura |
| 8,835,920 B2 | 9/2014 | Yamazaki et al. |
| 8,872,171 B2 | 10/2014 | Yamazaki et al. |
| 8,927,985 B2 | 1/2015 | Matsukura |
| 8,937,307 B2 | 1/2015 | Yamazaki |
| 8,975,695 B2 | 3/2015 | Yamazaki |
| 8,981,372 B2 | 3/2015 | Yamazaki |
| 8,981,374 B2 | 3/2015 | Kubota et al. |
| 9,018,624 B2 | 4/2015 | Yamazaki |
| 9,054,138 B2 | 6/2015 | Yamazaki et al. |
| 9,231,002 B2 | 1/2016 | Oikawa et al. |
| 9,246,047 B2 | 1/2016 | Yamazaki |
| 9,293,480 B2 | 3/2016 | Yamazaki et al. |
| 9,337,343 B2 | 5/2016 | Yamazaki et al. |
| 9,391,097 B2 | 7/2016 | Yuan |
| 9,425,220 B2 | 8/2016 | Miyake et al. |
| 9,437,741 B2 | 9/2016 | Yamazaki et al. |
| 9,478,535 B2 | 10/2016 | Yamazaki et al. |
| 9,490,277 B2 | 11/2016 | Yamazaki et al. |
| 9,494,830 B2 | 11/2016 | Yamazaki et al. |
| 9,535,277 B2 | 1/2017 | Yamazaki et al. |
| 9,754,974 B2 | 9/2017 | Yamazaki et al. |
| 9,947,797 B2 | 4/2018 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0265254 A1 | 10/2008 | Nishiura |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101895 A1 | 4/2009 | Kawamura et al. |
| 2009/0114910 A1 | 5/2009 | Chang |
| 2009/0134399 A1 | 5/2009 | Sakakura et al. |
| 2009/0141203 A1* | 6/2009 | Son .................. G02F 1/136213 349/39 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2010/0301328 A1 | 12/2010 | Yamazaki et al. |
| 2011/0006302 A1* | 1/2011 | Yamazaki et al. ............... 257/43 |
| 2011/0032435 A1 | 2/2011 | Kimura |
| 2011/0095288 A1 | 4/2011 | Morosawa et al. |
| 2012/0062811 A1 | 3/2012 | Miyake |
| 2012/0062814 A1* | 3/2012 | Yamazaki et al. ............... 349/43 |
| 2012/0119205 A1 | 5/2012 | Taniguchi et al. |
| 2012/0138932 A1 | 6/2012 | Lin et al. |
| 2013/0161610 A1 | 6/2013 | Yamazaki |
| 2014/0014948 A1 | 1/2014 | Matsukura |
| 2014/0034954 A1 | 2/2014 | Yamazaki et al. |
| 2014/0070209 A1 | 3/2014 | Yamazaki et al. |
| 2014/0084264 A1* | 3/2014 | Lee ............................... 257/40 |
| 2014/0175432 A1 | 6/2014 | Yamazaki et al. |
| 2014/0175433 A1 | 6/2014 | Yamazaki et al. |
| 2014/0175436 A1 | 6/2014 | Yamazaki |
| 2014/0183523 A1* | 7/2014 | Endo ............................. 257/43 |
| 2014/0183528 A1 | 7/2014 | Endo |
| 2014/0299874 A1 | 10/2014 | Yamazaki |
| 2014/0306219 A1 | 10/2014 | Yamazaki et al. |
| 2014/0313446 A1 | 10/2014 | Kubota |
| 2014/0333864 A1 | 11/2014 | Miyake et al. |
| 2014/0362317 A1 | 12/2014 | Kubota et al. |

(56) References Cited

U.S. PATENT DOCUMENTS

| | | |
|---|---|---|
| 2015/0014681 A1 | 1/2015 | Yamazaki |
| 2017/0365626 A1 | 12/2017 | Yamazaki et al. |

FOREIGN PATENT DOCUMENTS

| | | |
|---|---|---|
| EP | 2 256 814 A1 | 12/2010 |
| EP | 2 579 237 A1 | 4/2013 |
| EP | 2 800 140 A1 | 11/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-123192 A | 4/2002 |
| JP | 2002-289859 A | 10/2002 |
| JP | 2003-086000 A | 3/2003 |
| JP | 2003-086808 A | 3/2003 |
| JP | 2004-006891 A | 1/2004 |
| JP | 2004-103957 A | 4/2004 |
| JP | 2004-273614 A | 9/2004 |
| JP | 2004-273732 A | 9/2004 |
| JP | 2005-077822 | 3/2005 |
| JP | 2006-165528 | 6/2006 |
| JP | 2007-220817 | 8/2007 |
| JP | 2008-275937 A | 11/2008 |
| JP | 2010-016163 | 1/2010 |
| JP | 2011-009719 A | 1/2011 |
| JP | 2011-035388 A | 2/2011 |
| JP | 2011-138934 | 7/2011 |
| JP | 2015-504246 | 2/2015 |
| WO | WO-2004/114391 | 12/2004 |
| WO | WO 2011/004755 A1 | 1/2011 |
| WO | WO 2011/148537 A1 | 12/2011 |
| WO | WO 2013/097519 A1 | 7/2013 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn—Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Device Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Appl. Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Diegest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystal Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Paperes, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg—Silicon Technology", SID Digest '04 : SID International Symposium Diegst of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawan et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H at al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.
Li.C at al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S at al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B) 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure To Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

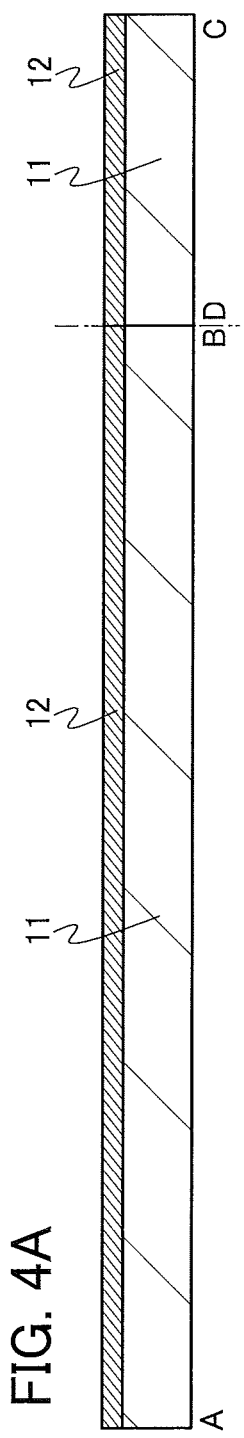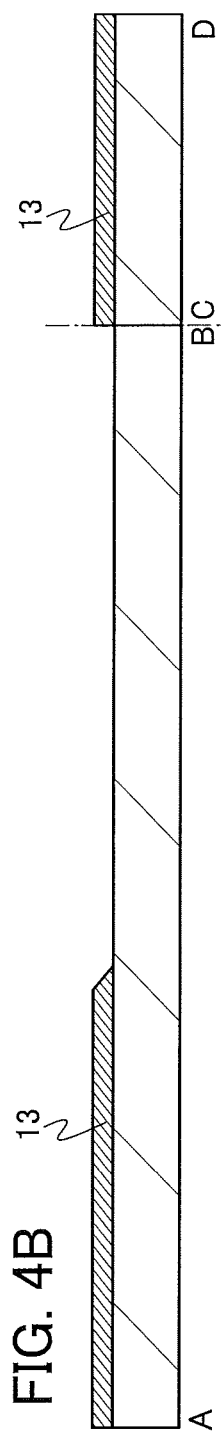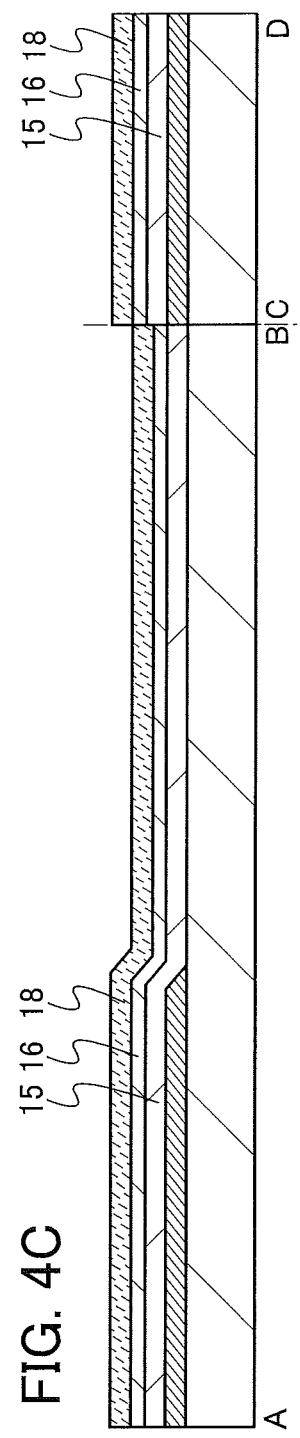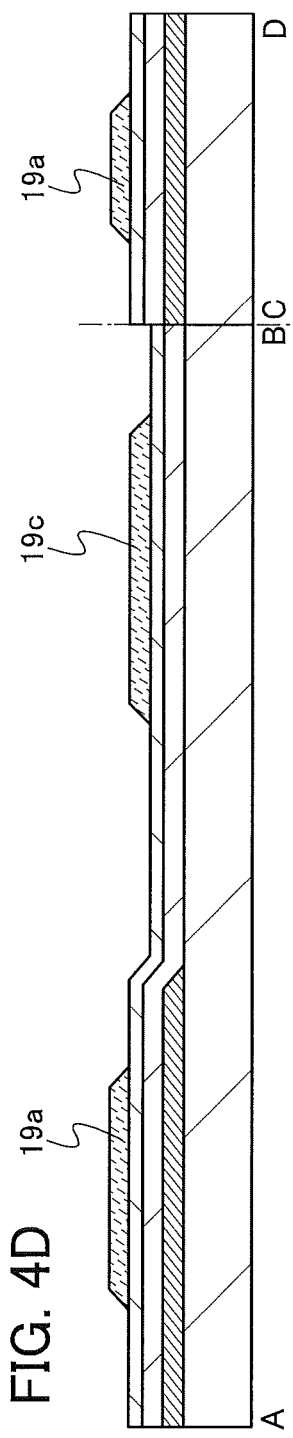

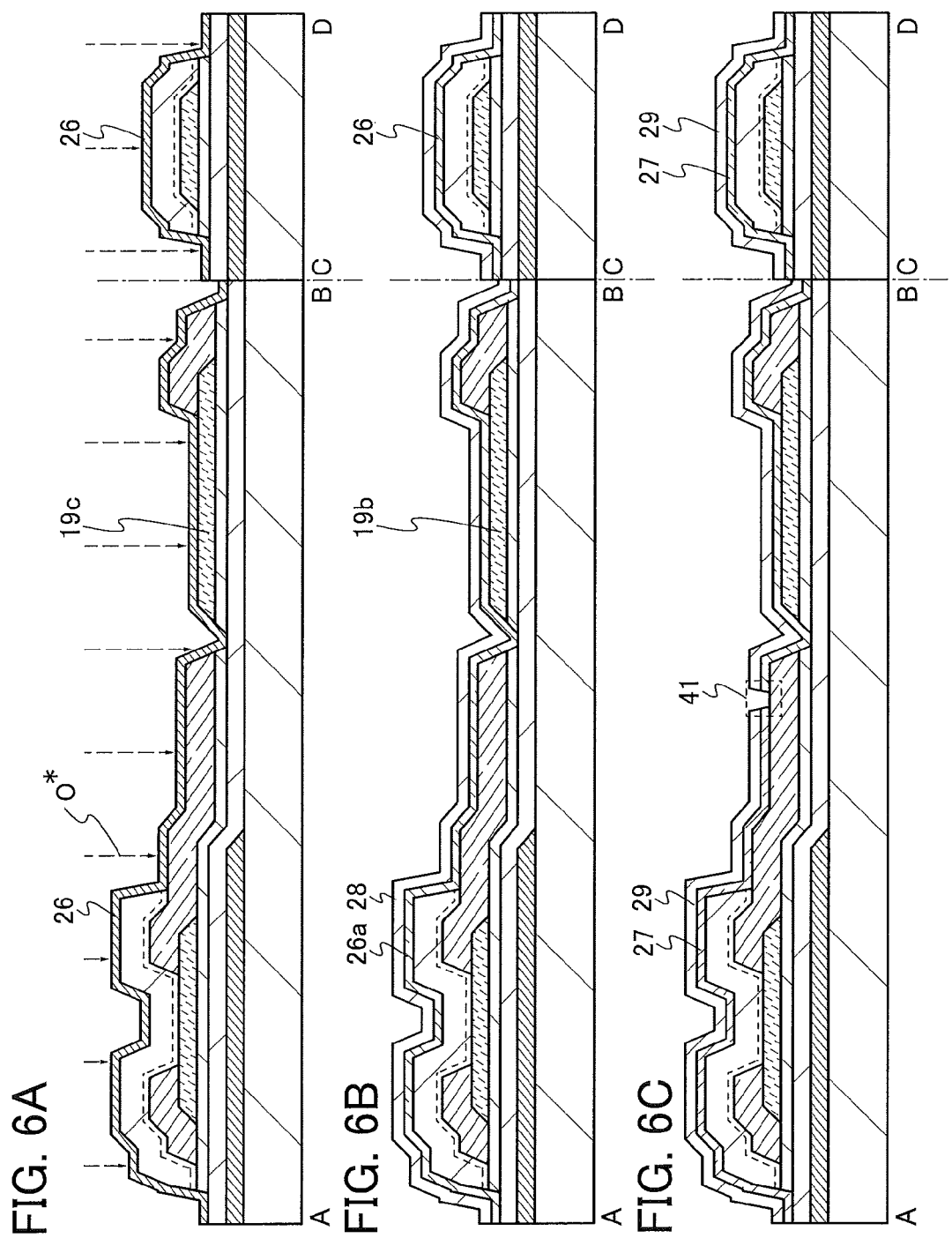

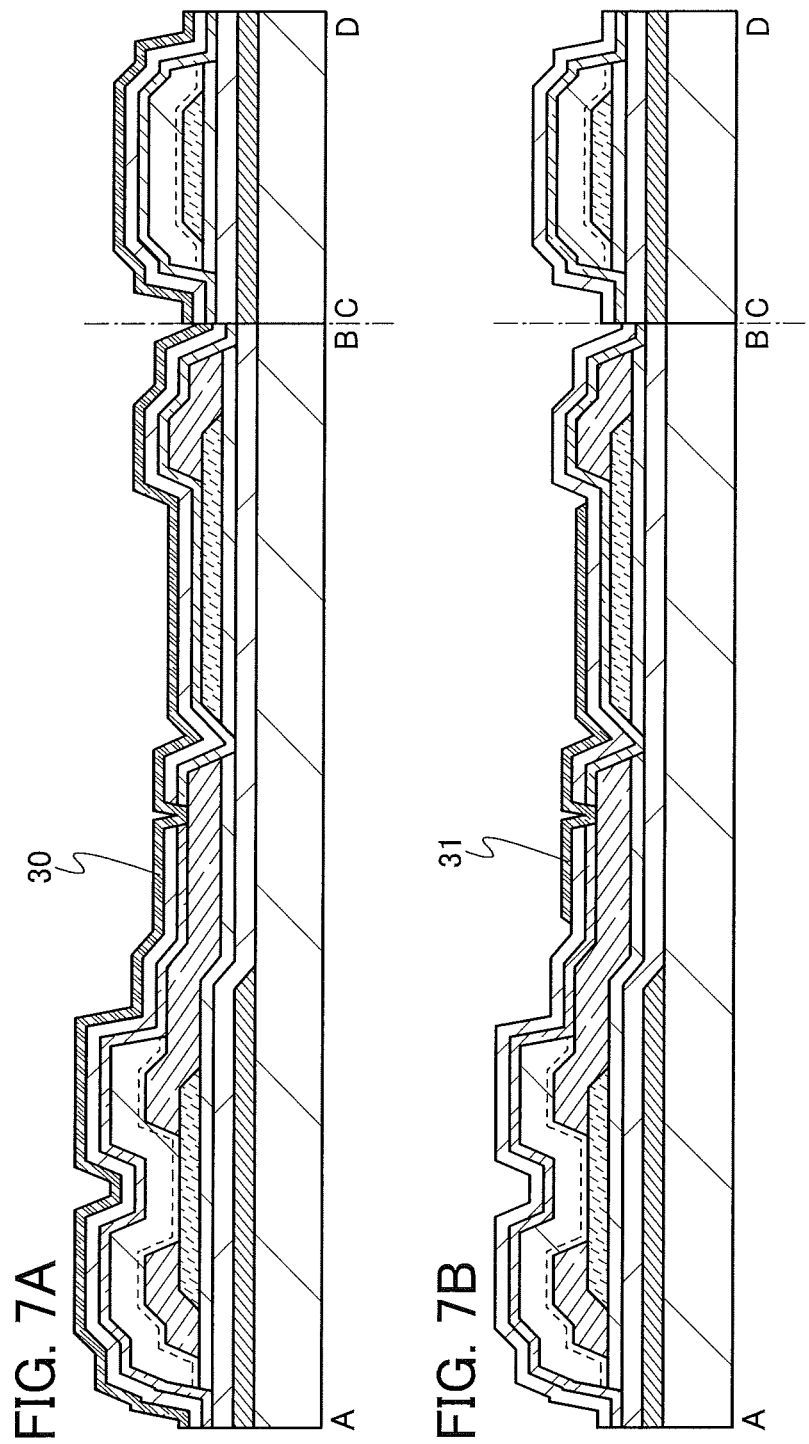

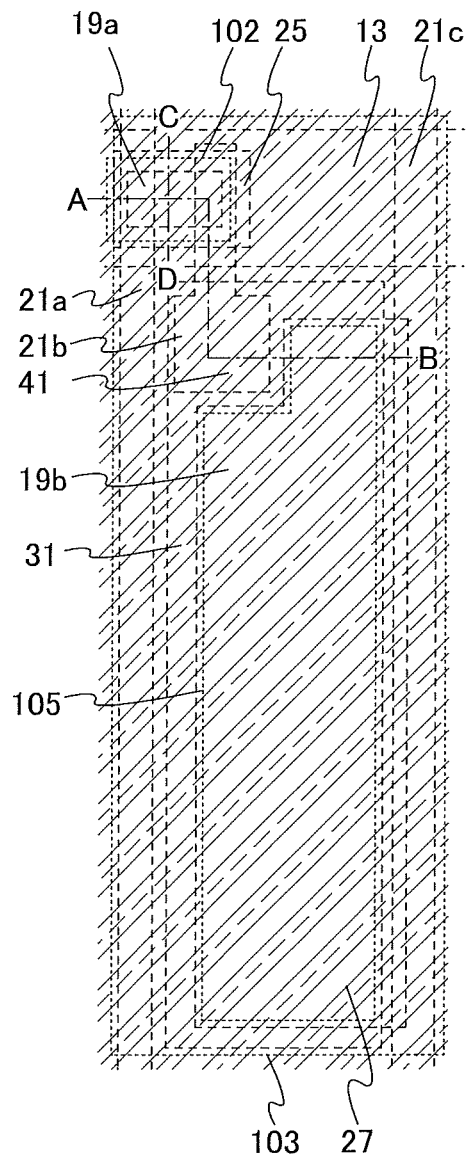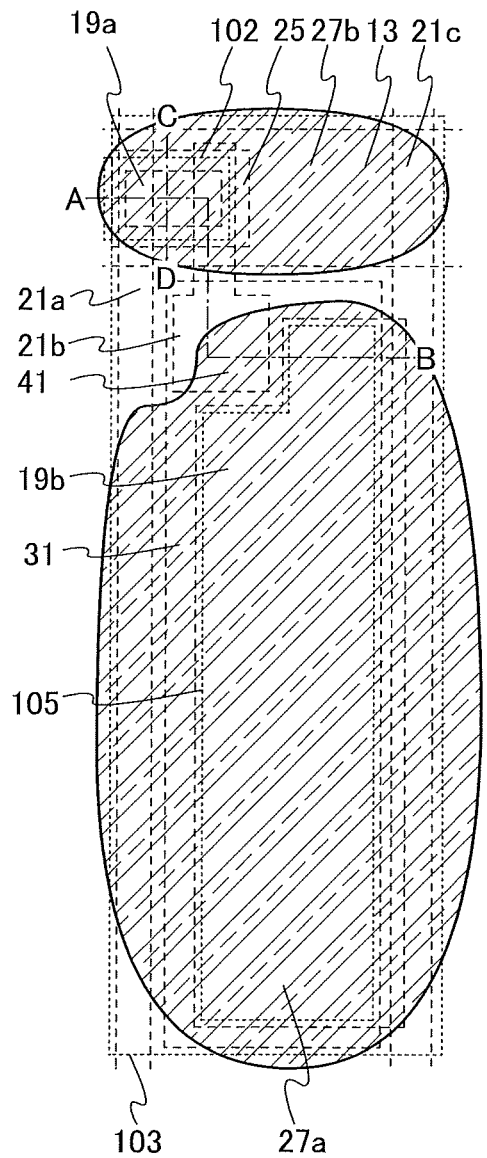

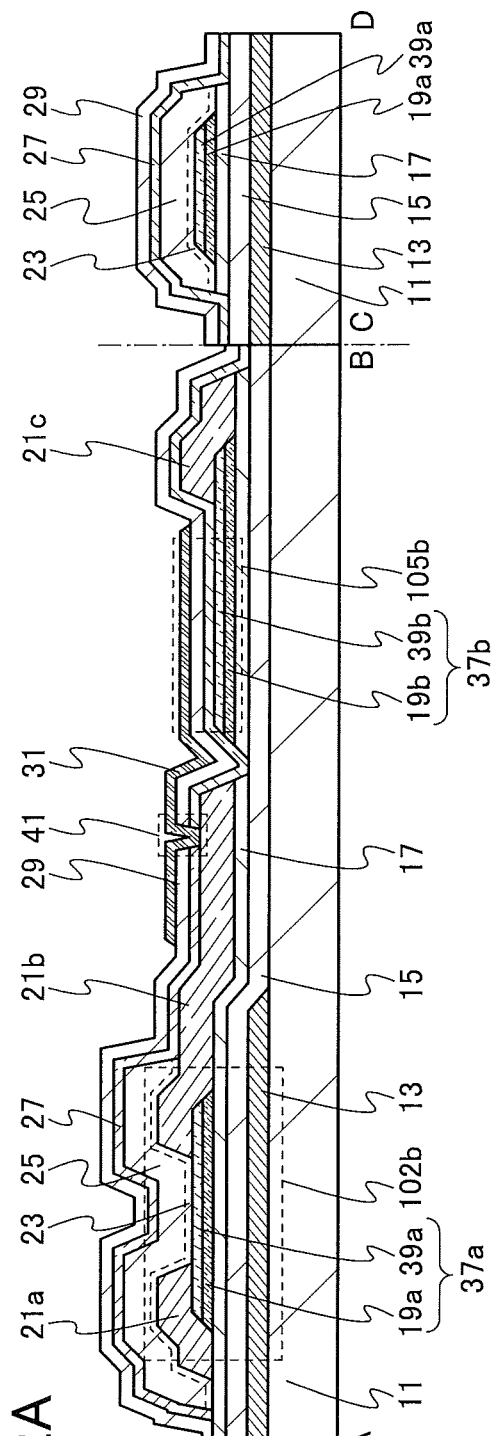
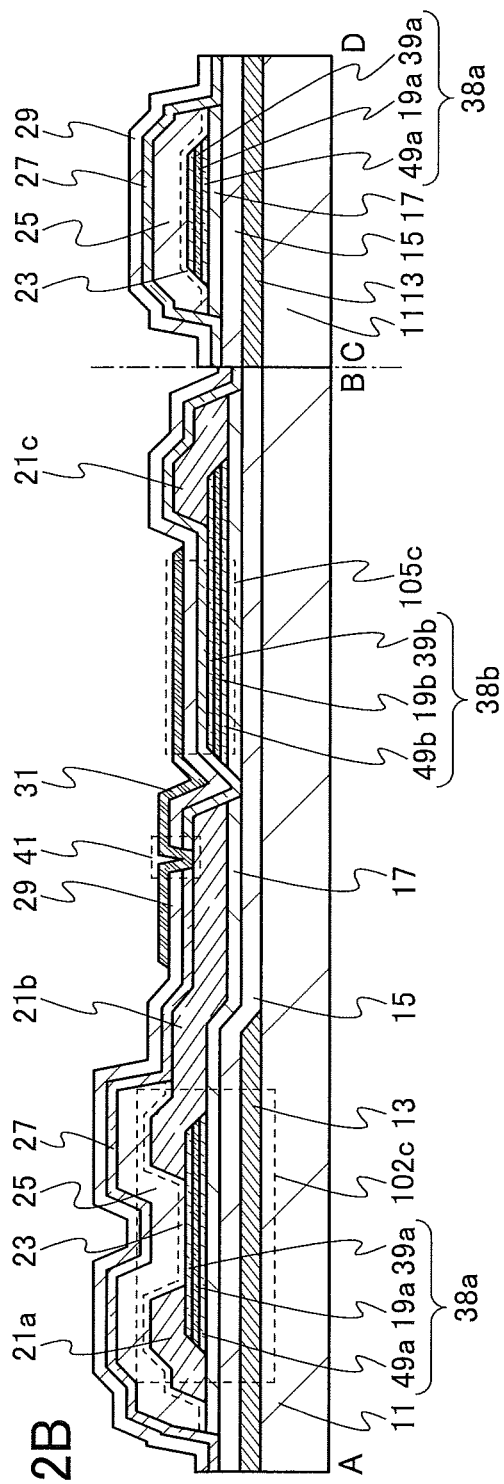

CAPACITOR AND SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. One embodiment of the present invention particularly relates to a semiconductor device, a display device, a light-emitting device, a power storage device, a driving method thereof, or a manufacturing method thereof. In particular, one embodiment of the present invention relates to a capacitor including, as an electrode, a film containing materials that can form an oxide semiconductor and a manufacturing method thereof, or a semiconductor device including a transistor including an oxide semiconductor film and a manufacturing method thereof.

2. Description of the Related Art

Attention has been focused on a technique for forming a transistor using a semiconductor thin film formed over a substrate (also referred to as a thin film transistor (TFT)). Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer has been disclosed (see Patent Document 1).

In addition, a technique for improving carrier mobility by forming a stack of oxide semiconductor films that is used for an active layer of a transistor has been disclosed (see Patent Document 2).

It has been pointed out that by entry of impurities such as hydrogen, an electrically shallow donor level is formed and electrons serving as carriers are generated in an oxide semiconductor. As a result, the threshold voltage of a transistor including an oxide semiconductor shifts in the negative direction and the transistor becomes normally-on, so that leakage current of the transistor in a state where a voltage is not applied to the gate (that is, in an off state) is increased. Thus, the entry of hydrogen into an oxide semiconductor film is inhibited by providing an aluminum oxide film having a property of blocking hydrogen over the entire region of a substrate so as to cover a channel region in the oxide semiconductor film, a source electrode, and a drain electrode, so that generation of leakage current is suppressed (see Patent Document 3).

REFERENCE

[Patent Document 1] Japanese Published Patent Application No. 2006-165528
[Patent Document 2] Japanese Published Patent Application No. 2011-138934
[Patent Document 3] Japanese Published Patent Application No. 2010-016163

SUMMARY OF THE INVENTION

One of defects included in an oxide semiconductor film is an oxygen vacancy. For example, the threshold voltage of a transistor including an oxide semiconductor film that includes oxygen vacancies easily shifts in the negative direction, and such a transistor tends to be normally-on. This is because electric charge is generated owing to oxygen vacancies in the oxide semiconductor film and the resistance is thus reduced. The transistor that is normally-on causes various problems that a malfunction is likely to be caused when the transistor is in operation and power consumption is increased when the transistor is not in operation, for example. Furthermore, there is a problem in that the amount of change in electrical characteristics, typically in threshold voltage, of the transistor over time or due to a stress test is increased.

In general, an aluminum oxide film can be formed by a sputtering method or an atomic layer deposition (ALD) method. However, in the case where an aluminum oxide film is formed by a sputtering method using an aluminum oxide target, arcing is caused and thus fine particles are generated. Entry of the fine particles into a deposited film leads to a reduction in yield.

In the case where an aluminum oxide film is formed by an atomic layer deposition method, trimethylaluminum (TMA) and water vapor are alternately introduced into a treatment chamber; thus, the deposition time is lengthened, resulting in a reduction in throughput.

In view of the above problems, according to one embodiment of the present invention, a semiconductor device including a transistor having excellent electrical characteristics is provided. Alternatively, a semiconductor device having a high aperture ratio and including a capacitor capable of increasing capacitance is provided. Alternatively, a method for manufacturing a semiconductor device with high yield is provided. Alternatively, a method for manufacturing a semiconductor device with high productivity is provided. Alternatively, a method for manufacturing a novel semiconductor device is provided. Alternatively, a novel semiconductor device is provided.

One embodiment of the present invention is a capacitor including a film containing materials that can form an oxide semiconductor, typically, indium and M (M is aluminum (Al), gallium (Ga), yttrium (Y), zirconium (Zr), lanthanum (La), cerium (Ce), or neodymium (Nd), a light-transmitting conductive film, and a metal oxide film provided between the film containing materials that can form an oxide semiconductor and the light-transmitting conductive film.

Another embodiment of the present invention is a semiconductor device having an insulating surface provided with a transistor and a capacitor. The transistor includes a gate electrode, an oxide semiconductor film overlapping with the gate electrode, a gate insulating film between the gate electrode and the oxide semiconductor film, and a first conductive film serving as a pair of electrodes in contact with the oxide semiconductor film. An oxide insulating film in contact with the oxide semiconductor film, a metal oxide film over the oxide insulating film, and a second conductive film that is formed in an opening formed in the metal oxide film, that is in contact with the first conductive film, and that serves as a pixel electrode are provided. The capacitor includes a film having conductivity over the gate insulating film, the second conductive film, and the metal oxide film provided between the film having conductivity and the second conductive film.

Note that the metal oxide film is formed using aluminum oxide, aluminum oxynitride, gallium oxide, gallium oxynitride, yttrium oxide, yttrium oxynitride, hafnium oxide, hafnium oxynitride, titanium oxide, tantalum oxide, or tantalum oxynitride. The metal oxide film may be separated.

The oxide semiconductor film and the conductive film are formed using an In—Ga oxide, an In—Zn oxide, or an In-M-Zn oxide (M represents Al, Ga, Y, Zr, La, Ce, or Nd). The conductive film contains metal elements contained in the oxide semiconductor film.

The oxide semiconductor film and the conductive film each have a multilayer structure including a first film and a second film. The atomic ratio of metal elements in the first film may be different from that of metal elements in the second film.

The oxide insulating film is an oxide insulating film in which the oxygen content is higher than that in the stoichiometric composition. The oxide insulating film in which the oxygen content is higher than that in the stoichiometric composition releases oxygen the amount of which (converted into the number of oxygen atoms) is greater than or equal to $1.0 \times 10^{18}$ atoms/cm$^3$ in thermal desorption spectroscopy (TDS) analysis in which heat treatment is performed such that the temperature of a film surface is higher than or equal to 100° C. and lower than or equal to 700° C. or higher than or equal to 100° C. and lower than or equal to 500° C.

According to one embodiment of the present invention, a semiconductor device including a transistor having excellent electrical characteristics can be provided. According to one embodiment of the present invention, it is possible to provide a semiconductor device including a capacitor whose capacitance can be increased while the aperture ratio is improved. According to one embodiment of the present invention, a semiconductor device can be fabricated with high yield. According to one embodiment of the present invention, a semiconductor device can be fabricated with high productivity.

BRIEF DESCRIPTION OF THE DRAWINGS

In the accompanying drawings:

FIGS. 4A to 4D are cross-sectional views illustrating one embodiment of a method for manufacturing a semiconductor device;

FIGS. 6A to 6C are cross-sectional views illustrating one embodiment of a method for manufacturing a semiconductor device;

FIGS. 7A and 7B are cross-sectional views illustrating one embodiment of a method for manufacturing a semiconductor device;

FIGS. 8A and 8B are top views illustrating embodiments of semiconductor devices;

FIGS. 12A and 12B are cross-sectional views each illustrating an embodiment of a semiconductor device;

DETAILED DESCRIPTION OF THE INVENTION

Figure 1A:
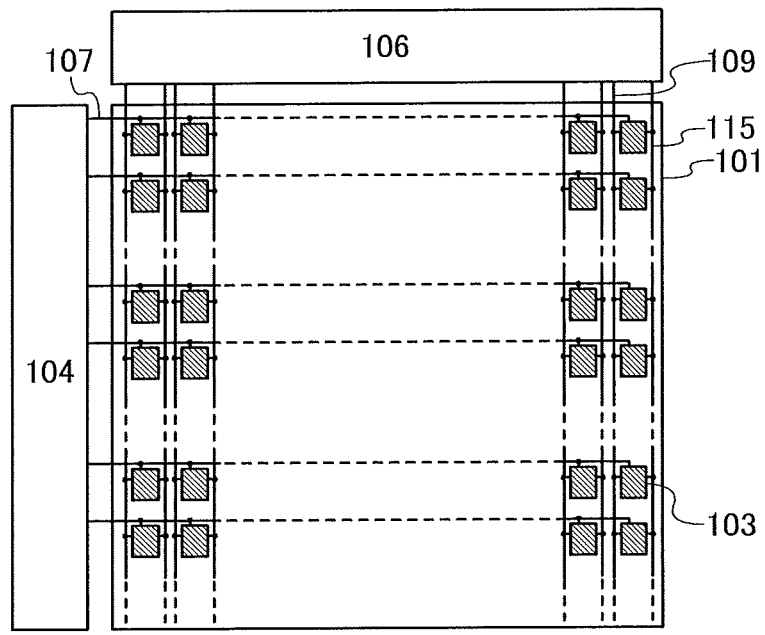
FIGS. 1A to 1C are a block diagram and circuit diagrams illustrating embodiments of semiconductor devices.

Hereinafter, embodiments and examples of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. Therefore, the present invention should not be construed as being limited to the description in the following embodiments and examples. In addition, in the following embodiments and examples, the same portions or portions having similar functions are denoted by the same reference numerals or represented by the same hatching patterns in different drawings, and description thereof will not be repeated.

Note that in each drawing described in this specification, the size, the film thickness, or the region of each component is exaggerated for clarity in some cases. Therefore, the embodiments and examples of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be interchanged with each other in this specification.

Note that a voltage refers to a difference between the potentials of two points, and a potential refers to electrostatic energy (electric potential energy) of unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

Embodiment 1

In this embodiment, a semiconductor device of one embodiment of the present invention will be described with reference to drawings. Note that in this embodiment, a semiconductor device of one embodiment of the present invention will be described taking a display device as an example. In addition, in this embodiment, an oxide semiconductor film will be described as a semiconductor film.

FIG. 1A illustrates an example of a semiconductor device. The semiconductor device illustrated in FIG. 1A includes a pixel portion 101, a scan line driver circuit 104, a signal line driver circuit 106, m scan lines 107 that are arranged parallel or substantially parallel to one another and whose potentials are controlled by the scan line driver circuit 104, and n signal lines 109 that are arranged parallel or substantially parallel to one another and whose potentials are controlled by the signal line driver circuit 106. The pixel portion 101 includes a plurality of pixels 103 arranged in a matrix. Besides, capacitor lines 115 are arranged parallel or substantially parallel to one another along the signal lines 109. Alternatively, the capacitor lines 115 may be arranged parallel or substantially parallel to one another along the scan lines 107. The scan line driver circuit 104 and the signal line driver circuit 106 may be collectively referred to as a driver circuit portion.

Each scan line 107 is electrically connected to n pixels 103 in the corresponding row among the pixels 103 arranged in m rows and n columns in the pixel portion 101. Each signal line 109 is electrically connected to m pixels 103 in the corresponding column among the pixels 103 arranged in m rows and n columns. Variables m and n are each an integer of 1 or more. Each capacitor line 115 is electrically connected to m pixels 103 in the corresponding column among the pixels 103 arranged in m rows and n columns. Note that in the case where the capacitor lines 115 are arranged parallel or substantially parallel to one another along the scan lines 107, each capacitor line 115 is electrically connected to n pixels 103 in the corresponding row among the pixels 103 arranged in m rows and n columns.

Figure 1B:
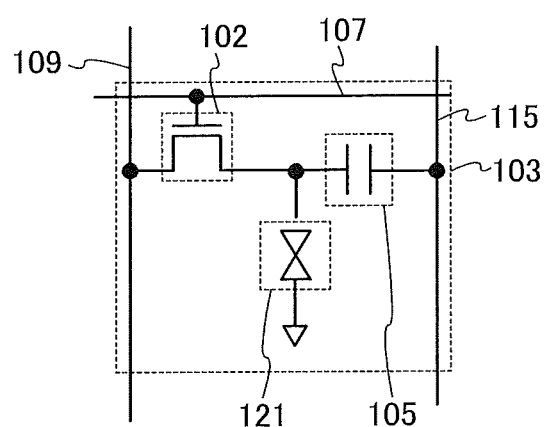
Figure 1C:
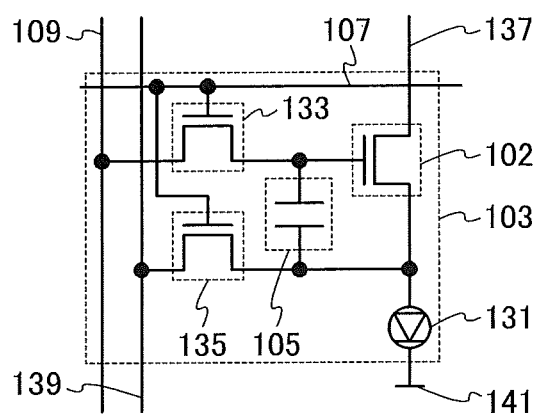

FIGS. 1B and 1C illustrate examples of circuit configurations that can be used for the pixels 103 of the display device in FIG. 1A.

The pixel 103 in FIG. 1B includes a liquid crystal element 121, a transistor 102, and a capacitor 105.

The potential of one of a pair of electrodes of the liquid crystal element 121 is appropriately set in accordance with the specifications of the pixel 103. The orientation state of the liquid crystal element 121 is set depending on written data. Alternatively, a common potential may be supplied to one of the pair of electrodes of the liquid crystal element 121 in each of the plurality of pixels 103. A different potential may be supplied to one of the pair of electrodes of the liquid crystal element 121 of each of the pixels 103 in each row.

Note that the liquid crystal element 121 is an element that controls light transmission by the optical modulation action of liquid crystal. The optical modulation action of liquid crystal is controlled by an electric field applied to the liquid crystal (including a lateral electric field, a vertical electric field, and a diagonal electric field). Examples of the liquid crystal element 121 include nematic liquid crystal, cholesteric liquid crystal, smectic liquid crystal, thermotropic liquid crystal, lyotropic liquid crystal, ferroelectric liquid crystal, and anti-ferroelectric liquid crystal.

Examples of a driving method of the display device including the liquid crystal element 121 include but are not limited to a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, and a transverse bend alignment (TBA) mode. A variety of liquid crystal elements and the driving methods thereof can be used.

The liquid crystal element may be formed using a liquid crystal composition including liquid crystal exhibiting a blue phase and a chiral material. The liquid crystal exhibiting a blue phase has a short response time of 1 msec or less, and is optically isotropic, which makes the alignment process unneeded and the viewing angle dependence small.

In the structure of the pixel 103 illustrated in FIG. 1B, one of a source electrode and a drain electrode of the transistor 102 is electrically connected to the signal line 109, and the other thereof is electrically connected to the other of a pair of electrodes of the liquid crystal element 121. A gate electrode of the transistor 102 is electrically connected to the scan line 107. The transistor 102 has a function of controlling whether to write a data signal by being turned on or off.

In the structure of the pixel 103 illustrated in FIG. 1B, one of a pair of electrodes of the capacitor 105 is electrically connected to the capacitor line 115 to which a potential is supplied, and the other thereof is electrically connected to the other of the pair of electrodes of the liquid crystal element 121. Note that the potential of the capacitor line 115 is appropriately set in accordance with the specifications of the pixel 103. The capacitor 105 serves as a storage capacitor that holds written data.

For example, in the display device including the pixel 103 in FIG. 1B, the pixels 103 are sequentially selected row by row by the scan line driver circuit 104, whereby the transistors 102 are turned on and a data signal is written.

When the transistors 102 are turned off, the pixels 103 to which the data has been written are brought into a holding state. This operation is performed row by row sequentially; thus, an image can be displayed.

The pixel 103 in FIG. 1C includes a transistor 133 that performs switching of a display element, the transistor 102 that controls pixel driving, a transistor 135, the capacitor 105, and a light-emitting element 131.

One of a source electrode and a drain electrode of the transistor 133 is electrically connected to the signal line 109 to which a data signal is supplied. A gate electrode of the transistor 133 is electrically connected to the scan line 107 to which a gate signal is supplied.

The transistor 133 has a function of controlling whether to write a data signal by being turned on or off.

The one of the source electrode and the drain electrode of the transistor 102 is electrically connected to a wiring 137 serving as an anode line, and the other of the source electrode and the drain electrode of the transistor 102 is electrically connected to one electrode of the light-emitting element 131. The gate electrode of the transistor 102 is electrically connected to the other of the source electrode and the drain electrode of the transistor 133 and the one electrode of the capacitor 105.

The transistor 102 has a function of controlling a current that flows to the light-emitting element 131 by being turned on or off.

One of a source electrode and a drain electrode of the transistor 135 is electrically connected to a wiring 139 to which a reference potential of data is supplied, and the other of the source electrode and the drain electrode of the transistor 135 is electrically connected to the one electrode of the light-emitting element 131 and the other electrode of the capacitor 105. A gate electrode of the transistor 135 is electrically connected to the scan line 107 to which a gate signal is supplied.

The transistor 135 has a function of adjusting a current that flows to the light-emitting element 131. For example, in the case where the internal resistance of the light-emitting element 131 is increased because of its deterioration, a current that flows to the wiring 139 electrically connected to the one of the source electrode and the drain electrode of the transistor 135 is monitored so that a current that flows to the light-emitting element 131 can be adjusted. A potential that is supplied to the wiring 139 can be, for example, 0 V.

The one of the pair of electrodes of the capacitor 105 is electrically connected to the gate electrode of the transistor 102 and the other of the source electrode and the drain electrode of the transistor 133. The other of the pair of electrodes of the capacitor 105 is electrically connected to the other of the source electrode and the drain electrode of the transistor 135 and the one electrode of the light-emitting element 131.

In the structure of the pixel 103 illustrated in FIG. 1C, the capacitor 105 serves as a storage capacitor that holds written data.

The one of the pair of electrodes of the light-emitting element 131 is electrically connected to the other of the source electrode and the drain electrode of the transistor 135, the other electrode of the capacitor 105, and the other of the source electrode and the drain electrode of the transistor 102. The other of the pair of electrodes of the light-emitting element 131 is electrically connected to a wiring 141 serving as a cathode.

The light-emitting element 131 may be an organic electroluminescent element (also referred to as an organic EL element) or the like, for example. Note that the light-emitting element 131 is not limited to an organic EL element; an inorganic EL element formed using an inorganic material may be used.

A high power supply potential VDD is supplied to one of the wirings 137 and 141, and a low power supply potential VSS is supplied to the other. In the configuration illustrated in FIG. 1C, the high power supply potential VDD is supplied to the wiring 137, and the low power supply potential VSS is supplied to the wiring 141.

In the display device including the pixel 103 in FIG. 1C, the pixels 103 are sequentially selected row by row by the scan line driver circuit 104, whereby the transistors 133 are turned on and a data signal is written.

When the transistors 133 are turned off, the pixels 103 to which the data has been written are brought into a holding state. Since the transistor 133 is electrically connected to the capacitor 105, the written data can be held for a long time. Furthermore, the transistor 133 controls the amount of current that flows between the source electrode and the drain electrode of the transistor 102. The light-emitting element 131 emits light with a luminance corresponding to the amount of flowing current. This operation is performed row by row sequentially, whereby an image can be displayed.

Figure 2:
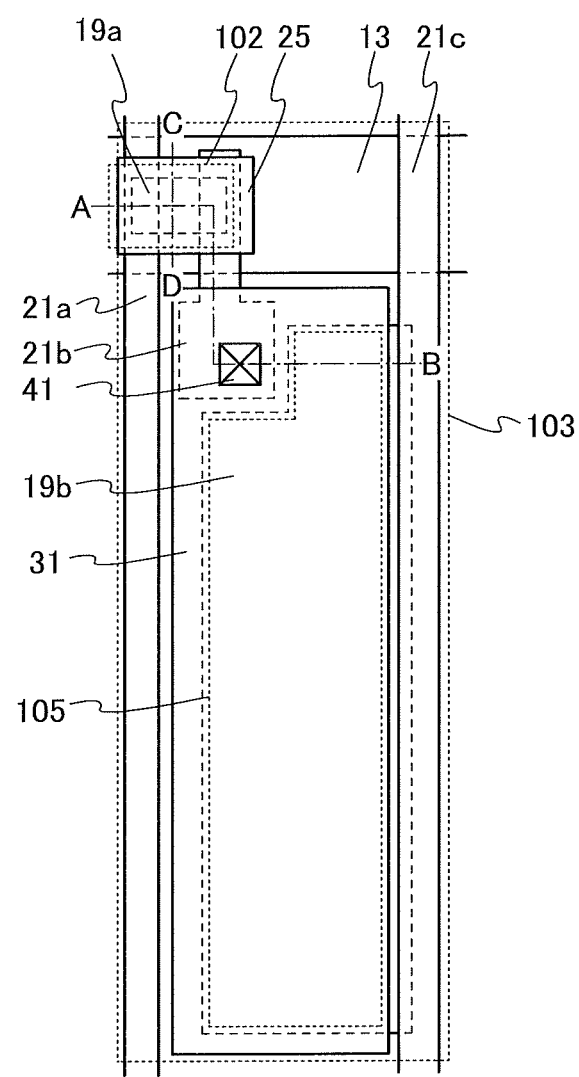
FIG. 2 is a top view illustrating one embodiment of a semiconductor device.

Next, a specific structure of an element substrate included in the display device will be described. Here, a specific example of a liquid crystal display device including a liquid crystal element in the pixel 103 will be described. FIG. 2 is a top view of the pixel 103 illustrated in FIG. 1B.

Note that although FIGS. 1B and 1C each illustrate an example where the liquid crystal element 121 and the light-emitting element 131 are used for a display element, one embodiment of the present invention is not limited thereto. Any of a variety of display elements may be used. Examples of display elements include elements including a display medium whose contrast, luminance, reflectance, transmittance, or the like is changed by electromagnetic action, such as an EL (electroluminescent) element (e.g., an EL element including organic and inorganic materials, an organic EL element, and an inorganic EL element), an LED (e.g., a white LED, a red LED, a green LED, and a blue LED), a transistor (a transistor that emits light depending on a current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD), an electrowetting element, a piezoelectric ceramic display, and a carbon nanotube. Examples of a display device having an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, and a projection liquid crystal display). Examples of a display device including electronic ink or an electrophoretic element include electronic paper.

In FIG. 2, a conductive film 13 serving as a scan line extends substantially perpendicularly to a signal line (in the horizontal direction in the drawing). The conductive film 21a serving as the signal line extends substantially perpendicularly to the scan line (in the vertical direction in the drawing). A conductive film 21c serving as a capacitor line extends parallel to the signal line. Note that the conductive film 13 serving as a scan line is electrically connected to the scan line driver circuit 104 (see FIG. 1A), and the conductive film 21a serving as a signal line and the conductive film 21c serving as a capacitor line are electrically connected to the signal line driver circuit 106 (see FIG. 1A).

The transistor 102 is provided at a region where the scan line and the signal line intersect each other. The transistor 102 includes the conductive film 13 serving as a gate electrode, a gate insulating film (not illustrated in FIG. 2), an oxide semiconductor film 19a that is over the gate insulating film and in which a channel region is formed, and conductive films 21a and 21b serving as a pair of electrodes. Note that the conductive film 13 serves as a scan line, and the conductive layer 13 that overlaps with the oxide semiconductor film 19a serves as the gate electrode of the transistor 102. The conductive film 21a serves as a signal line, and the conductive film 21a that overlaps with the oxide semiconductor film 19a serves as the source electrode of the transistor 102. In the top view of FIG. 2, the edges of the scan line are outside a region between the edges of the oxide semiconductor film 19a. Thus, the scan line also serves as a light-blocking film for blocking light from a light source such as a backlight. For this reason, the oxide semiconductor film 19a included in the transistor 102 is not irradiated with light, so that a change in the electrical characteristics of the transistor 102 can be suppressed.

The conductive film 21b is electrically connected to a light-transmitting conductive film 31 that serves as a pixel electrode, through an opening 41.

The capacitor 105 is connected to the conductive film 21c serving as a capacitor line. The capacitor 105 includes the film 19b having conductivity formed over the gate insulating film, a dielectric film formed over the transistor 102, and a light-transmitting conductive film 31 that serves as a pixel electrode. The dielectric film includes a metal oxide film having low oxygen permeability. The film 19b having conductivity formed over the gate insulating film has a light-transmitting property. That is, the capacitor 105 transmits light.

Thanks to the light-transmitting property of the capacitor 105, the capacitor 105 can be formed large (covers a large area) in the pixel 103. Thus, a semiconductor device having increased capacitance while improving the aperture ratio, to typically 55% or more, preferably 60% or more can be obtained. For example, in a semiconductor device with a high resolution such as a liquid crystal display device, the area of a pixel is small and thus the area of a capacitor is also small. For this reason, the capacitance of the capacitor is small in a semiconductor device with a high resolution. However, since the capacitor 105 of this embodiment transmits light, when it is provided in a pixel, enough capacitance can be achieved in the pixel and the aperture ratio can be improved. Typically, the capacitor 105 can be favorably used in a high-resolution semiconductor device with a pixel density of 200 ppi or more, 300 ppi or more, or 500 ppi or more.

Furthermore, according to an embodiment of the present invention, the aperture ratio can be improved even in a display device with a high resolution, which makes it possible to use light from a light source such as a backlight efficiently, so that power consumption of the display device can be reduced.

Figure 3:
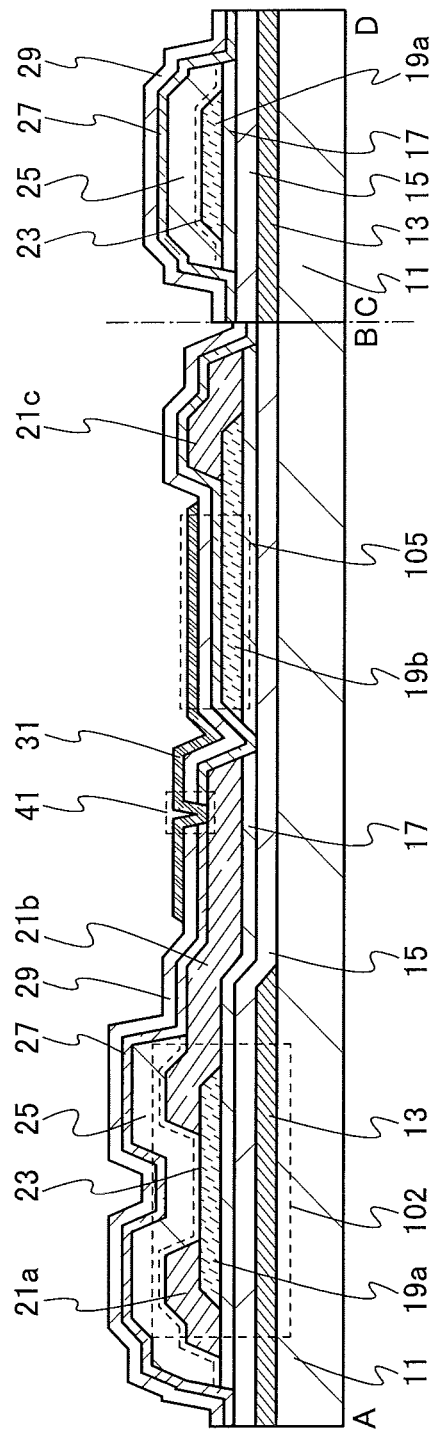
FIG. 3 is a cross-sectional view illustrating one embodiment of a semiconductor device.

Next, FIG. 3 is a cross-sectional view along dashed-dotted lines A-B and C-D in FIG. 2. The transistor 102 shown in FIG. 3 is a channel-etched transistor. Note that the transistor 102 in the channel length direction, a connection portion between the transistor 102 and the conductive film 31 serving as a pixel electrode, and the capacitor 105 are illustrated in the cross-sectional view along dashed-dotted line A-B, and the transistor 102 in the channel width direction is illustrated in the cross-sectional view along dashed-dotted line C-D.

The transistor 102 in FIG. 3 has a single-gate structure and includes the conductive film 13 serving as a gate electrode over the substrate 11. In addition, the transistor 102 includes a nitride insulating film 15 formed over the substrate 11 and the conductive film 13 serving as a gate electrode, an oxide insulating film 17 formed over the nitride insulating film 15, the oxide semiconductor film 19a overlapping with the conductive film 13 serving as a gate electrode with the nitride insulating film 15 and the oxide insulating film 17 provided therebetween, and the conductive films 21a and 21b serving as a pair of electrodes that are in contact with the oxide semiconductor film 19a. Moreover, an oxide insulating film 23 is formed over the oxide insulating film 17, the oxide semiconductor film 19a, and the conductive films 21a and 21b serving as a pair of electrodes, and an oxide insulating film 25 is formed over the oxide insulating film 23. A metal oxide film 27 is formed over the nitride insulating film 15, the oxide insulating film 17, the oxide insulating film 23, the oxide insulating film 25, and the conductive film 21b. A nitride insulating film 29 is formed over the metal oxide film 27. In addition, a conductive film 31 connected to one of the conductive films 21a and 21b serving as a pair of electrodes, here the conductive film 21b, is formed over the nitride insulating film 29. Note that the conductive film 31 serves as a pixel electrode.

The capacitor 105 in FIG. 3 includes a film 19b having conductivity formed over the oxide insulating film 17, the metal oxide film 27, the nitride insulating film 29, and the conductive film 31 serving as a pixel electrode.

Over the transistor 102 in this embodiment, the oxide insulating films 23 and 25, which are isolated from each other, are formed. The oxide insulating films 23 and 25 overlap with the oxide semiconductor film 19a. The metal oxide film 27 covers the transistor 102 and the oxide insulating films 23 and 25 and serves as the dielectric of the capacitor 105.

The metal oxide film 27 is an oxide film that has a light-transmitting property and low oxygen permeability. For the metal oxide film 27, a high dielectric material is preferably used. Examples of the metal oxide film 27 are typified by a metal oxide film formed using aluminum oxide, aluminum oxynitride, gallium oxide, gallium oxynitride, yttrium oxide, yttrium oxynitride, hafnium oxide, hafnium oxynitride, titanium oxide, tantalum oxide, tantalum oxynitride, or the like. Note that the metal oxide film is an insulating film or a semiconductor film.

The thickness of the metal oxide film 27 is greater than or equal to 0.5 nm and less than or equal to 50 nm, and the average thickness thereof is greater than or equal to 2 nm and less than or equal to 10 nm. When the thickness of the metal oxide film 27 is greater than or equal to 0.5 nm, preferably greater than or equal to 2 nm, oxygen can be prevented from transferring from the oxide semiconductor film 19a and the oxide insulating films 23 and 25 to the outside. Furthermore, when the thickness of the metal oxide film 27 is less than or equal to 50 nm, preferably less than or equal to 10 nm, the metal oxide film 27 can have an excellent insulating property. This is because the metal oxide film 27 can be formed by a method for oxidizing a metal film. Note that the details of a method for forming the metal oxide film 27 will be described later.

As the nitride insulating film 29, an insulating film that has low permeability to water can be used. Alternatively, an insulating film that has low permeability to hydrogen and water can be used. For the nitride insulating film 29, a high dielectric material is preferably used. Furthermore, the nitride insulating film 29 preferably contains hydrogen. Examples of the nitride insulating film 29 include a nitride insulating films such as a silicon nitride film, a silicon nitride oxide film, an aluminum nitride film, and an aluminum nitride oxide film.

Note that the thickness of the nitride insulating film 29 is greater than or equal to 50 nm and less than or equal to 300 nm, preferably greater than or equal to 100 nm and less than or equal to 200 nm.

The oxide semiconductor film 19a is typically formed of a metal oxide film such as an In—Ga oxide film, an In—Zn oxide film, or an In-M-Zn oxide film (M is Al, Ga, Y, Zr, La, Ce, or Nd).

The oxide insulating film 23 or the oxide insulating film 25 provided over the oxide semiconductor film 19a is preferably an oxide insulating film in which the oxygen content is higher than that in the stoichiometric composition. Part of oxygen is released by heating from the oxide insulating film in which the oxygen content is higher than that in the stoichiometric composition. The oxide insulating film in which the oxygen content is higher than that in the stoichiometric composition is an oxide insulating film that releases oxygen the amount of which (converted into the number of oxygen atoms) is greater than or equal to $1.0 \times 10^{18}$ atoms/cm$^3$, preferably greater than or equal to $3.0 \times 10^{20}$ atoms/cm$^3$ in thermal desorption spectroscopy (IDS) analysis in which heat treatment is performed such that the temperature of a film surface is higher than or equal to 100° C. and lower than or equal to 700° C. or higher than or equal to 100° C. and lower than or equal to 500° C.

In a transistor formed using an oxide semiconductor film including oxygen vacancies, the threshold voltage easily shifts in the negative direction, and such a transistor tends to be normally-on. This is because electric charge is generated owing to oxygen vacancies in the oxide semiconductor film and the resistance is thus reduced. The normally-on transistor causes various problems: for example, a malfunction is likely to occur when the transistor is in operation, and power consumption when the transistor is not in operation is increased. Furthermore, there is a problem in that the amount of change in electrical characteristics, typically in threshold voltage, of the transistor over time or due to a stress test is increased.

However, the transistor 102 in this embodiment can be formed using an oxide insulating film in which the oxygen content is higher than that in the stoichiometric composition as the oxide insulating film 23 or the oxide insulating film 25 provided over the oxide semiconductor film 19a. Furthermore, the metal oxide film 27 is provided over the oxide semiconductor film 19a, the oxide insulating film 23, and the oxide insulating film 25, and the nitride insulating film 29 is provided over the metal oxide film 27. As a result, oxygen contained in the oxide insulating film 23 or the oxide insulating film 25 efficiently transfers to the oxide semiconductor film 19a, so that oxygen vacancies in the oxide semiconductor film 19a can be reduced. Furthermore, entry of water or, moreover, hydrogen into the oxide semiconductor film 19a from the outside can be inhibited. As a result, the transistor has normally-off characteristics. Furthermore, the amount of change in electrical characteristics, typically in threshold voltage, of the transistor over time or due to a stress test can be reduced.

In the capacitor 105, the film 19b having conductivity is formed at the same time as the oxide semiconductor film 19a and has increased conductivity by including oxygen vacancies generated by plasma damage or the like. Alternatively, the film 19b having conductivity is formed at the same time as the oxide semiconductor film 19a and has increased conductivity by containing impurities. Alternatively, the film 19b having conductivity is formed at the same time as the oxide semiconductor film 19a, and has increased conductivity by containing impurities and containing oxygen vacancies generated by plasma damage or the like.

In the transistor 102, the oxide insulating films 23 and 25 are provided between the oxide semiconductor film 19a and the metal oxide film 27. On the other hand, in the capacitor 105, the oxide insulating films 23 and 25 are not provided between the film 19b having conductivity and the metal oxide film 27. That is to say, the dielectric of the capacitor 105 is the metal oxide film 27 and the nitride insulating film 29; thus, the thickness of the dielectric can be small and the capacitance of the capacitor 105 can be increased. Furthermore, the use of the metal oxide film 27 and the nitride insulating film 29, which are formed using high dielectric materials, as the dielectric of the capacitor 105 can increase the capacitance of the capacitor 105.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps of the semiconductor device can be reduced. Furthermore, since the pair of electrodes has a light-transmitting property, the capacitor has a light-transmitting property. As a result, the area occupied by the capacitor can be increased and the aperture ratio in a pixel can be increased.

The details of the structure of the transistor 102 will be described below.

There is no particular limitation on the property of a material and the like of the substrate 11 as long as the material has at least heat resistance enough to withstand later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large-sized display device can be manufactured.

Alternatively, a flexible substrate may be used as the substrate 11, and the transistor 102 may be provided directly on the flexible substrate. Alternatively, a separation layer may be provided between the substrate 11 and the transistor 102. The separation layer can be used when part or the whole of a semiconductor device formed over the separation layer is separated from the substrate 11 and transferred to another substrate. In such a case, the transistor 102 may be transferred to a substrate having low heat resistance or a flexible substrate.

The conductive film 13 serving as a gate electrode can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. The conductive film 13 serving as a gate electrode may have a single-layer structure or a layered structure of two or more layers. Examples of the structure of the conductive film 13 include a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, and a three-layer structure in which a titanium film, an aluminum film, and a titanium film are stacked in this order. Alternatively, a film, an alloy film, or a nitride film which contains aluminum and one or more elements selected from titanium, tantalum, tungsten, molybdenum, chromium, neodymium, and scandium may be used.

Alternatively, the conductive film 13 serving as a gate electrode can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the conductive film 13 can have a layered structure formed using the above light-transmitting conductive material and the above metal element.

The nitride insulating film 15 can be formed using a material similar to that of the nitride insulating film 29 as appropriate.

The thickness of the nitride insulating film 15 is preferably greater than or equal to 5 nm and less than or equal to 100 nm, more preferably greater than or equal to 20 nm and less than or equal to 80 nm.

The oxide insulating film 17 can be formed to have a single-layer structure or a stacked-layer structure using, for example, any of silicon oxide, silicon oxynitride, aluminum oxide, hafnium oxide, gallium oxide, and Ga—Zn-based metal oxide.

The oxide insulating film 17 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, in which case a gate leakage current of the transistor can be reduced.

The thickness of the oxide insulating film 17 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

The nitride insulating film 15 and the oxide insulating film 17 serve as a gate insulating film. Note that the only one of the nitride insulating film 15 and the oxide insulating film 17 may be provided between the conductive film 13 serving as a gate electrode and the oxide semiconductor film 19a so that it serves as a gate insulating film.

The oxide semiconductor film 19a is typically formed using an In—Ga oxide, an In—Zn oxide, or an In-M-Zn oxide (M represents Al, Ga, Y, Zr, La, Ce, or Nd).

In the case where the oxide semiconductor film 19a is an In-M-Zn oxide film, the proportions of In and M when summation of In and M is assumed to be 100 atomic % are preferably as follows: the atomic percentage of In is greater than 25 atomic % and the atomic percentage of M is less than 75 atomic %, or more preferably, the atomic percentage of In is greater than 34 atomic % and the atomic percentage of M is less than 66 atomic %.

The energy gap of the oxide semiconductor film 19a is 2 eV or more, preferably 2.5 eV or more, further preferably 3 eV or more. The off-state current of the transistor 102 can be reduced by using an oxide semiconductor having such a wide energy gap.

The thickness of the oxide semiconductor film 19a is greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 19a is an In-M-Zn oxide film (M represents Al, Ga, Y, Zr, La, Ce, or Nd), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratio of metal elements in the oxide semiconductor film 19a formed using the above sputtering target varies from that of the metal elements in the above sputtering target within a range of ±40% as an error.

An oxide semiconductor film with a low carrier density is used as the oxide semiconductor film 19a. For example, an oxide semiconductor film whose carrier density is $1\times10^{17}$/cm$^3$ or lower, preferably $1\times10^{15}$/cm$^3$ or lower, more preferably $1\times10^{13}$/cm$^3$ or lower, still more preferably $1\times10^{11}$/cm$^3$ or lower is used as the oxide semiconductor film 19a.

Note that, without limitation to the compositions described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 19a be set appropriately.

Note that it is preferable to use, as the oxide semiconductor film 19a, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources and thus has a low carrier density in some cases. Therefore, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Furthermore, a highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film takes a long time to be released, and behaves like fixed charges in some cases. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally-on.

Accordingly, hydrogen in the oxide semiconductor film 19a is preferably reduced as much as possible as well as the oxygen vacancies in the oxide semiconductor film 19a. Specifically, in the oxide semiconductor film 19a, the hydrogen concentration measured by secondary ion mass spectrometry (SIMS) is set to lower than or equal to $5 \times 10^{19}$ atoms/cm$^3$, more preferably lower than or equal to $1 \times 10^{19}$ atoms/cm$^3$, more preferably lower than or equal to $5 \times 10^{18}$ atoms/cm$^3$, more preferably lower than or equal to $1 \times 10^{18}$ atoms/cm$^3$, more preferably lower than or equal to $5 \times 10^{17}$ atoms/cm$^3$, more preferably lower than or equal to $1 \times 10^{16}$ atoms/cm$^3$.

When silicon or carbon which is one of elements belonging to Group 14 is contained in the oxide semiconductor film 19a, oxygen vacancies are increased, and the oxide semiconductor film 19a becomes an n-type film. Thus, the concentration of silicon or carbon (the concentration is measured by SIMS) in the oxide semiconductor film 19a is lower than or equal to $2 \times 10^{18}$ atoms/cm$^3$, preferably lower than or equal to $2 \times 10^{17}$ atoms/cm$^3$.

Furthermore, the concentration of alkali metals or alkaline earth metals in the oxide semiconductor film 19a, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 19a.

Furthermore, when containing nitrogen, the oxide semiconductor film 19a easily has n-type conductivity by generation of electrons serving as carriers and an increase of carrier density. Thus, a transistor including an oxide semiconductor that contains nitrogen is likely to be normally-on. For this reason, nitrogen in the oxide semiconductor film is preferably reduced as much as possible; the concentration of nitrogen measured by SIMS is preferably set to, for example, lower than or equal to $5 \times 10^{18}$ atoms/cm$^3$.

The oxide semiconductor film 19a may have a non-single-crystal structure, for example. The non-single crystal structure includes a c-axis aligned crystalline oxide semiconductor (CAAC-OS), which is described later, a polycrystalline structure, a microcrystalline structure, which is described later, or an amorphous structure, for example. Among the non-single crystal structure, the amorphous structure has the highest density of defect states, whereas CAAC-OS has the lowest density of defect states.

The oxide semiconductor film 19a may have an amorphous structure, for example. An oxide semiconductor film having the amorphous structure has disordered atomic arrangement and no crystalline component, for example.

Note that the oxide semiconductor film 19a may be a mixed film including two or more of the following: a region having an amorphous structure, a region having a microcrystalline structure, a region having a polycrystalline structure, a CAAC-OS region, and a region having a single-crystal structure. The mixed film may include, for example, two or more of a region having an amorphous structure, a region having a microcrystalline structure, a region having a polycrystalline structure, a CAAC-OS region, and a region having a single-crystal structure. Alternatively, the mixed film may have a layered structure of two or more of a region having an amorphous structure, a region having a microcrystalline structure, a region having a polycrystalline structure, a CAAC-OS region, and a region having a single-crystal structure.

The film 19b having conductivity is formed by processing an oxide semiconductor film formed at the same time as the oxide semiconductor film 19a. Thus, the film 19b having conductivity contains a metal element similar to that in the oxide semiconductor film 19a. In other words, the film 19b having conductivity contains materials that can form an oxide semiconductor. Furthermore, the film 19b having conductivity has a crystal structure similar to or different from that of the oxide semiconductor film 19a. By adding impurities to or generating oxygen vacancies in the oxide semiconductor film formed at the same time as the oxide semiconductor film 19a, the film 19b having conductivity is formed. Examples of the impurities contained in the oxide semiconductor film include hydrogen. Instead of hydrogen, as the impurity, boron, phosphorus, tin, antimony, a rare gas element, alkali metal, alkaline earth metal, or the like may be contained.

Thus, the oxide semiconductor film 19a and the film 19b having conductivity are both formed over the oxide insulating film 17, but differ in impurity concentration. Specifically, the film 19b having conductivity has a higher impurity concentration than the oxide semiconductor film 19a. For example, the concentration of hydrogen contained in the oxide semiconductor film 19a is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, yet more preferably lower than or equal to $1 \times 10^{16}$ atoms/cm$^3$. The concentration of hydrogen contained in the film 19b having conductivity is higher than or equal to $8 \times 10^{19}$ atoms/cm$^3$, preferably higher than or equal to $1 \times 10^{20}$ atoms/cm$^3$, more preferably higher than or equal to $5 \times 10^{20}$ atoms/cm$^3$. The concentration of hydrogen contained in the film 19b having conductivity is greater than or equal to two times, preferably greater than or equal to ten times that in the oxide semiconductor film 19a.

On the other hand, when the oxide semiconductor film formed at the same time as the oxide semiconductor film 19a is exposed to plasma, the oxide semiconductor film is damaged, and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of the oxide insulating film 23 and the oxide insulating film 25, oxygen vacancies are generated. Alternatively, when the oxide semiconductor film is exposed to plasma such as a mixed gas of oxygen and hydrogen, hydrogen, a rare gas, or ammonia, oxygen vacancies are generated. As a result, the conductivity of the oxide semiconductor film is increased, so that the film 19b having conductivity is formed.

That is, the film 19b having conductivity can be called an oxide semiconductor film having high conductivity. Alternatively, the film 19b having conductivity can be called a metal oxide film having high conductivity.

In the case where a silicon nitride film is used as the nitride insulating film 29, the silicon nitride film contains hydrogen. When hydrogen in the nitride insulating film 29 is diffused into the oxide semiconductor film formed at the same time as the oxide semiconductor film 19a, hydrogen is bonded to oxygen and electrons serving as carriers are generated in the oxide semiconductor film. When hydrogen contained in the silicon nitride film enters the oxygen vacancies in the oxide semiconductor film, electrons serving as carriers are generated. As a result, the conductivity of the oxide semiconductor film is increased, so that the film 19b having conductivity is formed.

When hydrogen is added to an oxide semiconductor including oxygen vacancies, hydrogen enters oxygen vacant sites and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. That is, the film 19b having conductivity can be formed of an oxide conductor film. Oxide semiconductors generally transmit visible light because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The film 19b having conductivity has lower resistivity than the oxide semiconductor film 19a. The resistivity of the film 19b having conductivity is preferably higher than or equal to $1\times10^{-8}$ times and lower than $1\times10^{-1}$ times the resistivity of the oxide semiconductor film 19a. The resistivity of the film 19b having conductivity is typically higher than or equal to $1\times10^{-3}$ Ωcm and less than $1\times10^{4}$ Ωcm, preferably higher than or equal to $1\times10^{-3}$ Ωcm and lower than $1\times10^{-1}$ Ωcm.

The conductive films 21a and 21b serving as a pair of electrodes are each formed to have a single-layer structure or a layered structure including any of metals such as aluminum, titanium, chromium, nickel, copper, yttrium, zirconium, molybdenum, silver, tantalum, and tungsten or an alloy containing any of these metals as its main component. Examples of the structures of the conductive films 21a and 21b include a single-layer structure of an aluminum film containing silicon, a two-layer structure in which an aluminum film is stacked over a titanium film, a two-layer wherein the oxide semiconductor film and the first electrode each contain indium and a metal element selected from aluminum, gallium, yttrium, zirconium, lanthanum, cerium, wolayer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like. Note that a transparent conductive material containing indium oxide, tin oxide, or zinc oxide may be used.

As the oxide insulating film 23 or the oxide insulating film 25, an oxide insulating film in which the oxygen content is higher than that in the stoichiometric composition is preferably used. Here, as the oxide insulating film 23, an oxide insulating film through which oxygen passes is formed, and as the oxide insulating film 25, an oxide insulating film in which the oxygen content is higher than that in the stoichiometric composition is formed.

The oxide insulating film 23 is an oxide insulating film through which oxygen passes. Thus, oxygen released from the oxide insulating film 25 provided over the oxide insulating film 23 can be transferred to the oxide semiconductor film 19a through the oxide insulating film 23. Moreover, the oxide insulating film 23 also serves as a film which relieves damage to the oxide semiconductor film 19a in forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, a "silicon oxynitride film" refers to a film in which the oxygen content is higher than the nitrogen content, and a "silicon nitride oxide film" refers to a film in which the nitrogen content is higher than the oxygen content.

Further, it is preferable that the number of defects at the interface between the oxide insulating film 23 and the oxide semiconductor film 19a be small, typically the spin density of a signal that appears at a g value (due to an oxygen vacancy in the oxide semiconductor film 19a) of greater than or equal to 1.89 and less than or equal to 1.96 be lower than or equal to $1\times10^{17}$ spins/cm$^3$, more preferably lower than or equal to the lower limit of detection by ESR measurement.

Note that in the oxide insulating film 23, the whole oxygen having entered the oxide insulating film 23 from the outside transfers to the outside in some cases. Alternatively, part of oxygen having entered the oxide insulating film 23 from the outside remains in the oxide insulating film 23 in some cases. Furthermore, transfer of oxygen occurs in the oxide insulating film 23 in some cases in such a manner that oxygen enters the oxide insulating film 23 from the outside and oxygen contained in the oxide insulating film 23 transfers to the outside of the oxide insulating film 23.

The oxide insulating film 25 is formed in contact with the oxide insulating film 23. Here, the oxide insulating film 25 is formed of an oxide insulating film in which the oxygen content is higher than that in the stoichiometric composition. Part of oxygen is released by heating from the oxide insulating film in which the oxygen content is higher than that in the stoichiometric composition. The oxide insulating film in which the oxygen content is higher than that in the stoichiometric composition is an oxide insulating film that releases oxygen the amount of which (converted into the number of oxygen atoms) is greater than or equal to $1.0\times10^{18}$ atoms/cm$^3$, preferably greater than or equal to $3.0\times10^{20}$ atoms/cm$^3$ in TDS analysis in which heat treatment is performed such that the temperature of a film surface is higher than or equal to 100° C. and lower than or equal to 700° C. or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 25.

It is preferable that the stack of the oxide insulating films 23 and 25 have few defects. In the spectrum of the oxide insulating film having few defects that is obtained by ESR measurement at 100 K or lower, a first signal is seen at a g value of greater than or equal to 2.037 and less than or equal to 2.039, a second signal is seen at a g value of greater than or equal to 2.001 and less than or equal to 2.003, and a third signal is seen at a g value of greater than or equal to 1.964 and less than or equal to 1.966. The spin density at a g value in the range from 2.037 or more and 2.039 or less to 1.964 or more and 1.966 or less is lower than $1 \times 10^{18}$ spins/cm$^3$, typically higher than or equal to $1 \times 10^{17}$ spins/cm$^3$ and lower than $1 \times 10^{18}$ spins/cm$^3$. Note that in the spectrum obtained by ESR measurement at 100 K or lower, a first signal seen at a g value of greater than or equal to 2.037 and less than or equal to 2.039, a second signal seen at a g value of greater than or equal to 2.001 and less than or equal to 2.003, and a third signal seen at a g value of greater than or equal to 1.964 and less than or equal to 1.966 are assigned to a nitrogen oxide (NOx, x is greater than or equal to 0 and less than or equal to 2, preferably greater than or equal to 1 and less than or equal to 2). Typical examples of the nitrogen oxide include nitrogen monoxide and nitrogen dioxide. That is to say, the lower the spin density at a g value in the range from 2.037 or more and 2.039 or less to 1.964 or more and 1.966 or less is, the smaller amount of nitrogen oxide the oxide insulating film contains.

Although the plurality of oxide insulating films 23 and 25 are provided between the oxide semiconductor film 19*a* and the metal oxide film 27 here, only one of the oxide insulating film 23 and the oxide insulating film 25 may be provided.

The metal oxide film 27 that is provided over the oxide insulating film 25 makes oxygen contained in the oxide insulating film 25 difficult to transfer to the outside. As a result, oxygen contained in the oxide insulating film 25 can transfer to the oxide semiconductor film 19*a* efficiently, and the number of oxygen vacancies in the oxide semiconductor film can be reduced.

The oxide semiconductor film 19*a* and the oxide insulating films 23 and 25 are provided so that the edges thereof are inside an area between the edges of the nitride insulating films 15 and 29. This can inhibit entry of water or, moreover, hydrogen into the oxide semiconductor film 19*a* from the outside.

As the conductive film 31, a light-transmitting conductive film is used. Examples of the light-transmitting conductive film include an indium oxide film containing tungsten oxide, an indium zinc oxide film containing tungsten oxide, an indium oxide film containing titanium oxide, an indium tin oxide film containing titanium oxide, an indium tin oxide (hereinafter referred to as ITO) film, an indium zinc oxide film, and an indium tin oxide film to which silicon oxide is added.

Figure 29:
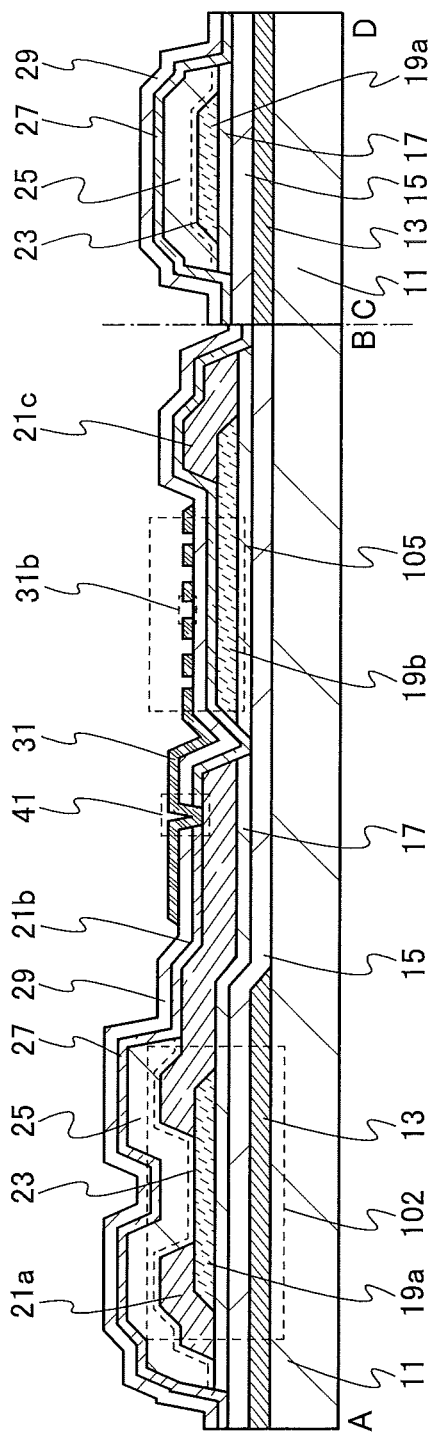
FIG. 29 is a cross-sectionals view illustrating one embodiment of a semiconductor device.
Figure 30:
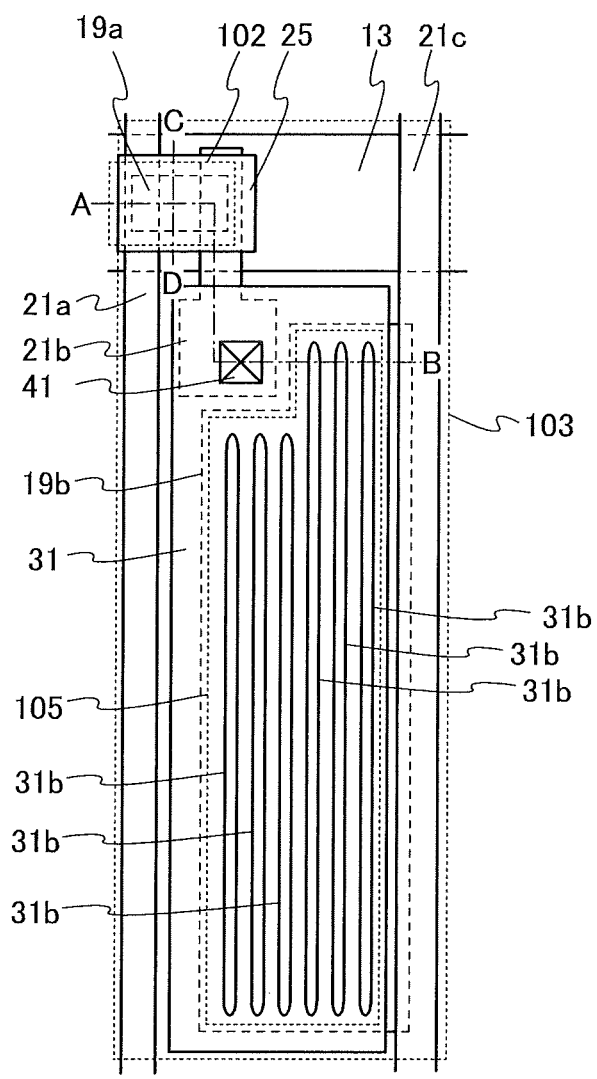
FIG. 30 is a top view illustrating one embodiment of a semiconductor device.

The conductive film 31 may have a comb shape or a shape with slits 31*b*. FIG. 29 illustrates a cross-sectional view of the case where the conductive film 31 has a shape with slits 31*b*. The conductive film 31 with such a shape allows liquid crystal to be driven with the IPS mode or the FFS mode. FIG. 30 illustrates a top view of the case where the conductive film 31 is provided with the slits 31*b*, as an example. Depending on the shape of the conductive film 31, liquid crystal can be driven with the VA mode.

Next, a method for forming the transistor 102 and the capacitor 105 in FIG. 3 will be described with reference to FIGS. 4A to 4D, FIGS. 5A to 5D, FIGS. 6A to 6C, and FIGS. 7A and 7B.

As illustrated in FIG. 4A, a conductive film 12 to be the conductive film 13 is formed over the substrate 11. The conductive film 12 is formed by a sputtering method, a CVD method, an evaporation method, or the like.

Here, a glass substrate is used as the substrate 11. As the conductive film 12, a 100 nm-thick tungsten film is formed by a sputtering method.

Then, a mask is formed over the conductive film 12 through a photolithography process using a first photomask. Next, as illustrated in FIG. 4B, part of the conductive film 12 is etched with the use of the mask to form the conductive film 13 serving as a gate electrode. After that, the mask is removed.

Note that the conductive film 13 serving as a gate electrode may be formed by an electrolytic plating method, a printing method, an ink-jet method, or the like instead of the above formation method.

Here, a tungsten film is etched by a dry etching method to form the conductive film 13 serving as a gate electrode.

Next, as illustrated in FIG. 4C, over the conductive film 13 serving as a gate electrode, the nitride insulating film 15 and an oxide insulating film 16 to be the oxide insulating film 17 later are formed. Then, over the oxide insulating film 16, an oxide semiconductor film 18 to be the oxide semiconductor film 19*a* and the film 19*b* having conductivity later is formed.

The nitride insulating film 15 and the oxide insulating film 16 are formed by a sputtering method, a CVD method, an evaporation method, or the like.

Here, as the nitride insulating film 15, a 300-nm-thick silicon nitride film is formed by a plasma CVD method in which silane, nitrogen, and ammonia are used as a source gas.

In the case where a silicon oxide film, a silicon oxynitride film, or a silicon nitride oxide film is formed as the oxide insulating film 16, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

Moreover, in the case of forming a gallium oxide film as the oxide insulating film 16, a metal organic chemical vapor deposition (MOCVD) method can be employed.

Here, as the oxide insulating film 16, a 50-nm-thick silicon oxynitride film is formed by a plasma CVD method in which silane and dinitrogen monoxide are used as a source gas.

The oxide semiconductor film 18 can be formed by a sputtering method, a coating method, a pulsed laser deposition method, a laser ablation method, or the like.

In the case of forming the oxide semiconductor film by a sputtering method, an RF power supply device, an AC power supply device, a DC power supply device, or the like can be used as appropriate as a power supply device for generating plasma.

As a sputtering gas, a rare gas (typically argon), an oxygen gas, or a mixed gas of a rare gas and oxygen is used as appropriate. When the mixed gas of a rare gas and oxygen is used, the proportion of oxygen to a rare gas is preferably increased, in which case CAAC-OS, which is described later, can be easily formed.

A target may be appropriately selected in accordance with the composition of the oxide semiconductor film to be formed.

In order to obtain an intrinsic or substantially intrinsic oxide semiconductor film, besides high vacuum evacuation of a chamber, highly purification of a sputtering gas is also needed. As an oxygen gas or an argon gas used for a sputtering gas, a gas that is highly purified to have a dew point of −40° C. or lower, preferably −80° C. or lower, more preferably −100° C. or lower, still more preferably −120° C. or lower is used, whereby entry of moisture or the like into the oxide semiconductor film can be prevented as much as possible.

Here, a 35-nm-thick In—Ga—Zn oxide (hereinafter referred to as IGZO) film is formed as the oxide semiconductor film by a sputtering method using an IGZO target (In:Ga:Zn=1:1:1).

Then, after a mask is formed over the oxide semiconductor film 18 through a photolithography process using a second photomask, the oxide semiconductor film is partly etched using the mask. Thus, the oxide semiconductor films 19a and 19c, which are subjected to element isolation as illustrated in FIG. 4D, are formed. After that, the mask is removed.

Here, a mask is formed over the oxide semiconductor film, and part of the oxide semiconductor film 18 is selectively etched by a wet etching method, so that the oxide semiconductor films 19a and 19c are formed.

Figure 5A:
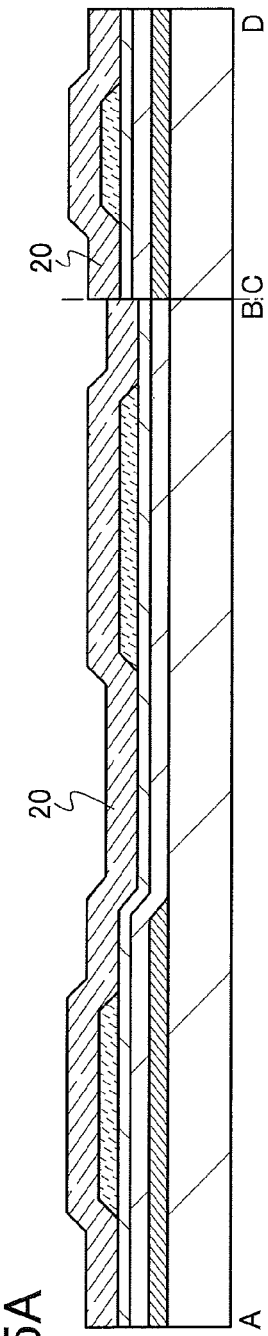
FIGS. 5A to 5D are cross-sectional views illustrating one embodiment of a method for manufacturing a semiconductor device.

Next, as illustrated in FIG. 5A, a conductive film 20 to be the conductive films 21a, 21b, and 21c is formed.

The conductive film 20 is formed by a sputtering method, a CVD method, an evaporation method, or the like.

Here, a 50-nm-thick tungsten film and a 300-nm-thick copper film are sequentially stacked by a sputtering method.

Figure 5B:
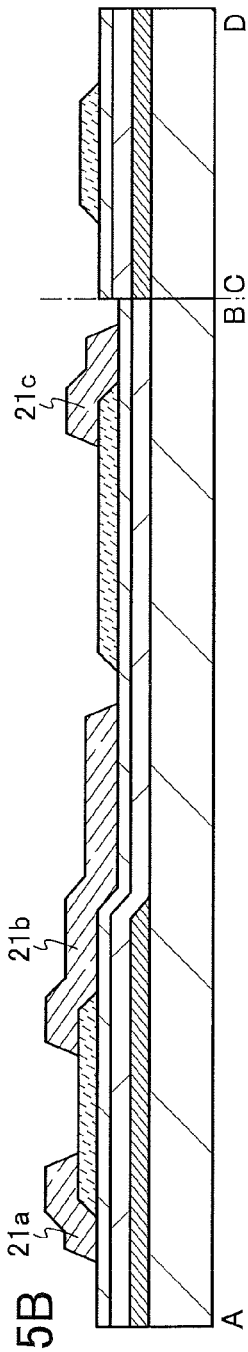

Next, a mask is formed over the conductive film 20 through a photolithography process using a third photomask. Then, the conductive film 20 is etched with the use of the mask, and as illustrated in FIG. 5B, the conductive films 21a and 21b serving as a pair of electrodes and the conductive film 21c serving as a capacitor line are formed. After that, the mask is removed.

Here, a mask is formed over the copper film through a photolithography process. Then, the tungsten film and the copper film are etched with the use of the mask, so that the conductive films 21a, 21b, and 21c are formed. Note that the copper film is etched by a wet etching method. Next, the tungsten film is etched by a dry etching method using $SF_6$, whereby fluoride is formed on a surface of the copper film. The fluoride helps reduce diffusion of copper elements from the copper film and thus the copper concentration in the oxide semiconductor film 19a can be reduced.

Figure 5C:
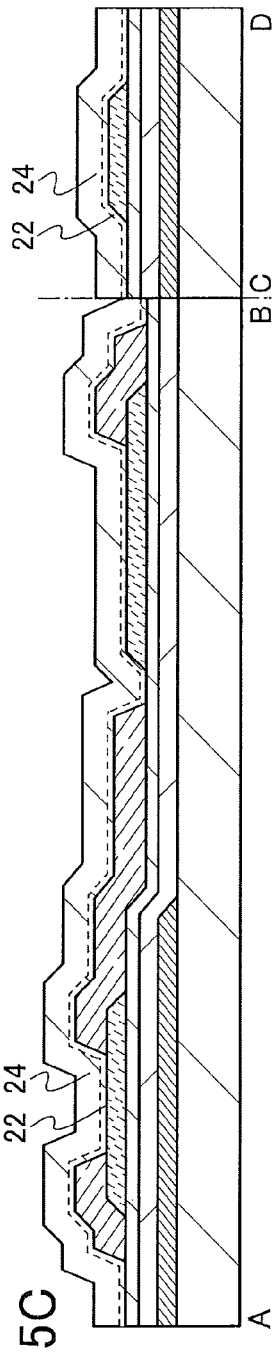

Next, as illustrated in FIG. 5C, an oxide insulating film 22 to be the oxide insulating film 23 later and an oxide insulating film 24 to be the oxide insulating film 25 later are formed over the oxide semiconductor films 19a and 19c and the conductive films 21a, 21b, and 21c.

Note that immediately after the oxide insulating film 22 is formed, the oxide insulating film 24 is preferably formed without exposure to the air. As soon as the oxide insulating film 22 is formed, the oxide insulating film 24 is formed by adjusting at least one of the flow rate of a source gas, pressure, high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can transfer to the oxide semiconductor film 19a; accordingly, the number of oxygen vacancies in the oxide semiconductor film 19a can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., a source gas is introduced into the treatment chamber and the pressure in the treatment chamber is set to higher than or equal to 20 Pa and lower than or equal to 250 Pa, preferably higher than or equal to 100 Pa and lower than or equal to 250 Pa, and high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. Examples of the oxidizing gas include oxygen, ozone, dinitrogen monoxide, and nitrogen dioxide.

With the use of the above conditions, an oxide insulating film through which oxygen passes can be formed as the oxide insulating film 22. The oxide insulating film 22 helps reduce damage to the oxide semiconductor film 19a in a later step of forming the oxide insulating film 25.

A silicon oxide film or a silicon oxynitride film can be formed as the oxide insulating film 22 under the following conditions: the substrate placed in a treatment chamber of a plasma CVD apparatus that is vacuum-evacuated is held at a temperature higher than or equal to 280° C. and lower than or equal to 400° C., a source gas is introduced into the treatment chamber and the pressure in the treatment chamber is set to higher than or equal to 100 Pa and lower than or equal to 250 Pa, and high-frequency power is supplied to an electrode provided in the treatment chamber.

In the above film formation conditions, when the substrate temperature is set to the above-described temperature, the bonding strength of silicon and oxygen becomes high. Thus, as the oxide insulating film 22, a dense and hard oxide insulating film through which oxygen passes, typically, a silicon oxide film or a silicon oxynitride film which can be etched using hydrofluoric acid of 0.5 wt % at 25° C. at a rate of lower than or equal to 10 nm/min, preferably lower than or equal to 8 nm/min can be formed.

The oxide insulating film 22 is formed while heating is performed; thus, hydrogen, water, or the like contained in the oxide semiconductor film 19a can be released in the step. Hydrogen contained in the oxide semiconductor film 19a is bonded to an oxygen radical formed in plasma to form water. Since the substrate is heated in the step of forming the oxide insulating film 22, water formed by bonding of oxygen and hydrogen is released from the oxide semiconductor film. That is, when the oxide insulating film 22 is formed by a plasma CVD method, the amount of water and hydrogen contained in the oxide semiconductor film 19a can be reduced.

Furthermore, time for heating in a state where the oxide semiconductor film 19a is exposed can be shortened because heating is performed in the step of forming the oxide insulating film 22. Thus, the amount of oxygen released from the oxide semiconductor film by heat treatment can be reduced. That is, the amount of oxygen vacancies in the oxide semiconductor film can be reduced.

Here, as the oxide insulating film 22, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film through which oxygen passes can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., a source gas is introduced into the treatment chamber and the pressure in the treatment chamber is set to higher than or equal to 100 Pa and lower than or equal to 250 Pa, preferably higher than or equal to 100 Pa and lower than or equal to 200 Pa, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. Examples of the oxidizing gas include oxygen, ozone, dinitrogen monoxide, and nitrogen dioxide.

In the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film in which the oxygen content is higher than that in the stoichiometric composition and from which part of oxygen is released by heating. The oxide insulating film 22 is provided over the oxide semiconductor film 19a. Accordingly, in the step of forming the oxide insulating film 24, the oxide insulating film 22 serves as a protective film of the oxide semiconductor film 19a. Consequently, the oxide insulating film 24 can be formed using the high-frequency power having a high power density while damage to the oxide semiconductor film 19a is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as a source gas, the pressure in the treatment chamber is 200 Pa, the substrate temperature is 220° C., and a high-frequency power of 1500 W is supplied to parallel-plate electrodes with the use of a 27.12 MHz high-frequency power source. Note that the plasma CVD apparatus is a parallel plate plasma CVD apparatus in which the electrode area is 6000 cm$^2$, and the power per unit area (power density) into which the supplied power is converted is 0.25 W/cm$^2$.

When the conductive films 21a and 21b serving as a pair of electrodes are formed, the oxide semiconductor film 19a is damaged by the etching of the conductive film, so that oxygen vacancies are generated on the back channel side (the side of the oxide semiconductor film 19a which is opposite to the side facing the conductive film 13 serving as a gate electrode) of the oxide semiconductor film 19a. However, with the use of the oxide insulating film in which the oxygen content is higher than that in the stoichiometric composition as the oxide insulating film 24, the oxygen vacancies generated on the back channel side can be repaired by heat treatment. This can reduce defects contained in the oxide semiconductor film 19a, and thus, the reliability of the transistor 102 can be improved.

Figure 5D:
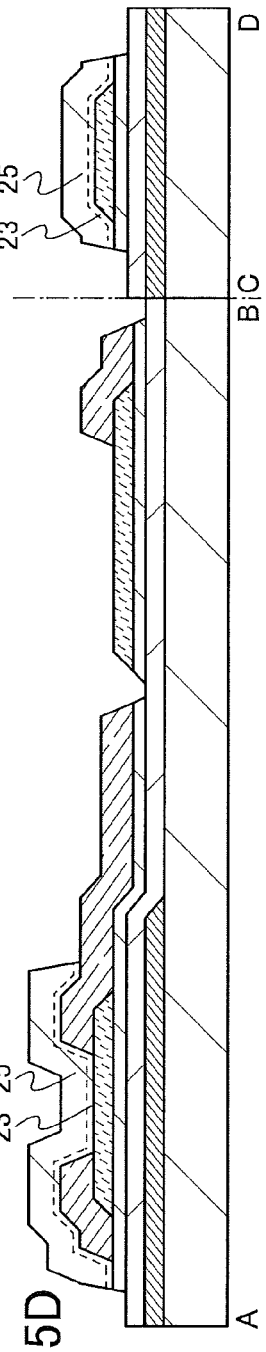

Then, a mask is formed over the oxide insulating film 24 by a photolithography process using a fourth photomask. Next, as illustrated in FIG. 5D, part of the oxide insulating film 22 and part of the oxide insulating film 24 are etched with the use of the mask to form the oxide insulating film 23 and the oxide insulating film 25. After that, the mask is removed.

In the step, the oxide insulating films 22 and 24 are preferably etched by a dry etching method. In that case, the oxide semiconductor film 19c is exposed to plasma in the etching treatment; thus, oxygen vacancies in the oxide semiconductor film 19c can be increased.

The oxide insulating films 22 and 24 are etched so that edges of the oxide insulating films 23 and 25 are positioned outside an area between the edges of the oxide semiconductor film 19a in the channel length direction as illustrated in the cross-sectional view along A-B, and the edges of the oxide insulating films 23 and 25 are positioned outside an area between the edges of the oxide semiconductor film 19a in the channel width direction as illustrated in the cross-sectional view along C-D. As a result, the oxide insulating films 23 and 25, which are isolated from each other, can be formed. Part of the oxide insulating film 16 is also etched when the oxide insulating films 22 and 24 are etched, so that the oxide insulating film 17 can be formed. As a result, part of the nitride insulating film 15 is exposed.

Next, heat treatment is performed. The heat treatment is performed typically at a temperature higher than or equal to 150° C. and lower than or equal to 400° C., preferably higher than or equal to 300° C. and lower than or equal to 400° C., more preferably higher than or equal to 320° C. and lower than or equal to 370° C.

An electric furnace, an RTA apparatus, or the like can be used for the heat treatment. The use of an RTA apparatus allows the heat treatment to be performed at a temperature higher than or equal to the strain point of the substrate if the heating time is short. Therefore, the heat treatment time can be shortened.

The heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 25 can transfer to the oxide semiconductor film 19a, so that the number of oxygen vacancies in the oxide semiconductor film 19a can be reduced.

In the case where the oxide insulating film 23 and the oxide insulating film 25 contain water, hydrogen, or the like, when heat treatment is performed after the nitride insulating film 29 is formed, water, hydrogen, or the like contained in the oxide insulating film 25 transfers to the oxide semiconductor film 19a, so that defects are generated in the oxide semiconductor film 19a. However, the heating can release water, hydrogen, or the like contained in the oxide insulating films 23 and 25; thus, variations in the electrical characteristics of the transistors 102 can be reduced, and changes in threshold voltage can be suppressed.

Note that when the oxide insulating film 24 is formed over the oxide insulating film 22 while being heated, oxygen can transfer to the oxide semiconductor film 19a to reduce the oxygen vacancies in the oxide semiconductor film 19a; thus, the heat treatment is not necessarily performed.

The heat treatment may be performed after the formation of the oxide insulating films 22 and 24 illustrated in FIG. 5C. However, the heat treatment is preferably performed after the formation of the oxide insulating films 23 and 25 illustrated in FIG. 5D, in which case oxygen does not transfer to the oxide semiconductor film 19c, and oxygen is released from the oxide semiconductor film 19c owing to exposure of the oxide semiconductor film 19c and accordingly oxygen vacancies are generated. This is preferable because the conductivity of the film 19b having conductivity formed later can be further improved.

Here, heat treatment is performed at 350° C. for one hour in a mixed atmosphere of nitrogen and oxygen.

Next, as illustrated in FIG. 6A, a metal film 26 is formed over the nitride insulating film 15, the oxide semiconductor film 19c, the oxide insulating film 17, the oxide insulating films 23 and 25, the conductive films 21a and 21b serving as a pair of electrodes, and the conductive film 21c.

The metal film 26 is preferably formed using a metal film or a metal nitride film that is oxidized to become a metal oxide film having a light-transmitting property and low oxygen permeability. Typically, aluminum, gallium, yttrium, hafnium, titanium, tantalum, tantalum nitride, or the like is used. The metal film 26 is formed by a sputtering method, an evaporation method, or the like.

The thickness of the metal film 26 is preferably greater than or equal to 0.5 nm and less than or equal to 50 nm, and the average thickness thereof is preferably greater than or equal to 2 nm and less than or equal to 10 nm. When the metal film 26 has a thickness in the above range, the whole metal film 26 can be oxidized by oxygen introduction treatment performed later. Note that in the step, oxygen can be introduced into one or both of the oxide insulating film 23 and the oxide insulating film 25.

Next, oxygen O* is introduced into the metal film 26 to oxidize the metal film 26, so that a metal oxide film 26a is formed as illustrated in FIG. 6B. For example, when aluminum is used for the metal film 26, an aluminum oxide film is formed as the metal oxide film 26a. Note that at this time, nitrogen may be introduced together with oxygen to form a metal oxynitride film.

Oxygen can be introduced into the metal film 26 by an ion implantation method, an ion doping method, plasma treatment, or the like. The oxygen introduction may be performed for the entire surface of the substrate 11 in one step or may be performed using a linear ion beam, for example. In the case of using a linear ion beam, the substrate 11 or the ion beam is relatively moved (scanned), whereby oxygen can be introduced into the entire area of the metal film 26. The oxygen introduction may be performed while heating is performed.

Typical examples of the oxygen introduced into the metal film 26 include an oxygen radical, ozone, and an oxygen atomic ion. The oxygen can be generated by a gas containing oxygen. Typical examples of the gas containing oxygen include an oxygen gas, a dinitrogen monoxide gas, a nitrogen dioxide gas, an ozone gas, water vapor, and a mixed gas of oxygen and hydrogen. With the gas containing oxygen, an inert gas such as nitrogen or a rare gas may be introduced.

In the case where the oxygen introduction is performed by an ion implantation method, the dosage of the oxygen is preferably greater than or equal to $1\times10^{13}$ ions/cm² and less than or equal to $5\times10^{16}$ ions/cm². With such a dosage, the oxygen content in the oxide insulating film 23 or the oxide insulating film 25 can be further increased.

In the case where oxygen is introduced by plasma treatment, oxygen in oxygen plasma is introduced into the metal film 26. For the oxygen introduction by plasma treatment, a plasma treatment apparatus such as a plasma CVD apparatus or a dry etching apparatus can be used. In the case where a plasma treatment apparatus is used, a support base or an electrode on which the substrate 11 is mounted is preferably biased. In that case, the oxygen having energy, typically an oxygen molecular ion, an oxygen atomic ion, or the like, can be drawn to the substrate 11 side, and the amount of oxygen introduced into the metal film 26 can be further increased.

In the case where oxygen is introduced by plasma treatment, by making oxygen excited by microwaves to generate high density oxygen plasma, oxidation of the metal film 26 is promoted to form a dense metal oxide film 26a and the amount of oxygen introduced into one or both of the oxide insulating films 23 and 25 can be increased. Note that in the case where oxygen is made to be excited by microwaves to generate high density oxygen plasma, the oxygen introduction is preferably performed at a temperature at which oxygen is not released from the oxide semiconductor films 19a and 19c, the oxide insulating films 23 and 25, typically, lower than or equal to 250° C., preferably lower than or equal to 200° C.

Introduction of oxygen into the metal film 26 by plasma treatment leads to improvement in throughput.

The metal oxide film 26a is formed by introducing oxygen into the metal film 26 formed over the substrate 11; thus, particles can be prevented from being generated in the step of forming the metal oxide film 26a, and the yield can be increased. Furthermore, the metal oxide film is formed by forming the metal film by a sputtering method and then introducing oxygen into the metal film, which can increase productivity and allows manufacture of semiconductor devices with the use of a large substrate.

After that, heat treatment may be performed. The heat treatment can make the bond of metal atoms and oxygen in the metal oxide film 26a further strengthened, and oxygen release from the oxide insulating films 22 and 24 in later heat treatment can be inhibited. The heating temperature at this time is higher than or equal to 300° C. and lower than or equal to 500° C., preferably higher than or equal to 400° C. and lower than or equal to 450° C.

Next, as illustrated in FIG. 6B, a nitride insulating film 28 to be the nitride insulating film 29 later is formed over the metal oxide film 26a.

The nitride insulating film 28 is formed by a sputtering method, a CVD method, or the like.

In addition, the oxide semiconductor film 19c becomes the film 19b having conductivity. In the case where a silicon nitride film is formed by a plasma CVD method as the nitride insulating film 28, hydrogen in the silicon nitride film is diffused to the oxide semiconductor film 19c, so that the film 19b having high conductivity can be formed.

Here, in a treatment chamber of a plasma CVD apparatus, a 50-nm-thick silicon nitride film is formed as the nitride insulating film 28 by a plasma CVD method in which silane with a flow rate of 50 sccm, nitrogen with a flow rate of 5000 sccm, and ammonia with a flow rate of 100 sccm are used as a source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm², and the power per unit area (power density) into which the supplied power is converted is $1.7\times10^{-1}$ W/cm².

Next, heat treatment may be performed. The heat treatment is performed typically at a temperature higher than or equal to 150° C. and lower than or equal to 400° C., preferably higher than or equal to 300° C. and lower than or equal to 400° C., more preferably higher than or equal to 320° C. and lower than or equal to 370° C. Since the metal oxide film 27 is provided over the oxide insulating films 23 and 25, oxygen contained in the oxide insulating film 23 or the oxide insulating film 25 can be transferred to the oxide semiconductor film 19a to reduce oxygen vacancies in the oxide semiconductor film 19a. As a result, the negative shift of the threshold voltage can be reduced. Moreover, the amount of change in the threshold voltage can be reduced.

The nitride insulating film 28 preferably contains hydrogen, in which case hydrogen in the nitride insulating film 28 transfers to the film 19b having conductivity in the heat treatment, further increasing the conductivity of the film 19b having conductivity.

Next, a mask is formed over the nitride insulating film 28 through a photolithography process using a fifth photomask, and then the metal oxide film 26a and the nitride insulating film 28 are etched using the mask, so that the metal oxide film 27 and the nitride insulating film 29 that have an opening 41 are formed as illustrated in FIG. 6C.

Next, as illustrated in FIG. 7A, a conductive film 30 to be the conductive film 31 later is formed over the conductive film 21b and the nitride insulating film 29.

The conductive film 30 is formed by a sputtering method, a CVD method, an evaporation method, or the like.

Then, a mask is formed over the conductive film 30 through a photolithography process using a sixth photomask. Next, as illustrated in FIG. 7B, part of the conductive film 30 is etched with the use of the mask to form the conductive film 31 as illustrated in FIG. 7B. After that, the mask is removed.

Through the above process, the transistor 102 and the capacitor 105 can be formed.

In this embodiment, the metal oxide film is formed by forming the metal film and then introducing oxygen into the metal film; thus, the metal oxide film can be formed while generation of particles is prevented. Thus, semiconductor devices can be manufactured with high yield.

In the transistor described in this embodiment, the metal oxide film having low oxygen permeability is provided over the oxide insulating film in which the oxygen content is higher than that in the stoichiometric composition; therefore, oxygen contained in the oxide insulating film can be prevented from diffusing to the outside. For this reason, oxygen contained in the oxide insulating film can be efficiently transferred to the oxide semiconductor film, so that the number of oxygen vacancies in the oxide semiconductor film can be reduced.

Furthermore, the oxide semiconductor film is provided so that the edges thereof are inside an area between the edges of the plurality of nitride insulating films; thus, the nitride insulating films prevent water, hydrogen, or the like from transferring to the oxide semiconductor film from the outside. Consequently, the amount of water, hydrogen, or the like contained in the oxide semiconductor film can be reduced.

Thus, the normally-off transistor can be formed. Furthermore, the amount of change in electrical characteristics, typically in threshold voltage, of the transistor over time or due to a stress test can be reduced.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps of the semiconductor device can be reduced. Furthermore, since the pair of electrodes has a light-transmitting property, the capacitor has a light-transmitting property. As a result, the area occupied by the capacitor can be increased and the aperture ratio in a pixel can be increased.

Thus, the semiconductor device that includes an oxide semiconductor film can have improved electrical characteristics.

Modification Example 1

Here, modification examples of the metal oxide film 27 described in Embodiment 1 will be described with reference to FIGS. 8A and 8B.

FIGS. 8A and 8B are top views of the pixel 103. Components of the transistor 102 are shown by dotted lines and the metal oxide film 27 is hatched.

As illustrated in FIG. 8A, the metal oxide film 27 can be formed over an entire surface of the pixel 103, which can prevent oxygen contained in the oxide insulating film 23 or 25 from transferring to the outside. Consequently, oxygen vacancies in the oxide semiconductor film 19a can be reduced.

Alternatively, metal oxide films 27a and 27b, which are isolated from each other, may be formed in the pixel 103 as illustrated in FIG. 8B. By reducing the thickness of the metal film 26 formed in the step in FIG. 6A, the metal oxide films 27a and 27b can be formed. Alternatively, a metal oxide film may be formed over an entire surface of the pixel 103 and then part of the metal oxide film is removed, in order to form the metal oxide films 27a and 27b, which are isolated from each other.

The metal oxide film obtained by isolation is preferably provided at least over the transistor 102, like the metal oxide film 27b illustrated in FIG. 8B, in which case oxygen contained in the oxide insulating film 23 or the oxide insulating film 25 can be prevented from transferring to the outside, resulting in reduction of oxygen vacancies in the oxide semiconductor film 19a.

The metal oxide film obtained by isolation is preferably formed over an entire surface of a region serving as the capacitor 105, like the metal oxide film 27a illustrated in FIG. 8B. In that case, variations in the capacitance of the capacitors 105 can be reduced.

Although the metal oxide film 27 is described here with reference to the top view of the pixel 103, it is also possible to form a metal oxide film with a similar shape over a driver circuit.

Modification Example 2

Figure 9:
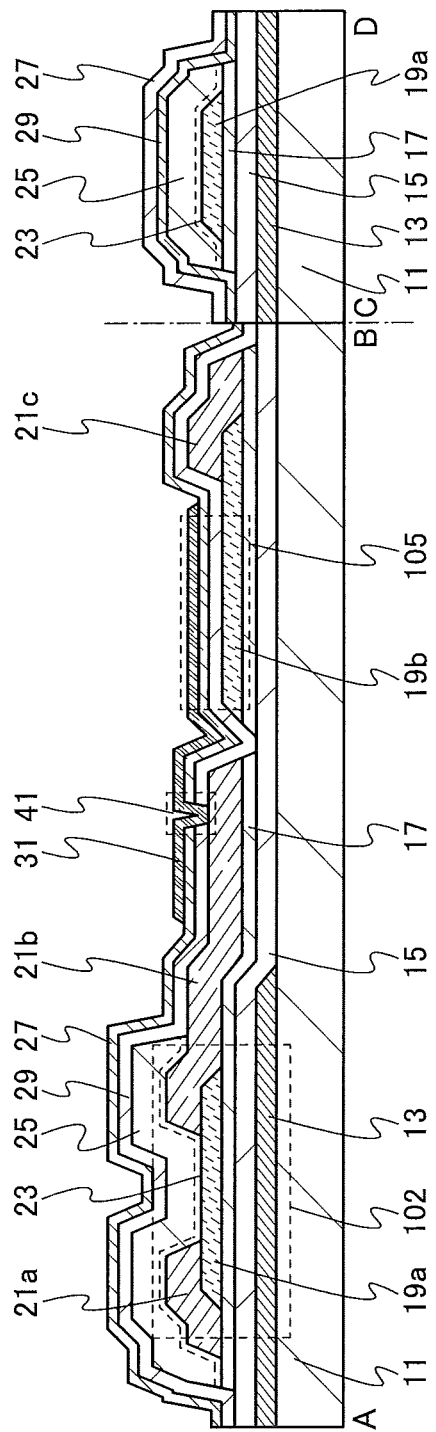
FIG. 9 is a cross-sectional view illustrating one embodiment of a method for manufacturing a semiconductor device.

FIG. 9 illustrates a modification example of the semiconductor device described in Embodiment 1.

The semiconductor device in FIG. 9 is different from the semiconductor device in FIG. 3 in the formation order of the metal oxide film 27 and the nitride insulating film 29. That is, the nitride insulating film 29 is formed over the nitride insulating film 15, the oxide insulating film 17, the film 19b having conductivity, the conductive films 21a and 21b serving as a pair of electrodes, the conductive film 21c, and the oxide insulating films 23 and 25, and the metal oxide film 27 is formed over the nitride insulating film 29. The conductive film 31 serving as a pixel electrode is formed over the metal oxide film 27.

In the semiconductor device in FIG. 9, the film 19b having conductivity included in the capacitor 105 is in contact with the nitride insulating film 29. The nitride insulating film 29 is provided between the film 19b having conductivity and the metal oxide film 27. Thus, the amount of oxygen that is introduced into the film 19b having conductivity can be reduced in an oxygen introduction step performed in a process for forming the metal oxide film 27, resulting in higher conductivity of the film 19b having conductivity.

Furthermore, since the conductive films 21a and 21b serving as a pair of electrodes and the conductive film 21c are covered with the nitride insulating film 29 in the oxygen introduction step performed in the process for forming the metal oxide film 27; thus, oxidation of the conductive films 21a and 21b serving as a pair of electrodes and the conductive film 21c can be prevented. Consequently, increases in the resistance values of the conductive films 21a and 21b serving as a pair of electrodes and the conductive film 21c can be inhibited.

This can reduce wiring delay in a semiconductor device formed using a large substrate.

Modification Example 3

Figure 10:
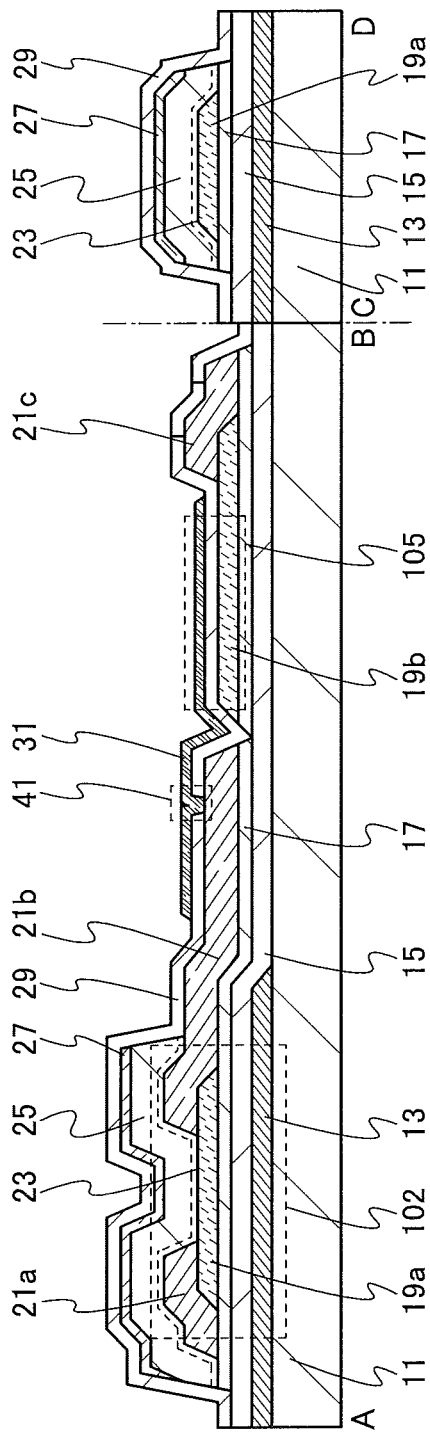
FIG. 10 is a cross-sectional view illustrating one embodiment of a method for manufacturing a semiconductor device.

FIG. 10 illustrates a modification example of the semiconductor device described in Embodiment 1.

The semiconductor device in FIG. 10 is different from the semiconductor device in FIG. 3 in that the metal oxide film 27 is not formed over an entire surface of the substrate 11 and is formed only over the transistor 102.

In the case of the semiconductor device, the oxide insulating film 24 is formed in the step illustrated in FIG. 5C and then the metal film 26 illustrated in FIG. 6A is formed. After that, oxygen is introduced into the metal film 26 to form the metal oxide film 26a over the oxide insulating film 24.

Next, a mask is formed over the metal oxide film through a photolithography process and then the oxide insulating films 22 and 24 and the metal oxide film 26a are etched using the mask, so that the oxide insulating films 23 and 25 and the metal oxide film 27 can be formed as illustrated in FIG. 10.

After that, the nitride insulating film 29 and the conductive film 31 are formed.

In the semiconductor device in FIG. 10, since the metal oxide film 27 is formed over the transistor 102, oxygen vacancies in the oxide semiconductor film 19a can be reduced. Oxygen contained in the oxide insulating film can be efficiently transferred to the oxide semiconductor film, and the amount of oxygen vacancies in the oxide semiconductor film can be reduced.

Modification Example 4

Figure 11:
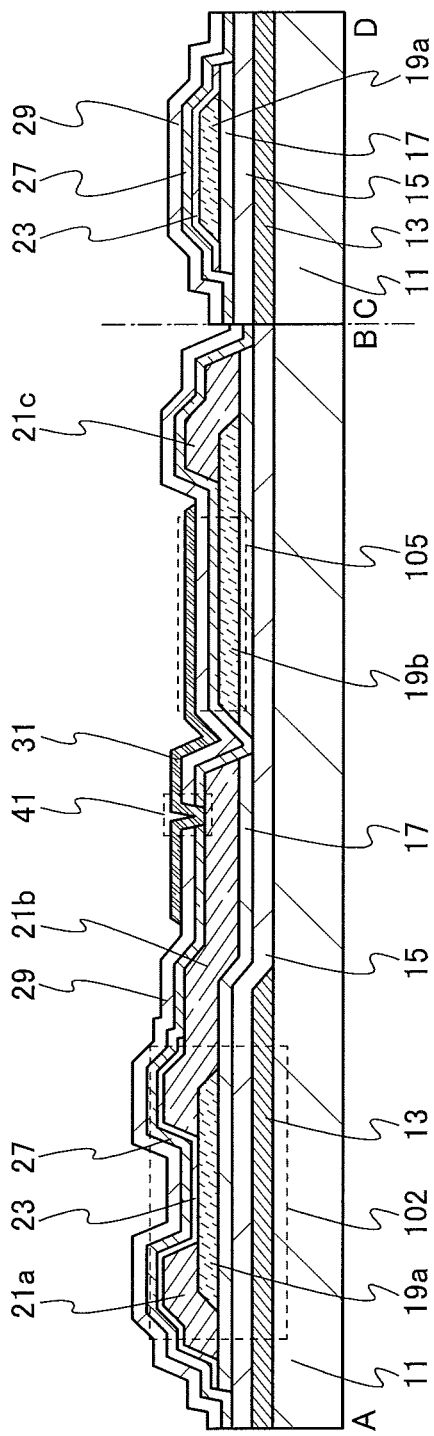
FIG. 11 is a cross-sectional view illustrating one embodiment of a method for manufacturing a semiconductor device.

FIG. 11 illustrates a modification example of the semiconductor device described in Embodiment 1.

The semiconductor device in FIG. 11 is different from the semiconductor device in FIG. 3 in that the oxide insulating film 25 is not formed. Note that assume here that the oxide insulating film 25 is an oxide insulating film in which the oxygen content is higher than that in the stoichiometric composition.

In the case of the semiconductor device, the oxide insulating film 22 is formed in the step illustrated in FIG. 5C and then a mask is formed over the oxide insulating film 22 through a photolithography process. After that, the oxide insulating film 22 is etched using the mask, so that the oxide insulating film 23 illustrated in FIG. 5D can be formed. After that, the metal oxide film 27, the nitride insulating film 29, and the conductive film 31 are formed through the step in FIG. 6A and the following steps.

In the semiconductor device in FIG. 11, an oxide insulating film in which the oxygen content is higher than that in the stoichiometric composition is not formed over the oxide insulating film 23. However, oxygen can be introduced into the oxide insulating film 23 as well as the metal film 26 in the step of introducing oxygen into the metal film 26 in the process for forming the metal oxide film 27. By making oxygen introduced into the oxide insulating film 23 transfer to the oxide semiconductor film 19a, oxygen vacancies in the oxide semiconductor film 19a can be reduced. When the oxide semiconductor film 19a is in contact with the metal oxide film 27, defect states are formed at the interface. In this modification example, the oxide insulating film 23 is formed over the oxide semiconductor film 19a; thus, defect states at the interface can be reduced. This can reduce variations in the threshold voltage of the transistor.

Modification Example 5

FIGS. 12A and 12B illustrate modification examples of the semiconductor device described in Embodiment 1.

Here, a semiconductor device including a transistor in which the number of defects in an oxide semiconductor film can be further reduced as compared to the transistor in the semiconductor device in FIG. 3 will be described with reference to drawings. The transistor described in this modification example is different from that in the semiconductor device in FIG. 3 in that a multilayer film including a plurality of oxide semiconductor films is provided.

FIGS. 12A and 12B each illustrate a cross-sectional view of an element substrate included in a semiconductor device. FIGS. 12A and 12B are cross-sectional views along dashed-dotted lines A-B and C-D in FIG. 2.

A transistor 102a in FIG. 12A includes a multilayer film 37a overlapping with the conductive film 13 serving as a gate electrode with the nitride insulating film 15 and the oxide insulating film 17 provided therebetween and the conductive films 21a and 21b serving as a pair of electrodes in contact with the multilayer film 37a. Moreover, over the nitride insulating film 15, the oxide insulating film 17, the multilayer film 37a, and the conductive films 21a and 21b serving as a pair of electrodes, the oxide insulating films 23 and 25, the metal oxide film 27, and the nitride insulating film 29 are formed.

A capacitor 105b illustrated in FIG. 12A includes a multilayer film 37b over the oxide insulating film 17, the metal oxide film 27 in contact with the multilayer film 37b, the nitride insulating film 29 in contact with the metal oxide film 27, and the conductive film 31 in contact with the nitride insulating film 29. The multilayer film 37b is in contact with the conductive film 21c serving as a capacitor wiring.

In the transistor 102b described in this embodiment, the multilayer film 37a includes the oxide semiconductor film 19a and an oxide semiconductor film 39a. That is, the multilayer film 37a has a two-layer structure. Part of the oxide semiconductor film 19a serves as a channel region. Furthermore, the oxide insulating film 23 is formed in contact with the oxide semiconductor film 39a, and the oxide insulating film 25 is formed in contact with the oxide insulating film 23. That is, the oxide semiconductor film 39a is provided between the oxide semiconductor film 19a and the oxide insulating film 23.

The oxide semiconductor film 39a is an oxide film containing one or more elements that form the oxide semiconductor film 19a. Thus, interface scattering is unlikely to occur at the interface between the oxide semiconductor films 19a and 39a. Thus, the transistor can have high field-effect mobility because the transfer of carriers is not hindered at the interface.

The oxide semiconductor film 39a is typically an In—Ga oxide film, an In—Zn oxide film, or an In-M-Zn oxide film (M represents Al, Ga, Y, Zr, La, Ce, or Nd). The energy at the conduction band bottom of the oxide semiconductor film 39a is closer to a vacuum level than that of the oxide semiconductor film 19a is, and typically, the difference between the energy at the conduction band bottom of the oxide semiconductor film 39a and the energy at the conduction band bottom of the oxide semiconductor film 19a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor film 39a and the electron affinity of the oxide semiconductor film 19a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide semiconductor film 39a preferably contains In because carrier mobility (electron mobility) can be increased.

When the oxide semiconductor film 39a contains a larger amount of Al, Ga, Y, Zr, La, Ce, or Nd in an atomic ratio than the amount of In in an atomic ratio, any of the following effects may be obtained: (1) the energy gap of the oxide semiconductor film 39a is widened; (2) the electron affinity of the oxide semiconductor film 39a decreases; (3) diffusion of impurities from the outside is reduced; (4) an insulating property is improved as compared to the oxide semiconductor film 19a; and (5) oxygen vacancies are not likely to be generated because Al, Ga, Y, Zr, La, Ce, or Nd is a metal element that is strongly bonded to oxygen.

In the case where the oxide semiconductor film 39a is an In-M-Zn oxide film, the proportions of In and M when summation of In and M is assumed to be 100 atomic % are preferably as follows: the atomic percentage of In is less than 50 atomic % and the atomic percentage of M is greater than or equal to 50 atomic %; more preferably, the atomic percentage of In is less than 25 atomic % and the atomic percentage of M is greater than or equal to 75 atomic %.

In the case where each of the oxide semiconductor film 19a and the oxide semiconductor film 39a is an In-M-Zn oxide film (M represents Al, Ga, Y, Zr, La, Ce, or Nd), the proportion of M atoms (M represents Al, Ga, Y, Zr, La, Ce, or Nd) in the oxide semiconductor film 39a is higher than that in the oxide semiconductor film 19a. Typically, the proportion of M in the oxide semiconductor film 39a is 1.5 or more times, preferably twice or more, more preferably three or more times as high as that in the oxide semiconductor film 19a.

Furthermore, in the case where each of the oxide semiconductor film 19a and the oxide semiconductor film 39a is an In-M-Zn oxide film (M represents Al, Ga, Y, Zr, La, Ce, or Nd), when In:M:Zn=$x_1$:$y_1$:$z_1$ [atomic ratio] is satisfied in the oxide semiconductor film 39a and In:M:Zn=$x_2$:$y_2$:$z_2$ [atomic ratio] is satisfied in the oxide semiconductor film 19a, $y_1/x_1$ is higher than $y_2/x_2$. It is preferable that $y_1/x_1$ be 1.5 or more times as high as $y_2/x_2$. It is more preferable that $y_1/x_1$ be twice or more as high as $y_2/x_2$. It is still more preferable that $y_1/x_1$ be three or more times as high as $y_2/x_2$.

In the case where the oxide semiconductor film 19a is an In-M-Zn oxide film (M represents Al, Ga, Y, Zr, La, Ce, or Nd) and a target having the atomic ratio of metal elements of In:M:Zn=$x_1$:$y_1$:$z_1$ is used for forming the oxide semiconductor film 19a, $x_1/y_1$ is preferably higher than or equal to ⅓ and lower than or equal to 6, more preferably higher than or equal to 1 and lower than or equal to 6, and $z_1/y_1$ is preferably higher than or equal to ⅓ and lower than or equal to 6, more preferably higher than or equal to 1 and lower than or equal to 6. Note that when $z_1/y_1$ is higher than or equal to 1 and lower than or equal to 6, a CAAC-OS film is easily formed as the oxide semiconductor film 19a. Typical examples of the atomic ratio of the metal elements of the target include In:M:Zn=1:1:1, In:M:Zn=1:1:1.2, and In:M:Zn=3:1:2.

In the case where the oxide semiconductor film 39a is an In-M-Zn oxide film (M is Al, Ga, Y, Zr, La, Ce, or Nd) and a target having the atomic ratio of metal elements of In:M:Zn=$x_2$:$y_2$:$z_2$ is used for forming the oxide semiconductor film 39a, $x_2/y_2$ is preferably lower than $x_1/y_1$, and $z_2/y_2$ is preferably higher than or equal to ⅓ and lower than or equal to 6, more preferably higher than or equal to 1 and lower than or equal to 6. Note that when $z_2/y_2$ is higher than or equal to 1 and lower than or equal to 6, a CAAC-OS film is easily formed as the oxide semiconductor film 39a. Typical examples of the atomic ratio of the metal elements of the target include In:M:Zn=1:3:2, In:M:Zn=1:3:4, In:M:Zn=1:3:6, and In:M:Zn=1:3:8.

Note that the atomic ratio of each of the oxide semiconductor film 19a and the oxide semiconductor film 39a can allow a difference within a range of ±40%.

The oxide semiconductor film 39a also serves as a film that relieves damage to the oxide semiconductor film 19a at the time of forming the oxide insulating film 25 later.

The thickness of the oxide semiconductor film 39a is greater than or equal to 3 nm and less than or equal to 100 nm, preferably greater than or equal to 3 nm and less than or equal to 50 nm.

The oxide semiconductor film 39a may have a non-single-crystal structure, for example, like the oxide semiconductor film 19a. The non-single crystal structure includes a CAAC-OS, which is described later, a polycrystalline structure, a microcrystalline structure, which is described later, or an amorphous structure, for example.

The oxide semiconductor film 39a may have an amorphous structure, for example. An amorphous oxide semiconductor film has disordered atomic arrangement and no crystalline component, for example.

Note that the oxide semiconductor film 19a and the oxide semiconductor film 39a may each be a mixed film including two or more of the following: a region having an amorphous structure, a region having a microcrystalline structure, a region having a polycrystalline structure, a CAAC-OS region, and a region having a single-crystal structure. The mixed film may have a single-layer structure including, for example, two or more of a region having an amorphous structure, a region having a microcrystalline structure, a region having a polycrystalline structure, a CAAC-OS region, and a region having a single-crystal structure. Furthermore, the mixed film may have a layered structure of two or more of a region having an amorphous structure, a region having a microcrystalline structure, a region having a polycrystalline structure, a CAAC-OS region, and a region having a single-crystal structure.

Note that the oxide semiconductor films 19a and 39a are not formed by simply stacking the films, but are formed to make a continuous junction (here, in particular, a structure in which the energy of the conduction band bottom is changed continuously between films). In other words, a layered structure in which there exists no impurity that forms a defect state such as a trap center or a recombination center at an interface between the films is provided. If an impurity exists between the oxide semiconductor film 19a and the oxide semiconductor film 39a that are stacked, the continuity of the energy band is broken, and the carrier is captured or recombined at the interface and then disappears.

In order to form such a continuous energy band, it is necessary to form films successively without being exposed to the air, with the use of a multi-chamber deposition apparatus (sputtering apparatus) including a load lock chamber. Each chamber in the sputtering apparatus is preferably evacuated to be a high vacuum state (to a degree of about $5\times10^{-7}$ Pa to $1\times10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 102c in FIG. 12B, a multilayer film 38a may be provided instead of the multilayer film 37a.

In addition, as in a capacitor 105c in FIG. 12B, a multilayer film 38b may be provided instead of the multilayer film 37b.

The multilayer film 38a includes an oxide semiconductor film 49a, the oxide semiconductor film 19a, and the oxide semiconductor film 39a. The multilayer film 38b includes a film 49b having conductivity, the film 19b having conductivity, and the film 39b having conductivity. That is, the multilayer films 38a and 38b each have a three-layer structure. The oxide semiconductor film 19a serves as a channel region in the multilayer film 38a.

The oxide insulating film 17 and the oxide semiconductor film 49a are in contact with each other. That is, the oxide semiconductor film 49a is provided between the oxide insulating film 17 and the oxide semiconductor film 19a.

The multilayer film 38a and the oxide insulating film 23 are in contact with each other. In addition, the oxide semiconductor film 39a and the oxide insulating film 23 are in contact with each other. That is, the oxide semiconductor film 39a is provided between the oxide semiconductor film 19a and the oxide insulating film 23.

The oxide semiconductor film 49a can be formed using a material and a formation method similar to those of the oxide semiconductor film 39a.

The oxide semiconductor film 49a preferably has a smaller thickness than the oxide semiconductor film 19a. When the oxide semiconductor film 49a has a thickness greater than or equal to 1 nm and less than or equal to 5 nm, preferably greater than or equal to 1 nm and less than or equal to 3 nm, the amount of change in the threshold voltage of the transistor can be reduced.

In the transistor described in this embodiment, the oxide semiconductor film 39a is provided between the oxide semiconductor film 19a and the oxide insulating film 23. Hence, if trap states are formed between the oxide semiconductor film 39a and the oxide insulating film 23 owing to impurities and defects, electrons flowing in the oxide semiconductor film 19a are less likely to be captured by the trap states because there is a distance between the trap states and the oxide semiconductor film 19a. Accordingly, the amount of on-state current of the transistor can be increased, and the field-effect mobility can be increased. When the electrons are captured by the trap states, the electrons become negative fixed charge. As a result, the threshold voltage of the transistor varies. However, by the distance between the oxide semiconductor film 19a and the trap states, capture of the electrons by the trap states can be reduced, and accordingly a fluctuation of the threshold voltage can be reduced.

Furthermore, impurities from the outside can be blocked by the oxide semiconductor film 39a, and accordingly, the amount of impurities that transfer from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

The oxide semiconductor film 49a is provided between the oxide insulating film 17 and the oxide semiconductor film 19a, and the oxide semiconductor film 39a is provided between the oxide semiconductor film 19a and the oxide insulating film 23. Thus, it is possible to reduce the concentration of silicon or carbon in the vicinity of the interface between the oxide semiconductor film 49a and the oxide semiconductor film 19a, the concentration of silicon or carbon in the oxide semiconductor film 19a, or the concentration of silicon or carbon in the vicinity of the interface between the oxide semiconductor film 39a and the oxide semiconductor film 19a.

The transistor 102c having such a structure includes very few defects in the multilayer film 38a including the oxide semiconductor film 32; thus, the electrical characteristics of the transistor can be improved, and typically, the on-state current can be increased and the field-effect mobility can be improved. Furthermore, in a BT stress test and a BT photostress test, which are examples of a stress test, the amount of change in threshold voltage is small, and thus, reliability is high.

<Band Structure of Transistor>

Next, the band structures of the multilayer film 37a provided in the transistor 102b illustrated in FIG. 12A and the multilayer film 38a provided in the transistor 102c illustrated in FIG. 12B will be described with reference to FIGS. 13A to 13C.

Here, for example, an In—Ga—Zn oxide having an energy gap of 3.15 eV is used as the oxide semiconductor film 19a, and an In—Ga—Zn oxide having an energy gap of 3.5 eV is used as the oxide semiconductor film 39a. The energy gaps can be measured using a spectroscopic ellipsometer (UT-300 manufactured by HORIBA JOBIN YVON S.A.S.).

The energy difference between the vacuum level and the valence band top (also called ionization potential) of the oxide semiconductor film 19a and the energy difference between the vacuum level and the valence band top of the oxide semiconductor film 39a are 8 eV and 8.2 eV, respectively. Note that the energy difference between the vacuum level and the valence band top can be measured using an ultraviolet photoelectron spectroscopy (UPS) device (VersaProbe manufactured by ULVAC-PHI, Inc.).

Thus, the energy difference between the vacuum level and the conduction band bottom (also called electron affinity) of the oxide semiconductor film 19a and the energy difference between the vacuum level and the conduction band bottom of the oxide semiconductor film 39a are 4.85 eV and 4.7 eV, respectively.

Figure 13A:
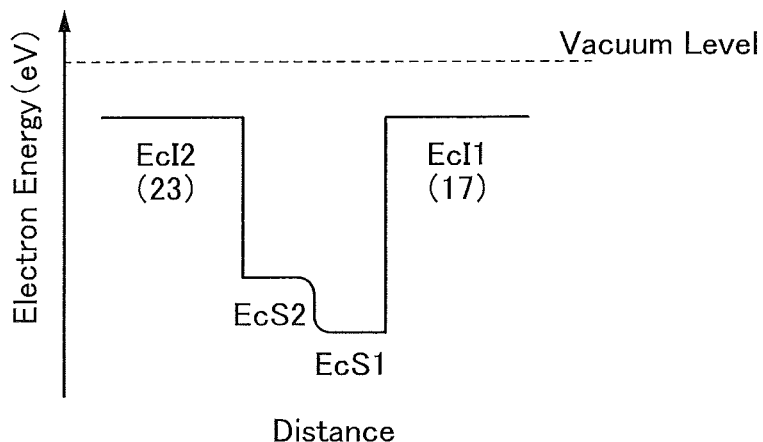
FIGS. 13A to 13C are diagrams each showing a band structure of a transistor.

FIG. 13A schematically illustrates a part of the band structure of the multilayer film 37a. Here, the case where a silicon oxide film is provided in contact with the multilayer film 37a will be described. In FIG. 13A, EcI1 denotes the energy of the conduction band bottom of the silicon oxide film; EcS1 denotes the energy of the conduction band bottom of the oxide semiconductor film 19a; EcS2 denotes the energy of the conduction band bottom of the oxide semiconductor film 39a; and EcI2 denotes the energy of the conduction band bottom of the silicon oxide film. Note that EcI1 and EcI2 correspond to the oxide insulating film 17 and the oxide insulating film 23 in FIG. 12A, respectively.

As illustrated in FIG. 13A, there is no energy barrier between the oxide semiconductor film 19a and the oxide semiconductor film 39a, and the energy level of the conduction band bottom is changed smoothly, or continuously. This is because the oxide semiconductor film 39a and the oxide semiconductor film 19a contain a common element and oxygen is transferred between the oxide semiconductor film 19a and the oxide semiconductor film 39a, so that a mixed layer is formed.

As illustrated in FIG. 13A, the oxide semiconductor film 19a in the multilayer film 37a serves as a well and a channel region of the transistor including the multilayer film 37a is formed in the oxide semiconductor film 19a. Note that since the energy of the conduction band bottom of the multilayer film 37a is continuously changed, it can be said that the oxide semiconductor film 19a and the oxide semiconductor film 39a are continuous.

Although trap states due to impurities or defects might be formed in the vicinity of the interface between the oxide semiconductor film 39a and the oxide insulating film 23 as illustrated in FIG. 13A, the oxide semiconductor film 19a can be distanced from the trap states owing to the existence of the oxide semiconductor film 39a. However, when the energy difference between EcS1 and EcS2 is small, electrons in the oxide semiconductor film 19a might reach the trap state across the energy gap. When the electrons are captured by the trap state, negative fixed charge is generated at the interface with the oxide insulating film, so that the threshold voltage of the transistor is shifted in the positive direction. Therefore, it is preferable that the energy difference between EcS1 and EcS2 be 0.1 eV or more, more preferably 0.15 eV or more because a change in the threshold voltage of the transistor is prevented and stable electrical characteristics are achieved.

Figure 13B:
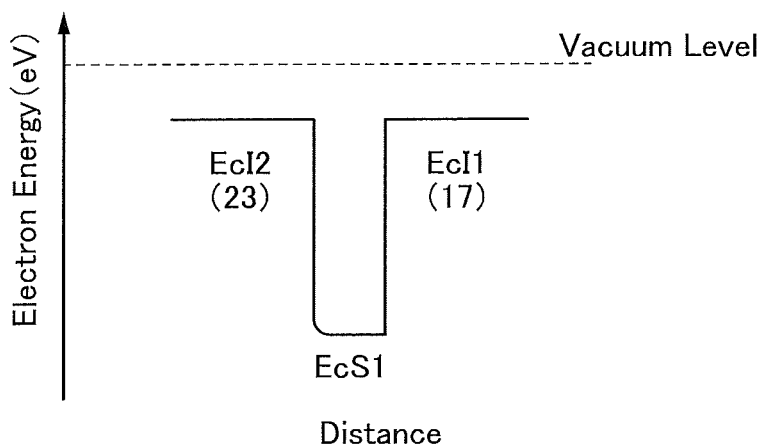

FIG. 13B schematically illustrates a part of the band structure of the multilayer film 37a, which is a modification example of the band structure illustrated in FIG. 13A. Here, the case where a silicon oxide film is provided in contact with the multilayer film 37a will be described. In FIG. 13B, EcI1 denotes the energy of the conduction band bottom of the silicon oxide film; EcS1 denotes the energy of the conduction band bottom of the oxide semiconductor film 19a; and EcI2 denotes the energy of the conduction band bottom of the silicon oxide film. Note that EcI1 corresponds to the oxide insulating film 17 in FIG. 12A and EcI2 corresponds to the oxide insulating film 23 in FIG. 12A.

In the transistor illustrated in FIG. 12A, an upper portion of the multilayer film 37a, that is, the oxide semiconductor film 39a is etched in some cases in formation of the conductive films 21a and 21b serving as a pair of electrodes. In addition, a mixed layer of the oxide semiconductor film 19a and the oxide semiconductor film 39a is formed on the top surface of the oxide semiconductor film 19a in some cases in formation of the oxide semiconductor film 39a.

For example, when the oxide semiconductor film 19a is formed using, as a sputtering target, an In—Ga—Zn oxide whose atomic ratio of In to Ga and Zn is 1:1:1 or an In—Ga—Zn oxide whose atomic ratio of In to Ga and Zn is 3:1:2, and the oxide semiconductor film 39a is formed using, as a sputtering target, an In—Ga—Zn oxide whose atomic ratio of In to Ga and Zn is 1:3:2, an In—Ga—Zn oxide whose atomic ratio of In to Ga and Zn is 1:3:4, or an In—Ga—Zn oxide whose atomic ratio of In to Ga and Zn is 1:3:6, the Ga content in the oxide semiconductor film 39a is higher than that in the oxide semiconductor film 19a. Thus, a GaOx layer or a mixed layer whose Ga content is higher than that in the oxide semiconductor film 19a can be formed on the top surface of the oxide semiconductor film 19a.

For that reason, even in the case where the oxide semiconductor film 39a is etched, the energy of the conduction band bottom of EcS1 on the EcI2 side is increased and the band structure in FIG. 13B is shown in some cases.

As in the band structure illustrated in FIG. 13B, in observation of a cross section of a channel region, only the oxide semiconductor film 19a in the multilayer film 37a is apparently observed in some cases. However, a mixed layer that contains Ga more than the oxide semiconductor film 19a does is framed over the oxide semiconductor film 19a in fact, and thus the mixed layer can be regarded as a 1.5-th layer. Note that the mixed layer can be confirmed by analyzing the composition in the upper portion of the oxide semiconductor film 19a, when the elements contained in the multilayer film 37a are measured by EDX analysis, for example. The mixed layer can be confirmed, for example, in such a manner that the Ga content in the upper portion of the oxide semiconductor film 19a is larger than the Ga content in the oxide semiconductor film 19a.

Figure 13C:
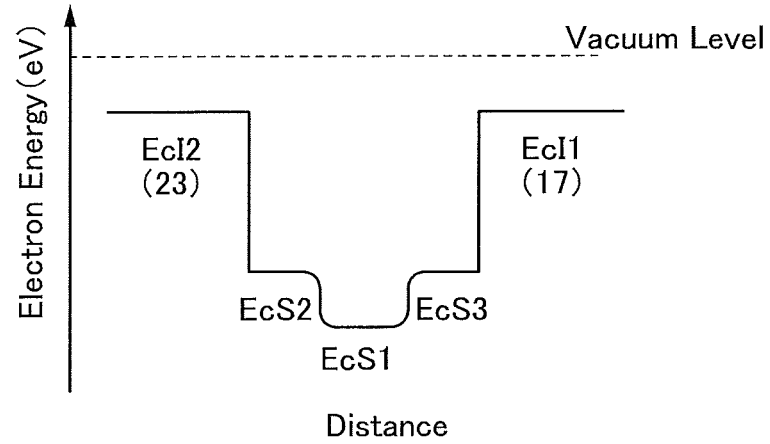

FIG. 13C schematically illustrates a part of the band structure of the multilayer film 38a. Here, the case where silicon oxide films are provided in contact with the multilayer film 38a will be described. In FIG. 13C, EcI1 denotes the energy of the conduction band bottom of the silicon oxide film; EcS1 denotes the energy of the conduction band bottom of the oxide semiconductor film 19a; EcS2 denotes the energy of the conduction band bottom of the oxide semiconductor film 39a; EcS3 denotes the energy of the conduction band bottom of the oxide semiconductor film 49a; and EcI2 denotes the energy of the conduction band bottom of the silicon oxide film. Note that EcI1 and EcI2 correspond to the oxide insulating film 17 and the oxide insulating film 23 in FIG. 12B, respectively.

As illustrated in FIG. 13C, there is no energy barrier between the oxide semiconductor films 49a, 19a, and 39a, and the energy level of the conduction band bottom is changed smoothly, or continuously. This is because the oxide semiconductor films 49a, 19a, and 39a contain a common element and oxygen is transferred between the oxide semiconductor films 19a and 49a and between the oxide semiconductor films 19a and 39a, so that a mixed layer is formed.

As illustrated in FIG. 13C, the oxide semiconductor film 19a in the multilayer film 38a serves as a well and a channel region of the transistor including the multilayer film 38a is formed in the oxide semiconductor film 19a. Note that since the energy of the conduction band bottom of the multilayer film 38a is continuously changed, it can be said that the oxide semiconductor films 49a, 19a, and 39a are continuous.

Although, in the case where the oxide insulating film 17, the oxide semiconductor film 19a, and the oxide insulating film 23 are stacked in this order, trap states due to impurities or defects might be formed in the vicinity of the interface between the oxide semiconductor film 19a and the oxide insulating film 23 and in the vicinity of the interface between the oxide semiconductor film 19a and the oxide insulating film 17, as illustrated in FIG. 13C, the oxide semiconductor film 19a can be distanced from the trap states owing to the existence of the oxide semiconductor films 39a and 49a. However, when the energy difference between EcS1 and EcS2 and the energy difference between EcS1 and EcS3 are small, electrons in the oxide semiconductor film 19a might reach the trap state across the energy difference. When the electron is captured by the trap state, negative fixed charge is generated at the interface with the oxide insulating film, so that the threshold voltage of the transistor is shifted in the positive direction. Therefore, it is preferable that the energy difference between EcS1 and EcS2 and the energy difference between EcS1 and EcS3 each be 0.1 eV, more preferably 0.15 eV or more because a change in the threshold voltage of the transistor is prevented and stable electrical characteristics are achieved.

Note that the structures, methods, and the like described in this embodiment can be used as appropriate in combination with any of the structures, methods, and the like described in the other embodiments.

Modification Example 6

Figure 14:
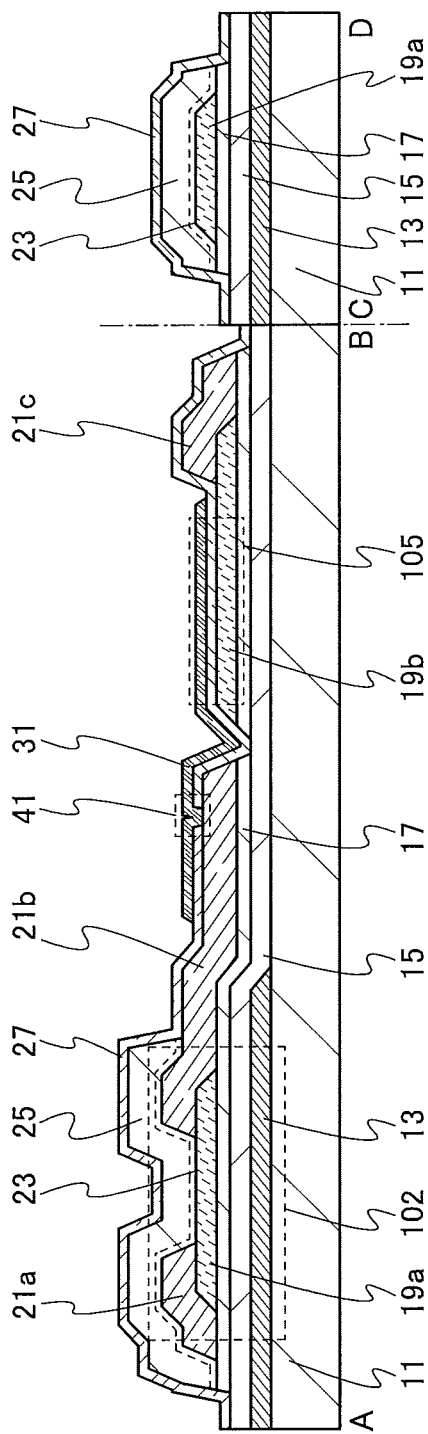
FIG. 14 is a cross-sectional view illustrating one embodiment of a method for manufacturing a semiconductor device.

FIG. 14 illustrates a modification example of the semiconductor device described in Embodiment 1.

The semiconductor device in FIG. 14 is different from the semiconductor device in FIG. 3 in that the nitride insulating film 29 is not formed.

In the case of the modified semiconductor device, after the metal oxide film 26a illustrated in FIG. 6B is formed, a mask is formed over the metal oxide film 26a through a photolithography process. After that, the metal oxide film 26a is etched using the mask to form the opening 41. After that, the conductive film 31 is formed through the step in FIG. 7A and the following steps.

In the semiconductor device in FIG. 14, the nitride insulating film 29 is not formed. The oxide semiconductor film 19c is damaged in an etching step for forming the oxide insulating films 23 and 25 illustrated in FIG. 5D, so that oxygen vacancies are generated. As a result, the oxide semiconductor film 19c becomes the film 19b having conductivity.

Through the above process, the film having conductivity serving as one electrode of the capacitor can be formed at the same time as the oxide semiconductor film of the transistor.

Modification Example 7

For the conductive films 21a and 21b serving as a pair of electrodes provided in the transistor described in Embodiment 1, it is possible to use a conductive material that is easily bonded to oxygen, such as tungsten, titanium, aluminum, copper, molybdenum, chromium, or tantalum, or an alloy thereof. Thus, oxygen contained in the oxide semiconductor film 19a and the conductive material contained in the conductive films 21a and 21b serving as a pair of electrodes are bonded to each other, so that an oxygen vacancy region is formed in the oxide semiconductor film 19a. Furthermore, in some cases, part of constituent elements of the conductive material that forms the conductive films 21a and 21b serving as a pair of electrodes is mixed into the oxide semiconductor film 19a. Consequently, low-resistance regions are formed in the vicinity of regions of the oxide semiconductor film 19a that are in contact with the conductive films 21a and 21b serving as a pair of electrodes. The low-resistance regions are formed between the oxide insulating film 17 and the conductive films 21a and 21b serving as a pair of electrodes so as to be in contact with the conductive films 21a and 21b serving as a pair of electrodes. Owing to high conductivity of the low-resistance regions, contact resistance between the oxide semiconductor film 19a and the conductive films 21a and 21b serving as a pair of electrodes can be reduced, and thus, the on-state current of the transistor can be increased.

The conductive films 21a and 21b serving as a pair of electrodes may each have a layered structure of the conductive material that is easily bonded to oxygen and a conductive material that is not easily bonded to oxygen, such as titanium nitride, tantalum nitride, or ruthenium. With such a layered structure, oxidization of the conductive films 21a and 21b serving as a pair of electrodes can be prevented at the interface between the oxide insulating film 23 and each of the conductive films 21a and 21b serving as a pair of electrodes, so that an increase in the resistance of the conductive films 21a and 21b serving as a pair of electrodes can be inhibited.

Note that the structures, methods, and the like described in this embodiment can be used as appropriate in combination with any of the structures, methods, and the like described in the other embodiments.

Modification Example 8

In the method for manufacturing the transistor described in Embodiment 1, after the conductive films 21a and 21b serving as a pair of electrodes are formed, the oxide semiconductor film 19a may be exposed to plasma generated in an oxidizing atmosphere so that oxygen is supplied to the oxide semiconductor film 19a. Examples of the oxidizing gas include oxygen, ozone, dinitrogen monoxide, and nitrogen dioxide. Furthermore, in the plasma treatment, the oxide semiconductor film 19a is preferably exposed to plasma generated with no bias applied to the substrate 11 side. In that case, the oxide semiconductor film 19a can be supplied with oxygen without being damaged; accordingly, the number of oxygen vacancies in the oxide semiconductor film 19a can be reduced. Moreover, impurities, e.g., halogen such as fluorine or chlorine remaining on a surface of the oxide semiconductor film 19a due to the etching treatment can be removed. The plasma treatment is preferably performed while heating is performed at a temperature higher than or equal to 300° C. Oxygen in the plasma is bonded to hydrogen contained in the oxide semiconductor film 19a to form water. Since the substrate is heated, water is released from the oxide semiconductor film 19a. Consequently, the amount of hydrogen and water in the oxide semiconductor film 19a can be reduced.

Note that the structures, methods, and the like described in this embodiment can be used as appropriate in combination with any of the structures, methods, and the like described in the other embodiments.

Embodiment 2

In this embodiment, a semiconductor device and a manufacturing method thereof, which are different from those described in Embodiment 1, will be described with reference to drawings. The semiconductor device in this embodiment is different from that in Embodiment 1 in that a transistor has a structure in which an oxide semiconductor film is provided between different gate electrodes, that is, a dual-gate structure. Note that the description about the same structures as those in Embodiment 1 is omitted.

Figure 15:
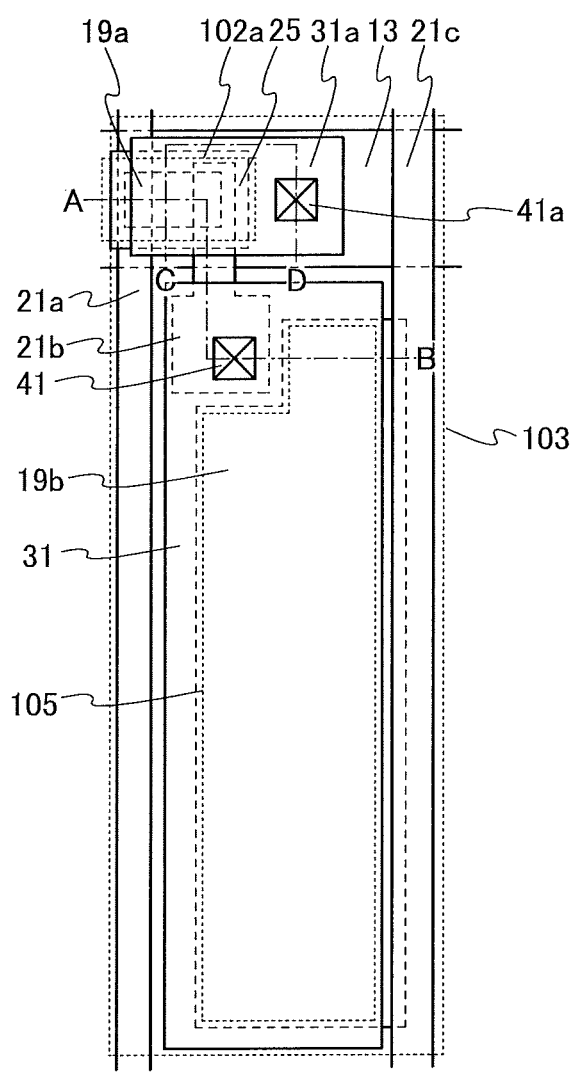
FIG. 15 is a top view illustrating one embodiment of a method for manufacturing a semiconductor device.

The specific structure of an element substrate included in a display device will be described. Here, a specific example of a liquid crystal display device including a liquid crystal element in the pixel 103 will be described. FIG. 15 is a top view of the pixel 103 illustrated in FIG. 1B.

The structure in this embodiment is different from that in Embodiment 1 in that, in a plan view of the pixel 103 in FIG. 15, a conductive film 31a serving as a gate electrode and overlapping with part or the whole of each of the conductive film 13 serving as a gate electrode, the oxide semiconductor film 19a, the conductive films 21a and 21b, and the oxide insulating film 25 is provided. The conductive film 31a serving as a gate electrode is connected to the conductive film 13 serving as a gate electrode in an opening 41a.

Figure 16:
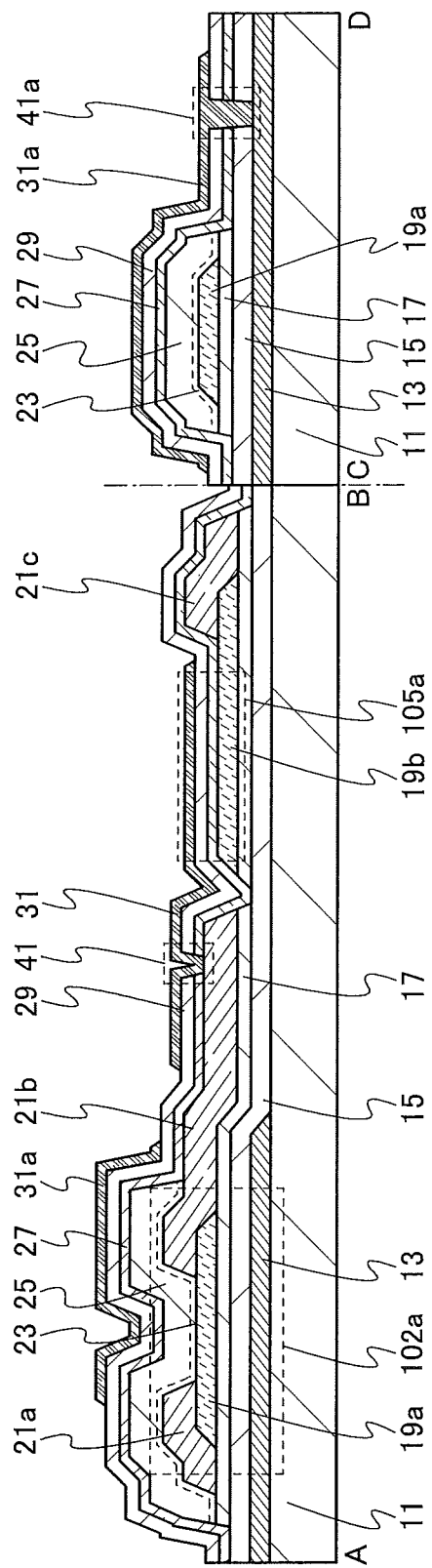
FIG. 16 is a cross-sectional view illustrating one embodiment of a semiconductor device.

Next, FIG. 16 is a cross section along dashed-dotted lines A-B and C-D in FIG. 15. The transistor 102a in FIG. 16 is a channel-etched transistor. Note that the transistor 102a in the channel length direction, a connection portion between the transistor 102a and the conductive film 31 serving as a pixel electrode, and the capacitor 105a are illustrated in the cross-sectional view along dashed-dotted line A-B, and the transistor 102a in the channel width direction and a connection portion between the conductive film 13 and the conductive film 31a each serving as a gate electrode are illustrated in the cross-sectional view along dashed-dotted line C-D.

The transistor 102a in FIG. 16 has a dual-gate structure and includes the conductive film 13 serving as a gate electrode over the substrate 11. In addition, the transistor 102a includes the nitride insulating film 15 over the substrate 11 and the conductive film 13 serving as a gate electrode, the oxide insulating film 17 over the nitride insulating film 15, the oxide semiconductor film 19a overlapping with the conductive film 13 serving as a gate electrode with the nitride insulating films 15 and 17 provided therebetween, and the conductive films 21a and 21b serving as a pair of electrodes that are in contact with the oxide semiconductor film 19a. Moreover, the oxide insulating film 23 is formed over the oxide insulating film 17, the oxide semiconductor film 19a, and the conductive films 21a and 21b serving as a pair of electrodes, and the oxide insulating film 25 is formed over the oxide insulating film 23. The metal oxide film 27 is formed over the nitride insulating film 15, the oxide insulating films 23 and 25, and the conductive film 21b. The nitride insulating film 29 is formed over the metal oxide film 27. In addition, the conductive film 31 connected to one of the conductive films 21a and 21b serving as a pair of electrodes, here the conductive film 21b, and the conductive film 31a serving as a gate electrode are formed over the nitride insulating film 29. Note that the conductive film 31 serves as a pixel electrode.

As illustrated in the cross-sectional view along C-D, the conductive film 31a serving as a gate electrode is connected to the conductive film 13 serving as a gate electrode in the opening 41a formed in the nitride insulating film 15, the metal oxide film 27, and the nitride insulating film 29. That is, the conductive film 13 serving as a gate electrode and the conductive film 31a serving as a gate electrode have equal potentials.

Thus, by applying a voltage equal to that of each gate electrode of the transistor 102a, variations in the initial characteristics can be reduced, and degradation of the transistor 102a due to the −GBT stress test and a change in the rising voltage of the on-state current at different drain voltages can be suppressed. Furthermore, a region where carriers flow in the oxide semiconductor film 19a becomes larger in the film thickness direction, so that the amount of carrier transfer is increased. As a result, the on-state current of the transistor 102a is increased and the field-effect mobility becomes higher, typically becomes higher than or equal to 20 cm$^2$/V·s.

Over the transistor 102a in this embodiment, the oxide insulating films 23 and 25, which are isolated from each other, are formed. The oxide insulating films 23 and 25 overlap with the oxide semiconductor film 19a. In the cross-sectional view in the channel width direction, the edges of the oxide insulating films 23 and 25 are outside an area between the edges of the oxide semiconductor film 19a. In addition, in the channel width direction in FIG. 16, the conductive film 31a serving as a gate electrode faces a side surface of the oxide semiconductor film 19a with the oxide insulating films 23 and 25 provided therebetween.

Defects are formed in an end portion of the oxide semiconductor film processed by etching or the like because of damage due to the processing, and the end portion of the oxide semiconductor film is polluted by attachment of impurities, or the like. Thus, when stress such as an electric field is applied, the end portion of the oxide semiconductor film is easily activated to be n-type (have low resistance). Therefore, the end portion of the oxide semiconductor film 19a overlapping with the conductive film 13 serving as a gate electrode easily becomes n-type. When the end portion that becomes n-type is provided between the conductive films 21a and 21b serving as a pair of electrodes, the region that becomes n-type serves as a carrier path, resulting in generation of a parasitic channel. However, as illustrated in the cross-sectional view along C-D, when the conductive film 31a serving as a gate electrode faces a side surface of the oxide semiconductor film 19a with the oxide insulating films 23 and 25 provided therebetween in the channel width direction, generation of a parasitic channel on the side surface of the oxide semiconductor film 19a or in a region including the side surface and the vicinity of the side surface is suppressed owing to the electric field of the conductive film 31a serving as a gate electrode. As a result, a transistor having excellent electrical characteristics such as a sharp increase in the drain current at the threshold voltage is obtained.

The oxide insulating film 23 or the oxide insulating film 25 provided over the oxide semiconductor film 19a is preferably an oxide insulating film in which the oxygen content is higher than that in the stoichiometric composition.

When the metal oxide film 27 having low oxygen permeability is provided over the oxide insulating films 23 and 25, diffusion of oxygen contained in the oxide insulating film 23 or the oxide insulating film 25 to the outside can be prevented, so that oxygen vacancies in the oxide semiconductor film 19a can be reduced.

Furthermore, the oxide semiconductor film 19a is provided so that the edges thereof are inside an area between the edges of the nitride insulating films 15 and 29; thus, the nitride insulating films 15 and 29 prevent water, hydrogen, or the like from transferring to the oxide semiconductor film 19a from the outside. Consequently, the amount of water, hydrogen, or the like contained in the oxide semiconductor film 19a can be reduced.

Thus, the transistor 102a is normally-off. Furthermore, the amount of change in electrical characteristics, typically in threshold voltage, of the transistor over time or due to a stress test can be reduced.

In the capacitor 105a, the film 19b having conductivity is formed at the same time as the oxide semiconductor film 19a and has increased conductivity by including oxygen vacancies generated by plasma damage or the like. Alternatively, the film 19b having conductivity is formed at the same time as the oxide semiconductor film 19a and has increased conductivity by containing impurities. Alternatively, the film 19b having conductivity is formed at the same time as the oxide semiconductor film 19a and has increased conductivity by containing impurities and including oxygen vacancies generated by plasma damage or the like.

Furthermore, the use of the metal oxide film 27 and the nitride insulating film 29, which are high dielectric materials, as the dielectric of the capacitor 105a can increase the capacitance of the capacitor 105a.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps of the semiconductor device can be reduced. Furthermore, since the pair of electrodes has a light-transmitting property, the capacitor has a light-transmitting property. As a result, the area occupied by the capacitor can be increased and the aperture ratio in a pixel can be increased.

The details of the structure of the transistor 102a will be described below. Note that the description of the components with the same reference numerals as those in Embodiment 1 is omitted.

The conductive film 31a serving as a gate electrode can be formed using a material similar to that of the conductive film 31 described in Embodiment 1, as appropriate.

Next, a method for manufacturing the transistor 102a and the capacitor 105a in FIG. 16 will be described with reference to FIGS. 4A to 4D, FIGS. 5A to 5D, FIGS. 6A and 6B, and FIGS. 17A to 17C.

In a manner similar to that of Embodiment 1, through the process of FIGS. 4A to 4D, FIGS. 5A to 5D, and FIGS. 6A and 6B, the conductive film 13 serving as a gate electrode, the nitride insulating film 15, the oxide insulating film 16, the oxide semiconductor film 19a, the film 19b having conductivity, the conductive films 21a and 21b serving as a pair of electrodes, the oxide insulating films 22 and 24, the metal oxide film 26a, and the nitride insulating film 28 are formed over the substrate 11. In the process, photography processes using first to fourth photomasks are performed.

Figure 17:
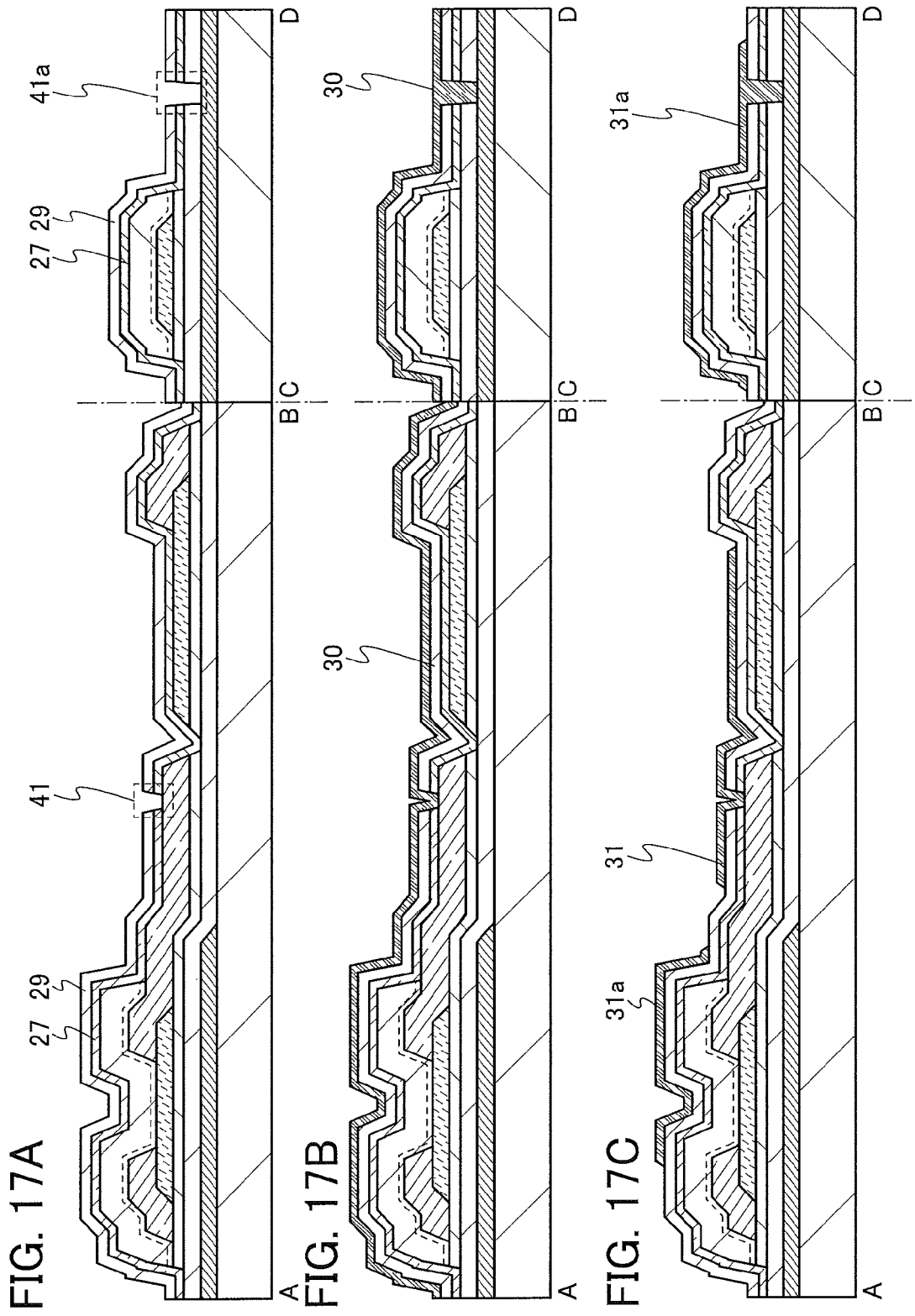
FIGS. 17A to 17C are cross-sectional views illustrating one embodiment of a method for manufacturing a semiconductor device.

Next, a mask is formed over the nitride insulating film 28 through a photolithography process using a fifth photomask, and then each of the nitride insulating film 15, the metal oxide film 26a, and the nitride insulating film 28 is partly etched using the mask, so that the nitride insulating film 15, the metal oxide film 27, and the nitride insulating film 29 that have the openings 41 and 41a are formed as illustrated in FIG. 17A.

Next, as illustrated in FIG. 17B, the conductive film 30 to be the conductive films 31 and 31a later is formed over the conductive film 13 serving as a gate electrode, the conductive film 21b, and the nitride insulating film 29.

Next, a mask is formed over the conductive film 30 through a photolithography process using a sixth photomask. Next, as illustrated in FIG. 17C, part of the conductive film 30 is etched with the use of the mask to form the conductive film 31 serving as a pixel electrode and the conductive film 31a serving as a gate electrode. After that, the mask is removed.

Through the above process, the transistor 102a and the capacitor 105a can be formed.

In the transistor described in this embodiment, when the conductive film 31a serving as a gate electrode faces a side surface of the oxide semiconductor film 19a with the oxide insulating films 23 and 25 provided therebetween in the channel width direction, generation of a parasitic channel on the side surface of the oxide semiconductor film 19a or in a region including the side surface and the vicinity of the side surface is suppressed. As a result, the transistor has excellent electrical characteristics such as a sharp increase in the drain current at the threshold voltage.

In the transistor described in this embodiment, the metal oxide film having low oxygen permeability is provided over the oxide insulating film in which the oxygen content is higher than that in the stoichiometric composition; therefore, diffusion of oxygen contained in the oxide insulating film to the outside can be prevented. For this reason, oxygen contained in the oxide insulating film can be efficiently transferred to the oxide semiconductor film, so that the number of oxygen vacancies in the oxide semiconductor film can be reduced.

Furthermore, the oxide semiconductor film is provided so that the edges thereof are inside an area between the edges of the plurality of nitride insulating films; thus, the nitride insulating films prevent water, hydrogen, or the like from transferring to the oxide semiconductor film from the outside. Consequently, the amount of water, hydrogen, or the like contained in the oxide semiconductor film can be reduced.

Thus, the transistor that is normally-off can be formed. Furthermore, the amount of change in electrical characteristics, typically in threshold voltage, of the transistor due to a change over time or a stress test can be reduced.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps of the semiconductor device can be reduced. Furthermore, since the pair of electrodes has a light-transmitting property, the capacitor has a light-transmitting property. As a result, the area occupied by the capacitor can be increased and the aperture ratio in a pixel can be increased.

Thus, the semiconductor device that includes an oxide semiconductor film can have improved electrical characteristics.

Note that the structures, methods, and the like described in this embodiment can be used as appropriate in combination with any of the structures, methods, the modification examples, and the like described in the other embodiments.

Embodiment 3

In this embodiment, one embodiment that can be applied to an oxide semiconductor film in the transistor included in the semiconductor device described in the above embodiment and a film having conductivity serving as an electrode of a capacitor will be described. Note that the film having conductivity can be called an oxide semiconductor film having high conductivity; thus, a description will be given taking an oxide semiconductor film as a typical example, first.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Alternatively, the oxide semiconductor film may be a CAAC-OS film. Alternatively, the oxide semiconductor film may include an amorphous oxide semiconductor and an oxide semiconductor having a crystal grain. Described below are the CAAC-OS, the polycrystalline oxide semiconductor, and the microcrystalline oxide semiconductor.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC OS film is greater than or equal to 2500 nm$^2$, preferably greater than or equal to 5 μm$^2$, more preferably greater than or equal to 1000 μm$^2$. Furthermore, in a cross-sectional TEM image, when the proportion of the crystal parts is greater than or equal to 50%, preferably greater than or equal to 80%, more preferably greater than or equal to 95% of the CAAC-OS film, the CAAC-OS film is a thin film having physical properties similar to those of a single crystal.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the 1 μM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal arrangement in the crystal parts. However, there is no regularity of arrangement of metal atoms between different crystal parts.

Note that in an electron diffraction pattern of the CAAC-OS film, spots (bright spots) having alignment are shown. From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is derived from the (00x) (x is an integer) plane of the InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is fainted through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal portion having no c-axis alignment is included in part of the CAAC-OS film. It is preferable that in the CAAC-OS film, a peak of 2θ appears at around 31° and a peak of 2θ does not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Furthermore, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, a transistor including an oxide semiconductor film having a high impurity concentration and a high density of defect states has unstable electrical characteristics in some cases.

In a transistor using the CAAC-OS film, a change in electrical characteristics due to irradiation with visible light or ultraviolet light is small.

<Microcrystalline Oxide Semiconductor>

In an image obtained with TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has higher regularity than an amorphous oxide semiconductor film Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

<Oxide Semiconductor Film and Oxide Conductor Film>

Next, the resistivities of an oxide semiconductor film and a film having conductivity will be described. Note that here, the film having conductivity is called an oxide conductor film, for convenience.

Figure 31:
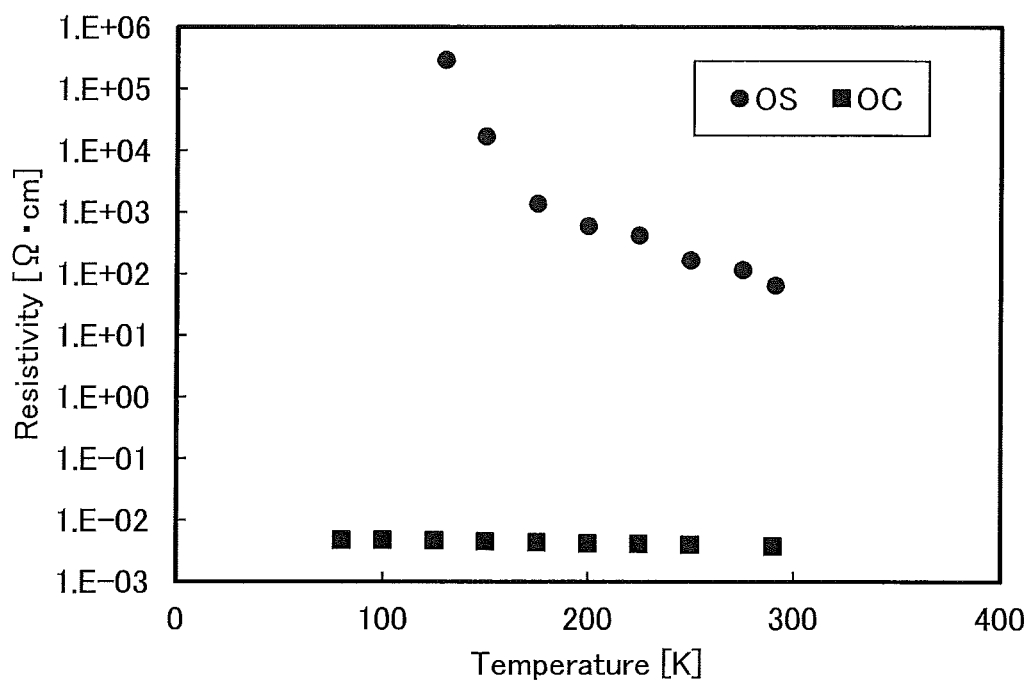
FIG. 31 is a graph showing temperature dependence of resistivity.

Here, the temperature dependence of the resistivities of a film formed using an oxide semiconductor (hereinafter referred to as an oxide semiconductor film (OS)) like the oxide semiconductor film 19a in FIG. 2 used in the transistor and a film formed using an oxide conductor (hereinafter referred to as an oxide conductor film (OC)) like the film 19b having conductivity in FIG. 2 used as the electrode of the capacitor will be described with reference to FIG. 31. In FIG. 31, the horizontal axis represents measurement temperature, and the vertical axis represents resistivity. Measurement results of the oxide semiconductor film (OS) are plotted as circles, and measurement results of the oxide conductor film (OC) are plotted as squares.

Note that a sample including the oxide semiconductor film (OS) is prepared by forming a 35-nm-thick IGZO film over a glass substrate by a sputtering method using a sputtering target with an atomic ratio of In:Ga:Zn=1:1:1.2, forming a 20-nm-thick IGZO film over the 35-nm-thick In—Ga—Zn oxide film by a sputtering method using a sputtering target with an atomic ratio of In:Ga:Zn=1:4:5, performing heat treatment at 450° C. in a nitrogen atmosphere and then performing heat treatment at 450° C. in an atmosphere of a mixed gas of nitrogen and oxygen, and forming a silicon oxynitride film over the oxide films by a plasma CVD method.

A sample including the oxide conductor film (OC) is prepared by forming a 100-nm-thick IGZO film over a glass substrate by a sputtering method using a sputtering target with an atomic ratio of In:Ga:Zn=1:1:1, performing heat treatment at 450° C. in a nitrogen atmosphere and then performing heat treatment at 450° C. in an atmosphere of a mixed gas of nitrogen and oxygen, and forming a silicon nitride film over the oxide film by a plasma CVD method.

As can be seen from FIG. 31, the temperature dependence of the resistivity of the oxide conductor film (OC) is lower than the temperature dependence of the resistivity of the oxide semiconductor film (OS). Typically, variation of the resistivity of the oxide conductor film (OC) at temperatures from 80 K to 290 K is more than −20% and less than +20%. Alternatively, variation of the resistivity at temperatures from 150 K to 250 K is more than −10% and less than +10%. In other words, the oxide conductor is a degenerate semiconductor and it is suggested that the conduction band edge agrees with or substantially agrees with the Fermi level. Thus, the oxide conductor film can be used for a resistive element, a wiring, an electrode of a capacitor, a pixel electrode, or a common electrode, for example.

Note that the structures, methods, and the like described in this embodiment can be used as appropriate in combination with any of the structures, methods, the modification examples, and the like described in the other embodiments.

Embodiment 4

In this embodiment, structural examples of electronic appliances each including the semiconductor device of one embodiment of the present invention will be described. In this embodiment, a display module that can be formed using the semiconductor device of one embodiment of the present invention will be described with reference to FIG. 28.

Figure 28:
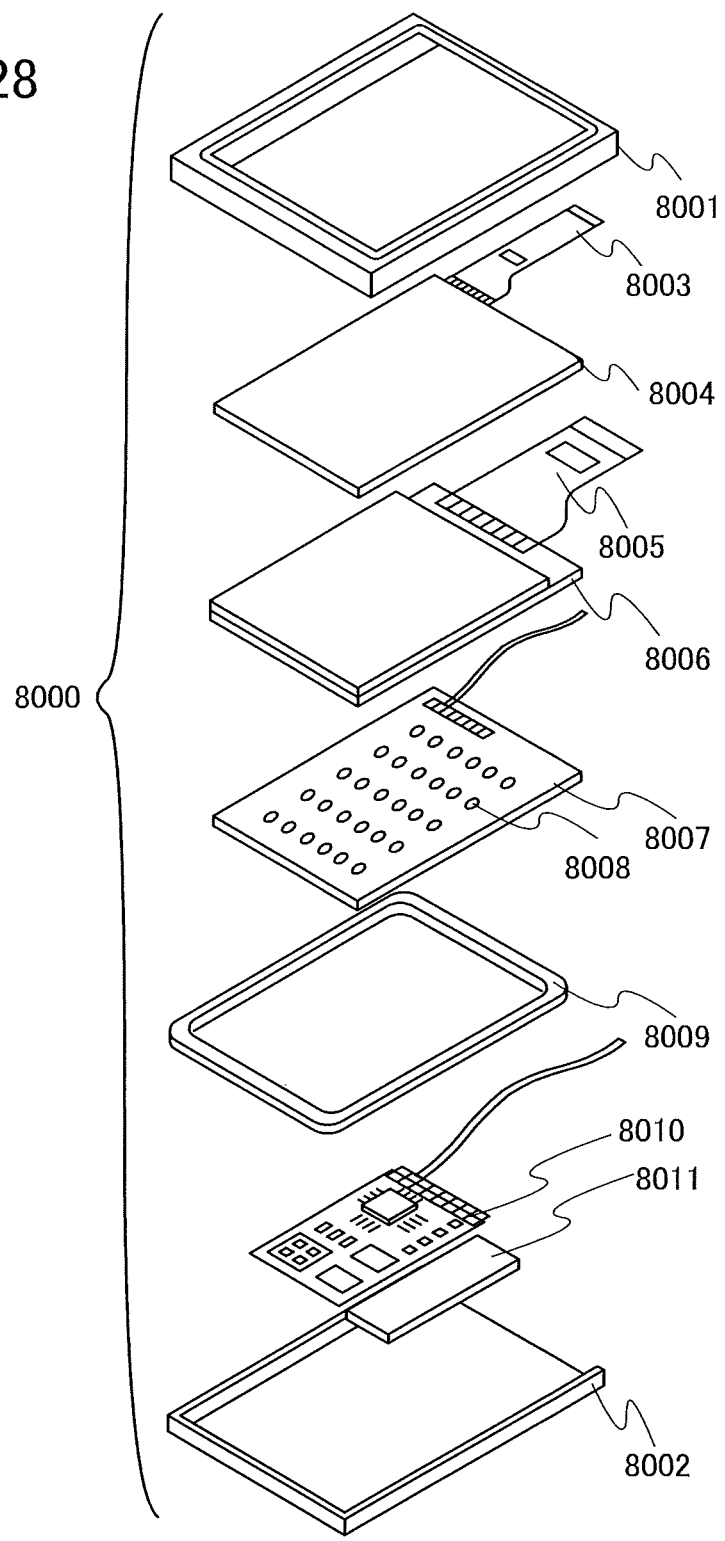
FIG. 28 illustrates a display module.

In a display module 8000 in FIG. 28, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that the touch panel 8004 can function as an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

FIGS. 27A to 27D are external views of electronic devices each including the semiconductor device of one embodiment of the present invention.

Examples of electronic appliances include a television set (also referred to as a television or a television receiver), a monitor of a computer or the like, cameras such as a digital camera and a digital video camera, a digital photo frame, a mobile phone handset (also referred to as a mobile phone or a mobile phone device), a portable game machine, a portable information terminal, an audio reproducing device, and a large-sized game machine such as a pachinko machine.

Figure 27A:
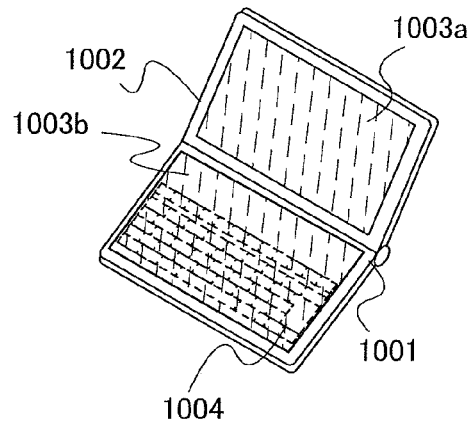
FIGS. 27A to 27D are each an external view of an electronic device of one embodiment.

FIG. 27A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is fabricated using any of the transistors described in the above embodiments as a switching element and used in the display portion 1003a or 1003b, whereby the portable information terminal can have high reliability.

The portable information terminal illustrated in FIG. 27A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 27A may transmit and receive data wirelessly. Through wireless communication, desired book data or the like can be purchased and downloaded from an e-book server.

Figure 27B:
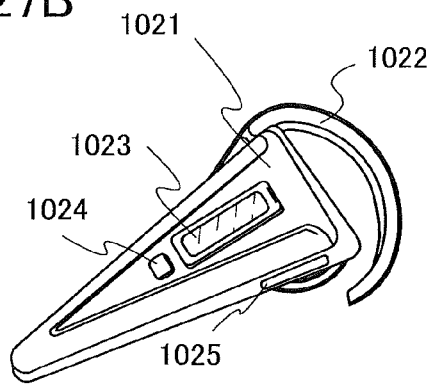

FIG. 27B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby the portable music player can have high reliability.

Furthermore, when the portable music player illustrated in FIG. 27B has an antenna, a microphone function, or a wireless communication function and is used with a mobile phone, a user can talk on the phone wirelessly in a hands-free way while driving a car or the like.

Figure 27C:
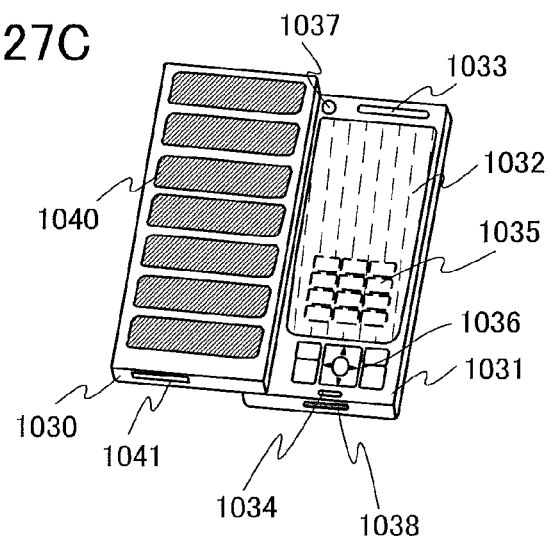

FIG. 27C illustrates a mobile phone including two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 includes a solar cell 1040 for charging of the mobile phone, an external memory slot 1041, and the like. In addition, an antenna is incorporated in the housing 1031. Any of the transistors described in the above embodiments is used in the display panel 1032, whereby the mobile phone can have high reliability.

Furthermore, the display panel 1032 is provided with a touch panel. A plurality of operation keys 1035 that are displayed as images are indicated by dotted lines in FIG. 27C. Note that a boosting circuit for boosting a voltage output from the solar cell 1040 so that it becomes sufficiently high for each circuit is also included.

In the display panel 1032, the direction of display is changed as appropriate depending on the application mode. Furthermore, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 27C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore, by inserting a recording medium into the external memory slot 1041, a larger amount of data can be stored and moved.

In addition to the above functions, an infrared communication function, a television reception function, or the like may be provided.

Figure 27D:
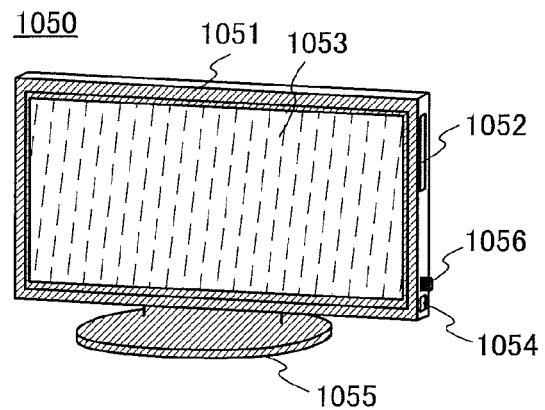

FIG. 27D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. The remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

The television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state current of the transistor described in the above embodiment is extremely small, the use of the transistor in the external memory 1056 or the CPU allows the television set 1050 to have high reliability and sufficiently reduced power consumption.

This embodiment can be implemented in combination with any of the other embodiments disclosed in this specification, as appropriate.

Example 1

In this example, results obtained by measuring the resistivities of a metal film and a metal oxide film formed by introducing oxygen into the metal film will be described.
<Sample A1>

A method for forming Sample A1 will be described. First, a metal film was formed over a glass substrate. Here, a 5-nm-thick aluminum film was formed as the metal film by a sputtering method.

Then, oxygen was introduced into the metal film to form a metal oxide film. Here, the metal film fainted of an aluminum film was exposed to oxygen plasma generated in a plasma treatment apparatus so that the metal film was oxidized to font an aluminum oxide film as the metal oxide film.

After that, a pair of electrodes was formed over the metal oxide film. Here, a 100-nm-thick aluminum films were formed as the pair of electrodes by a sputtering method using a metal mask. Note that the distance between the pair of electrodes is 1000 μm, and the length of one of the pair of electrodes that faces the other is 70900 μm.

Through the above process, Samples A1 was formed.
<Sample A2>

As a comparative example, Sample A2 was formed in such a manner that a metal oxide film was not formed unlike in Sample A1 and a pair of electrodes was formed over a metal film.

Next, Table 1 shows the conductivities, the resistivities, and the resistances of Samples A1 and A2.

TABLE 1

|  | O* process | Conductivity (S/cm) | Resistivity (Ω · cm) | Resistance (Ω) |
| --- | --- | --- | --- | --- |
| Sample A1 | Yes | 3.25E−10 | 3.07E+09 | 8.67E+13 |
| Sample A2 | No | 2.73E+02 | 3.66E−03 | 1.03E+02 |

The results in Table 1 suggest that introducing oxygen into a metal film makes it possible to form a metal oxide film having an excellent insulating property.

Example 2

In this example, the relation between the existence of a metal oxide film and transmittance in a capacitor will be described with reference to FIG. 18.
<Sample B1>

A method for forming Sample B1 will be described. First, an oxide semiconductor film was formed over a glass substrate. Here, a 35-nm-thick IGZO film was formed by a sputtering method in which an In—Ga—Zn oxide with an atomic ratio of In:Ga:Zn=1:1:1 was used as a sputtering target and oxygen was used as a sputtering gas.

Then, a metal film was formed over the oxide semiconductor film Here, a 5-nm-thick aluminum film was formed as the metal film by a sputtering method.

Then, oxygen is introduced into the metal film to form a metal oxide film. Here, the metal film formed of an aluminum film was exposed to oxygen plasma generated in a plasma treatment apparatus so that the metal film was oxidized to form an aluminum oxide film as the metal oxide film.

After that, a nitride insulating film was formed over the metal oxide film. Here, a 100-nm-thick silicon nitride film was formed as the nitride insulating film by a plasma CVD method.

Then, a light-transmitting conductive film was formed over the nitride insulating film. Here, a 100-nm-thick conductive film of an indium oxide-tin oxide compound (ITO-SiO$_2$) was formed as the light-transmitting conductive film by a sputtering method.

Through the above process, Sample B1 was formed.
<Sample B2>

A method for forming Sample B2 will be described. Sample B2 was formed in such a manner that oxygen was not introduced into a metal film after formation of the metal film unlike in Sample B1; and a nitride insulating film and a light-transmitting conductive film were stacked over the metal film. Note that an aluminum film formed as the metal film has an extremely small thickness of 5 nm in Sample B2; accordingly, the aluminum film has a light-transmitting property.

Next, the transmittances of Samples B1 and B2 were measured using a spectrophotometer. FIG. 18 shows the transmittances of Samples B1 and B2.

Figure 18:
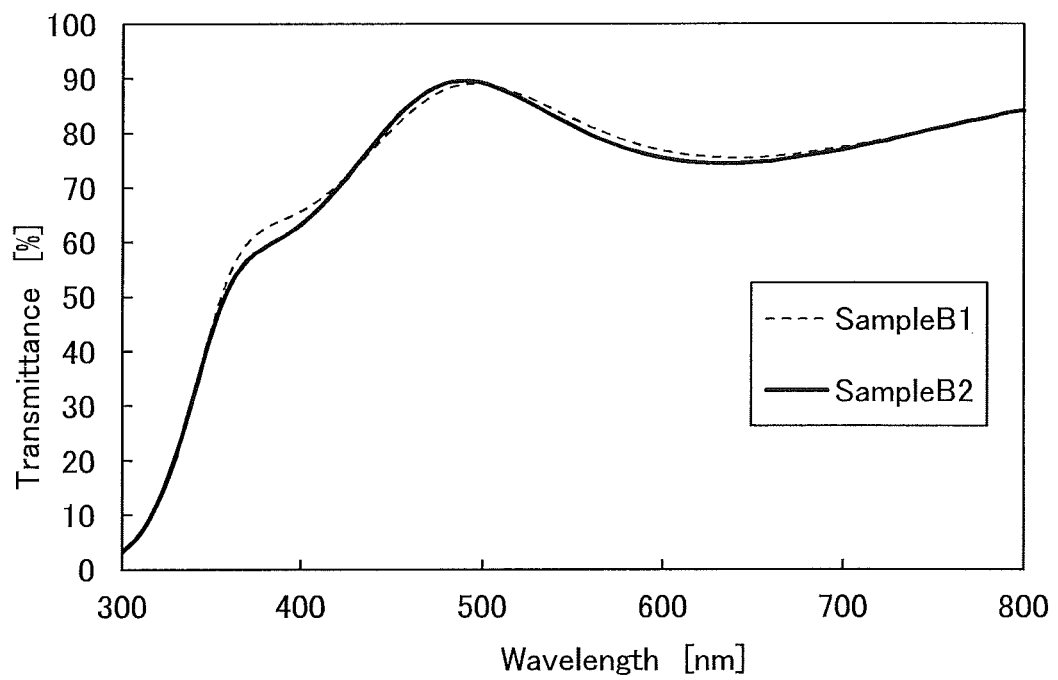
FIG. 18 is a graph showing the transmittances of samples.

In FIG. 18, the solid line represents the transmittance of Sample B1, and the broken line represents the transmittance of Sample B2. FIG. 18 shows that the transmittance of Sample B1 is almost equal to that of Sample B2, which implies that a metal oxide film formed by introducing oxygen into a metal film has a light-transmitting property. Thus, even when the metal oxide film is provided in a capacitor, the transmittance of the capacitor can be maintained.

Example 3

In this example, the resistances of oxide semiconductor films will be described with reference to FIGS. 19A and 19B and FIGS. 20A to 20E. In this example, the resistances of the oxide semiconductor films in each of processes for forming a transistor and a capacitor were measured.

Figure 19A:
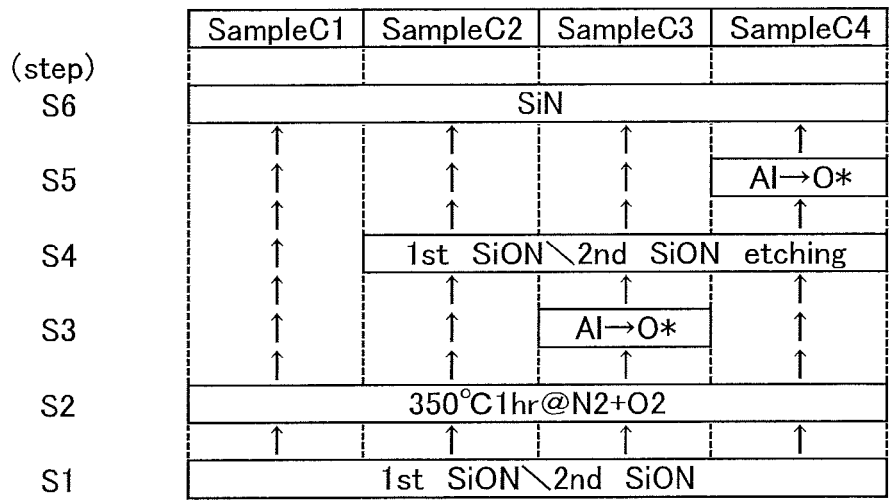
FIGS. 19A and 19B show the sheet resistances of samples.
Figure 19B:
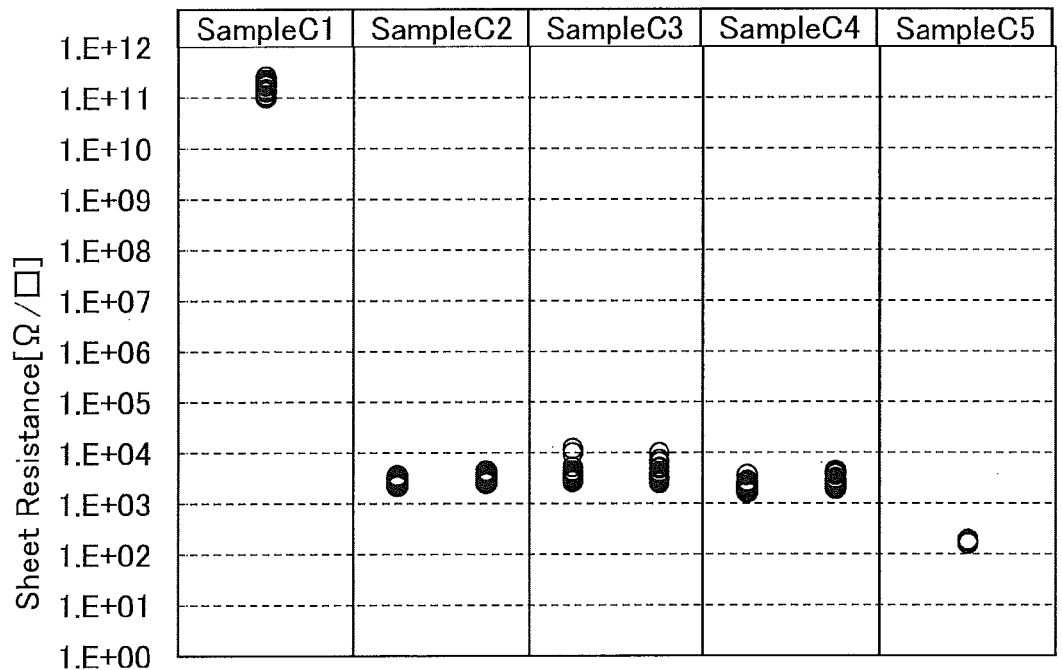
Figure 20A:
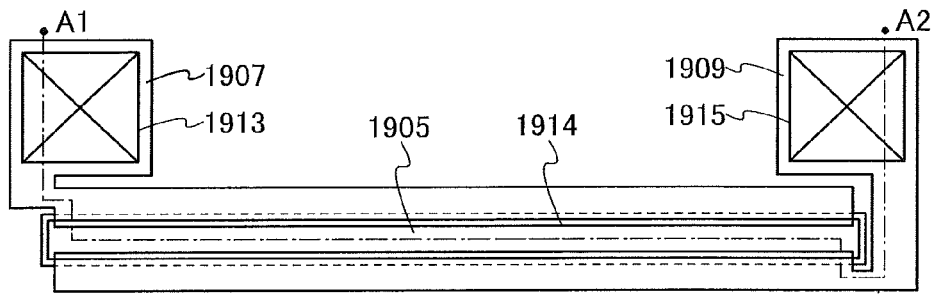
FIGS. 20A to 20E each illustrate a structure of a sample.

Method for forming samples each including an oxide semiconductor film and the structures of the samples will be described with reference to FIGS. 19A and 19B and FIGS. 20A to 20E. FIG. 19A shows parts of processes for forming the samples, and FIG. 19B shows the sheet resistances of the samples. FIG. 20A is a top view of each sample, and FIGS. 20B to 20E are cross-sectional views along dashed-dotted line A1-A2 in FIG. 20A each of which corresponds to a certain sample. In this example, Sample C1, Sample C2, Sample C5, which are comparative samples, and Sample C3 and Sample C4 each including an oxide semiconductor film that can be used in the capacitor of one embodiment of the present invention were formed.

<Sample C1>

A method for forming Sample C1 will be described below.

A gate electrode (not illustrated) was formed over a part of a glass substrate 1901 over which a transistor was to be formed. Here, a 100-nm-thick tungsten film was formed as the gate electrode.

Then, a 400-nm-thick silicon nitride film was formed as an insulating film 1903 over the glass substrate 1901 and the gate electrode by a plasma CVD method.

Then, a 50-nm-thick silicon oxynitride film was formed as an insulating film 1904 over the insulating film 1903 by a plasma CVD method.

Then, a 35-nm-thick IGZO film was formed over the insulating film 1904 by a sputtering method using an In—Ga—Zn oxide with an atomic ratio of In:Ga:Zn=1:1:1 as a sputtering target. After that, etching treatment was performed on the IGZO film using a mask formed through a photolithography process, so that an oxide semiconductor film 1905 was formed.

Then, heat treatment at 450° C. in a nitrogen atmosphere for one hour and heat treatment at 450° C. in a mixed gas atmosphere of nitrogen and oxygen (the proportion of the nitrogen is 80%, and the proportion of the oxygen is 20%) for one hour were successively performed.

Then, conductive films 1907 and 1909 were formed over the insulating film 1903 and the oxide semiconductor film 1905 in such a manner that a 50-nm-thick tungsten film, a 400-nm-thick aluminum film, and a 100-nm-thick titanium film were stacked in this order by a sputtering method and then subjected to etching treatment using a mask formed through a photolithography process.

Then, an insulating film to be an insulating film 1910 was formed over the insulating film 1904, the oxide semiconductor film 1905, and the conductive films 1907 and 1909. As the insulating film, a 50-nm-thick silicon oxynitride film (first SiON) and a 400-nm-thick silicon oxynitride film (second SiON) were formed by a plasma CVD method (Step S1 in FIG. 19A).

Then, heat treatment was performed at 350° C. in a mixed gas atmosphere of nitrogen and oxygen for one hour (Step S2 in FIG. 19A).

Then, an insulating film to be an insulating film 1911 later was formed over the insulating film to be the insulating film 1910 later. As the insulating film, a 50-nm-thick silicon nitride film was formed by a plasma CVD method (Step S6 in FIG. 19A).

Then, a mask was formed over the insulating film to be the insulating film 1910 later through a photolithography process and then etching treatment was performed, so that the insulating films 1910 and 1911 having openings 1913 and 1915 were formed.

Figure 20B:
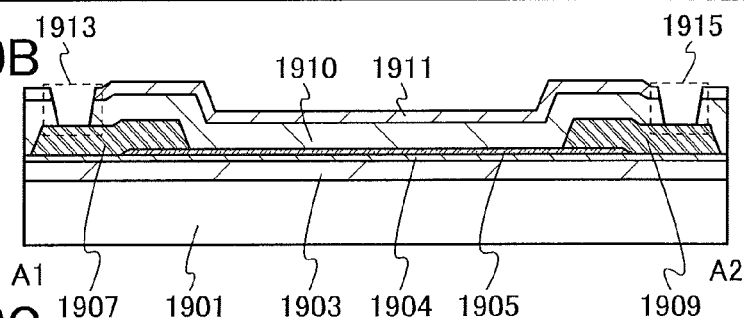

Through the above process, Sample C1 was formed. FIG. 20B is a cross-sectional view of Sample C1. In Sample C1, the oxide semiconductor film 1905 is in contact with the silicon oxynitride film formed as the insulating film 1910.

<Sample C2>

A method for forming Sample C2 will be described. After Step S2 of Sample C1, a mask was formed over an insulating film to be the insulating film 1910 later through a photolithography process and then etching treatment was performed, so that an opening 1914 was formed (Step S4 in FIG. 19A).

Then, an insulating film to be the insulating film 1911 later was formed. As the insulating film, a 50-nm-thick silicon nitride film was formed by a plasma CVD method (Step S6 in FIG. 19A).

Then, a mask was formed over the insulating film to be the insulating film 1910 later through a photolithography process and then etching treatment was performed, so that the insulating films 1910 and 1911 having the openings 1913 and 1915 were formed.

Figure 20C:
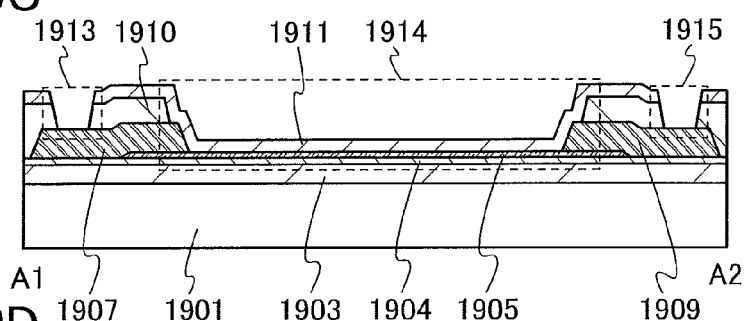

Through the above process, Sample C2 was formed. FIG. 20C is a cross-sectional view of Sample C2. In Sample C2, the oxide semiconductor film 1905 is in contact with the silicon nitride film formed as the insulating film 1911.

<Sample C3>

A method for forming Sample C3 will be described. After Step S2 of Sample C1, a metal film was formed over an insulating film to be the insulating film 1910 later and then oxygen is introduced into the metal film, so that a metal oxide film was formed (Step 3 in FIG. 19A).

Here, a 5-nm-thick aluminum film was formed as the metal film by a sputtering method. Then, the aluminum film was exposed to oxygen plasma to introduce oxygen into the aluminum film, whereby an aluminum oxide film was formed as the metal oxide film.

Then, a mask was formed over the metal oxide film through a photolithography process and then etching treatment was performed to form the opening 1914 (Step S4 in FIG. 19A).

Then, an insulating film to be the insulating film 1911 later was formed. As the insulating film, a 50-nm-thick silicon nitride film was formed by a plasma CVD method (Step S6 in FIG. 19A).

Then, a mask was formed over the insulating film to be the insulating film 1911 through a photolithography process and then etching treatment was performed, so that the insulating films 1910 and 1911 and the metal oxide film 1912 that had the openings 1913 and 1915 were formed.

Figure 20D:
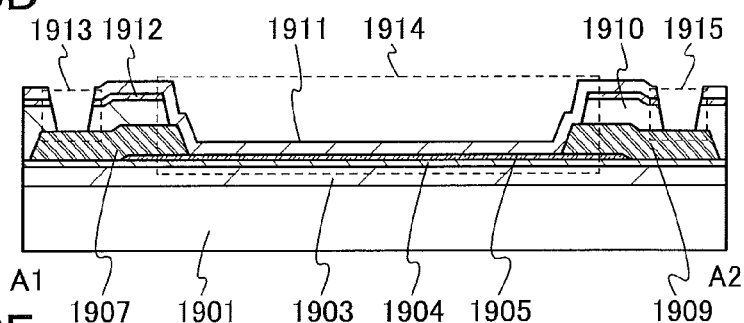

Through the above process, Sample C3 was formed. FIG. 20D is a cross-sectional view of Sample C3. In Sample C3, the oxide semiconductor film 1905 is in contact with the silicon nitride film formed as the insulating film 1911.

<Sample C4>

A method for forming Sample C4 will be described. After Step S2 of Sample C1, a mask was formed over an insulating film to be the insulating film 1910 later through a photolithography process and then etching treatment was performed, so that the opening 1914 was formed (Step S4 in FIG. 19A).

Then, a metal film was formed over the oxide semiconductor film 1905, the conductive films 1907 and 1909, and the insulating film having the opening 1914, and then oxygen is introduced into the metal film to form a metal oxide film (Step S5 in FIG. 19A).

Here, a 5-nm-thick aluminum film was formed as the metal film by a sputtering method. Then, the aluminum film was exposed to oxygen plasma to introduce oxygen into the aluminum film, whereby an aluminum oxide film was formed as the metal oxide film.

Then, an insulating film to be the insulating film 1911 later was formed. As the insulating film, a 50-nm-thick silicon nitride film was formed by a plasma CVD method (Step S6 in FIG. 19A).

Then, a mask was formed over the insulating film to be the insulating film 1911 through a photolithography process and then etching treatment was performed, so that the insulating films 1910 and 1911 and the metal oxide film 1912 that had the openings 1913 and 1915 were formed.

Figure 20E:
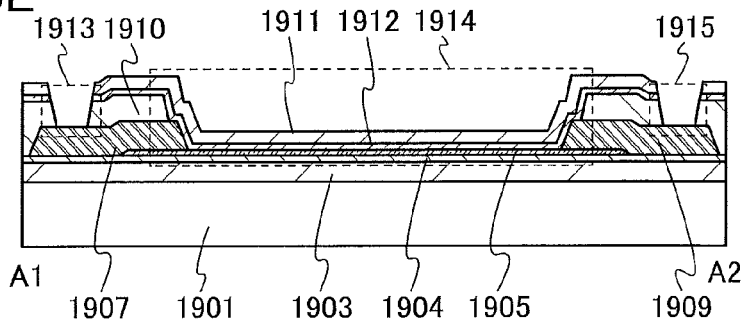

Through the above process, Sample C4 was formed. FIG. 20E is a cross-sectional view of Sample C4. In Sample C4, the oxide semiconductor film 1905 is in contact with the aluminum oxide film formed as the metal oxide film 1912.

<Sample C5>

A method for forming Sample C5 will be described. A 100-nm-thick conductive film of an indium oxide-tin oxide compound (ITO-SiO$_2$) was formed over a glass substrate by a sputtering method. Note that the composition of a sputtering target used for forming the conductive film was Ln$_2$O$_3$:SnO$_2$:SiO$_2$=85:10:5 [wt %]. After that, heat treatment was performed at 250° C. in a nitrogen atmosphere for one hour.

Then, over the conductive film of the indium oxide-tin oxide compound (ITO-SiO$_2$), the conductive films 1907 and 1909 were formed as in Samples C1 to C4.

Through the above process, Sample C5 was formed.

Note that in Samples C1 to C5, the distance between the conductive films 1907 and 1909 is 10 μm, and the length of the conductive film 1907 that faces and the conductive film 1909 over the oxide semiconductor film 1905 is 1 mm. In each sample, there are 20 transistors.

Next, the sheet resistances of the oxide semiconductor films included in Samples C1 to C4 and the conductive film of an indium oxide-tin oxide compound (ITO-SiO$_2$) included in Sample C5 were measured. Here, in each of Samples C1 to C5, the conductive film 1907 was at a ground potential, and 1 V was applied to the conductive film 1909.

FIG. 19B shows measurement results. The sheet resistances of the oxide semiconductor films included in Samples C2 to C4 were lower than that of the oxide semiconductor film included in Sample C1. The measurement results imply that an oxide semiconductor film is damaged by exposure to plasma at the time of etching a film formed over the oxide semiconductor film, so that the sheet resistance of the oxide semiconductor film becomes low. Samples C3 and C4 have the sheet resistances equal to that of Sample C2; thus, it is suggested that even when an aluminum oxide film is provided between an oxide semiconductor film and a silicon nitride film, hydrogen contained in the silicon nitride film transfers to the oxide semiconductor film and the sheet resistance of the oxide semiconductor film is reduced.

The sheet resistances of the oxide semiconductor films included in Samples C2 to C4 are higher than that of the conductive film of the indium oxide-tin oxide compound (ITO-SiO$_2$) included in Sample C5 by just one digit. Therefore, the oxide semiconductor films in Samples C2 to C4 can each be used as an electrode like the conductive film of the indium oxide-tin oxide compound (ITO-SiO$_2$).

<Temperature Dependence>

Figure 21:
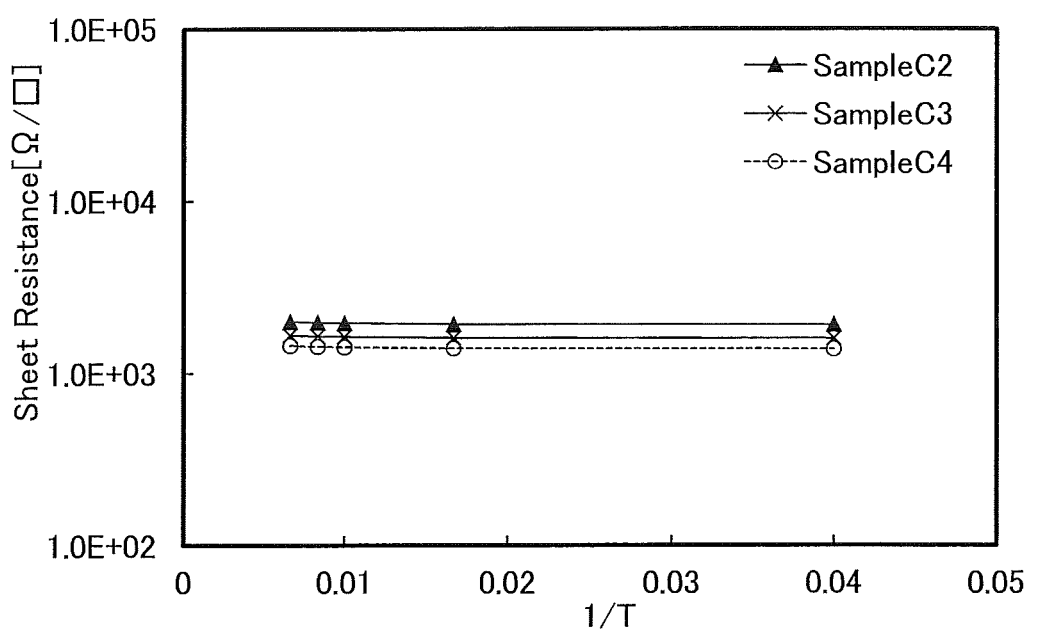
FIG. 21 is a graph showing the sheet resistances of samples.

Next, the temperature dependence of the sheet resistances in Samples C2 to C4 were measured at each of the substrate temperatures: 25° C., 60° C., 100° C., 120° C., and 150° C. FIG. 21 shows measurement results. In FIG. 21, the horizontal axis represents 1/T (measurement temperature), and the vertical axis represents sheet resistance. In addition, in FIG. 21, triangles indicate the measurement result of Sample C2, crosses indicate the measurement result of Sample C3, and circles indicate the measurement result of Sample C4.

FIG. 21 shows that the sheet resistances of the oxide semiconductor films were almost not changed even when the measurement temperature was raised. That is to say, the oxide semiconductor films included in Samples C2 to C4 are degenerated semiconductors. Since the sheet resistances of the oxide semiconductor films included in Samples C2 to C4 changed little even when a temperature is changed, the oxide semiconductor films can each be used for an electrode of a capacitor.

<Preservation Test Under High Temperature and High Humidity Condition>

Figure 22:
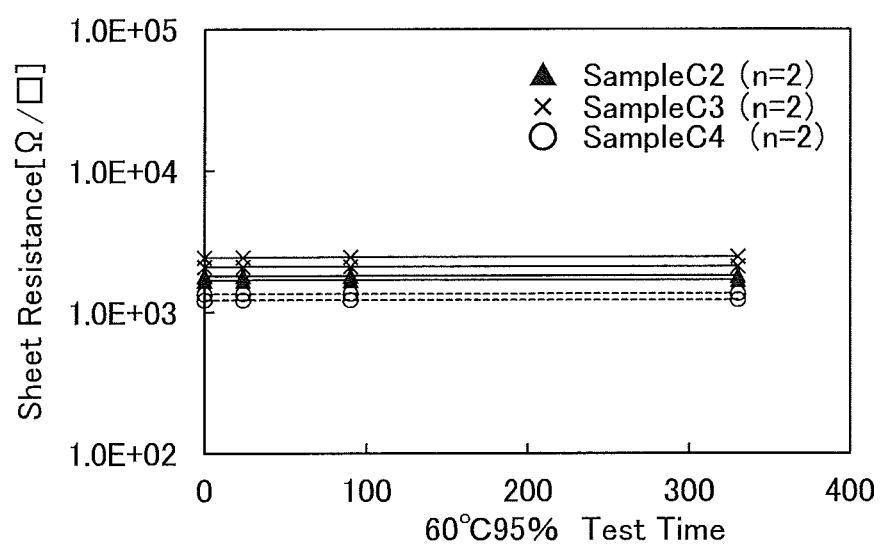
FIG. 22 is a graph showing the sheet resistances of samples.

Next, changes in the sheet resistances of Samples C2 to C4 preserved under the high temperature and high humidity condition were measured. Here, the sheet resistances of Samples C2 to C4 were measured after Samples C2 to C4 were preserved at 60° C. in an atmosphere with a humidity of 95% for 330 hours. FIG. 22 shows the measurement results. In FIG. 22, the horizontal axis represents test time, and the vertical axis represents sheet resistance. In addition, in FIG. 22, triangles indicate the measurement result of Sample C2, crosses indicate the measurement result of Sample C3, and circles indicate the measurement result of Sample C4.

FIG. 22 shows that the sheet resistances in Samples C2 to C4 were low. FIG. 22 also shows that variations of the sheet resistances in Samples C2 to C4 over time were small. Since variations of the sheet resistances of the oxide semiconductor films included in Samples C2 to C4 were small in the high temperature and high humidity condition, the oxide semiconductor films can each be used for an electrode of a capacitor.

Example 4

In this example, steps where a metal film was formed over an oxide semiconductor film and oxygen was introduced into the metal film to form a metal oxide film and evaluation results of the hydrogen concentration in an oxide semiconductor film in each step will be described.

<Sample D1>

Figure 23A:
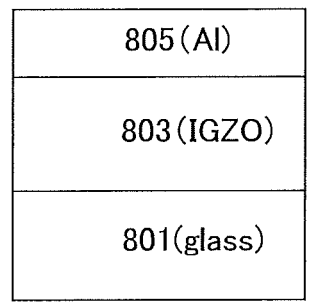
FIGS. 23A to 23D each illustrate a structure of a sample.

A method for forming Sample D1 will be described. Sample D1 was formed in such a manner that an oxide semiconductor film 803 was formed over a glass substrate 801 and a metal film 805 was formed over the oxide semiconductor film 803, as illustrated in FIG. 23A.

Here, a 100-nm-thick IGZO film was formed as the oxide semiconductor film 803 by a sputtering method using an In—Ga—Zn oxide with an atomic ratio of In:Ga:Zn=1:1:1 as a sputtering target.

As the metal film 805, a 5-nm-thick aluminum film was formed by a sputtering method.

<Sample D2>

Figure 23B:
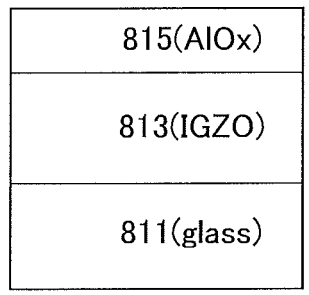

A method for forming Sample D2 will be described. Sample D2 was formed in such a manner that an oxide semiconductor film 813 was formed over a glass substrate 811, a metal film was formed over the oxide semiconductor film 813, and then oxygen was introduced into the metal film to form a metal oxide film 815, as illustrated in FIG. 23B.

Here, the oxide semiconductor film 813 was formed of a 100-nm-thick IGZO film like the oxide semiconductor film 803 included in Sample D1. In addition, the metal film formed of an aluminum film was exposed to oxygen plasma generated in a plasma treatment apparatus, so that an aluminum oxide film was formed as the metal oxide film 815.

<Sample D3>

Figure 23C:
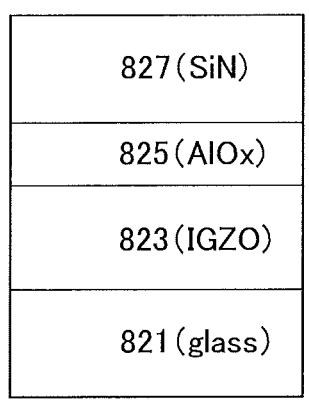

A method for forming Sample D3 will be described. Sample D3 was formed in such a manner that an oxide semiconductor film 823 was formed over a glass substrate 821, a metal oxide film 825 was formed over the oxide semiconductor film 823, and a nitride insulating film 827 was formed over the metal oxide film 825, as illustrated in FIG. 23C.

Here, the oxide semiconductor film 823 was formed of a 100-nm-thick IGZO film like the oxide semiconductor film 803 included in Sample D1. As the metal oxide film 825, an aluminum oxide film was formed by forming a metal film and then introducing oxygen into the metal film, like the metal oxide film 815 included in Sample D2. As the nitride insulating film 827, a 100-nm-thick silicon nitride film was formed by a plasma CVD method <Sample D4>

Figure 23D:
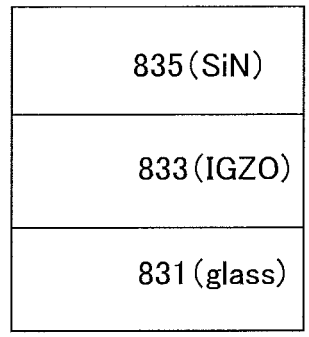

A method for forming Sample D4 will be described. Sample D4 is formed in such a manner that an oxide semiconductor film 833 was formed over a glass substrate 831 and a nitride insulating film 835 was formed over the oxide semiconductor film 833 as illustrated in FIG. 23D.

Here, the oxide semiconductor film 833 was formed of a 100-nm-thick IGZO film like the oxide semiconductor film 803 included in Sample D1. As the nitride insulating film 835, a 100-nm-thick silicon nitride film was formed like the nitride insulating film 827 included in Sample D3.

<SIMS Analysis>

Figure 24A:
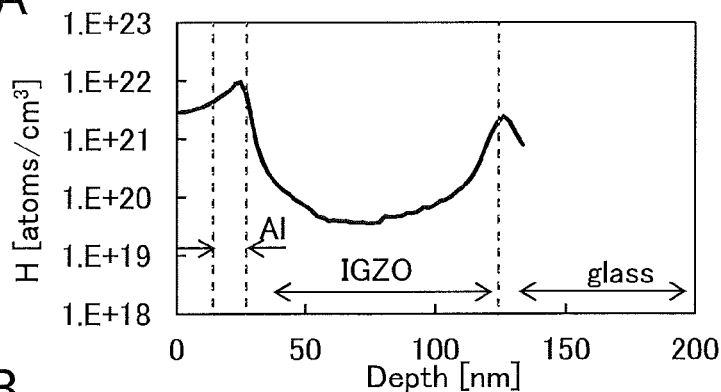
FIGS. 24A to 24D are graphs each showing the concentration of hydrogen in an oxide semiconductor film.

Samples D1 to D4 were subjected to SIMS analysis. The hydrogen concentration in the oxide semiconductor film in each sample was measured from the substrate side. FIG. 24A shows the measurement result of Sample D1, FIG. 24B shows measurement result of Sample D2, FIG. 24C shows the measurement result of Sample D3, and FIG. 24D shows the measurement result of Sample D4.

In FIGS. 24A to 24D, the horizontal axis represents distance in the depth direction, and the vertical axis represents hydrogen concentration. In addition, in FIGS. 24A to 24D, a glass substrate is denoted by glass, an oxide semiconductor film is denoted by IGZO, a metal film is denoted by Al, a metal oxide film is denoted by $AlO_x$, and a nitride insulating film is denoted by SiN.

Figure 24B:
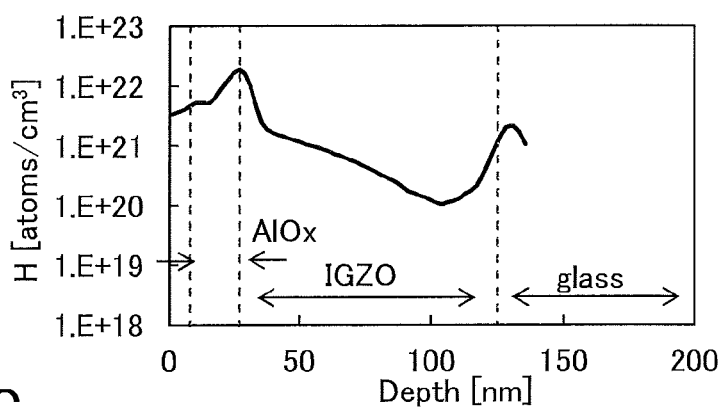

FIGS. 24A and 24B show that the hydrogen concentration in the oxide semiconductor film in Sample D2 is higher than that in the oxide semiconductor film in Sample D1. This is presumably because hydrogen contained in a plasma treatment apparatus was introduced into the oxide semiconductor film as well as oxygen when oxygen was introduced into the metal film.

Figure 24C:
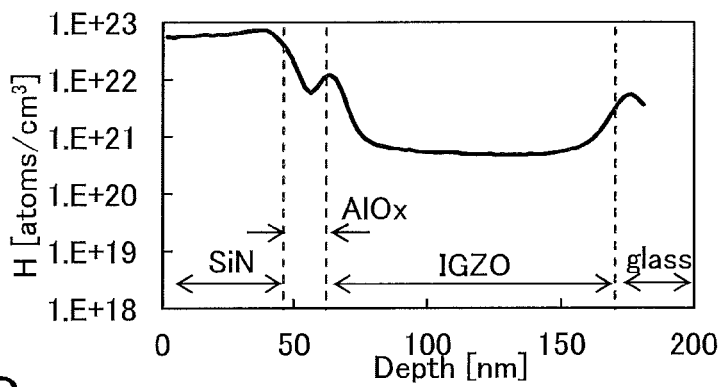
Figure 24D:
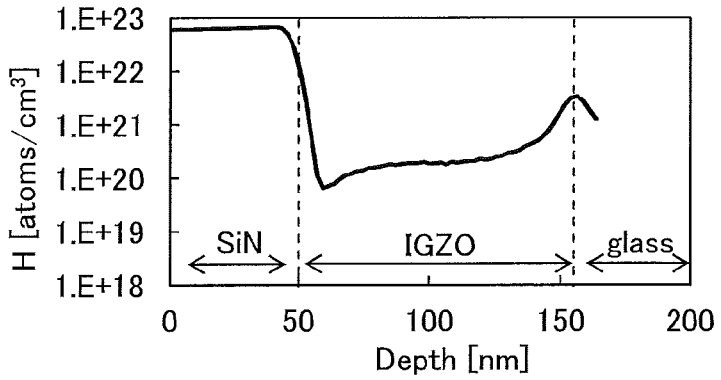

FIGS. 24B and 24C show that the hydrogen concentration in the oxide semiconductor film in Sample D3 is higher than that in the oxide semiconductor film in Sample D2. This result suggests that hydrogen contained in the nitride insulating film transferred to the oxide semiconductor film through the metal oxide film.

FIGS. 24C and 24D show that the hydrogen concentration in the oxide semiconductor film in Sample D3 is higher than that in the oxide semiconductor film in Sample D4. This is presumably because hydrogen contained in a plasma treatment apparatus was introduced into the oxide semiconductor film as well as oxygen when oxygen was introduced into the metal film.

The above results imply that hydrogen is introduced into an oxide semiconductor film as well as oxygen when oxygen is introduced into a metal film formed over the oxide semiconductor film. The above results also imply that even when a metal oxide film is formed between the oxide semiconductor film and a nitride insulating film, hydrogen contained in the nitride insulating film transfers to the oxide semiconductor film.

Example 5

In this example, examination results of the $V_g$-$I_d$ characteristics and the reliabilities of fabricated transistors will be described.

<Sample E1>

A transistor corresponding to the transistor 102a in FIG. 16 described in Embodiment 1 was formed in Sample E1. A method for forming Sample E1 will be described.

First, a glass substrate was used as the substrate 11, and the conductive film 13 serving as a gate electrode was formed over the substrate 11.

The conductive film 13 was formed in such a manner that a 200-nm-thick tungsten film was formed by a sputtering method, a mask was formed over the tungsten film through a photolithography process, and the tungsten film was partly etched using the mask.

Then, the nitride insulating film 15 was formed over the conductive film 13 serving as a gate electrode, and the oxide insulating film 17 was formed over the nitride insulating film 15.

A 400-nm-thick silicon nitride film was formed as the nitride insulating film 15, and a 50-nm-thick silicon oxynitride film was formed as the oxide insulating film 17.

Note that the silicon nitride film was formed to have a three-layer structure of a first silicon nitride film, a second silicon nitride film, and a third silicon nitride film.

The first silicon nitride film was formed to have a thickness of 50 nm under the following conditions: silane with a flow rate of 200 sccm, nitrogen with a flow rate of 2000 sccm, and an ammonia gas with a flow rate of 100 sccm were supplied to a treatment chamber of a plasma CVD apparatus as a source gas; the pressure in the treatment chamber was controlled to be 100 Pa, and a power of 2000 W was supplied with the use of a 27.12 MHz high-frequency power source.

The second silicon nitride film was formed to have a thickness of 300 nm under the following conditions: silane with a flow rate of 200 sccm, nitrogen with a flow rate of 2000 sccm, and an ammonia gas with a flow rate of 2000 sccm were supplied to a treatment chamber of a plasma CVD apparatus as a source gas; the pressure in the treatment chamber was controlled to be 100 Pa; and a power of 2000 W was supplied with the use of a 27.12 MHz high-frequency power source.

Next, the third silicon nitride film was formed to have a thickness of 50 nm under the following conditions: silane with a flow rate of 200 sccm and nitrogen with a flow rate of 5000 sccm were supplied to a treatment chamber of a plasma CVD apparatus as a source gas; the pressure in the treatment chamber was controlled to be 100 Pa; and a power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane with a flow rate of 20 sccm and dinitrogen monoxide with a flow rate of 3000 sccm were supplied to a treatment chamber of a plasma CVD apparatus as a source gas; the pressure in the treatment chamber was controlled to be 40 Pa; and a power of 100 W was supplied with the use of a 27.12 MHz high-frequency power source. Note that the silicon oxynitride film was formed at a substrate temperature of 350° C.

Then, the oxide semiconductor film 19*a* was formed so as to overlap with the conductive film 13 serving as a gate electrode with the nitride insulating film 15 and the oxide insulating film 17 interposed therebetween.

Here, after a 35-nm-thick oxide semiconductor film was formed over the oxide insulating film 17 by a sputtering method, a mask was formed over the oxide semiconductor film through a photolithography process and part of the oxide semiconductor film was etched with the use of the mask, whereby the oxide semiconductor film 19*a* was formed.

The oxide semiconductor film 19*a* was formed under the following conditions: an In—Ga—Zn oxide with an atomic ratio of In:Ga:Zn=1:1:1 was used as a sputtering target; 50% oxygen was supplied as a sputtering gas to a treatment chamber of a sputtering apparatus; the pressure in the treatment chamber was controlled to be 0.6 Pa; and a DC power of 2.5 kW was supplied. Note that the oxide semiconductor film was formed at a substrate temperature of 170° C.

Then, heat treatment was performed. Here, after heat treatment was performed at 480° C. in a nitrogen atmosphere for one hour, another heat treatment was performed at 480° C. in a mixed gas atmosphere of nitrogen and oxygen for one hour.

Then, the conductive films 21*a* and 21*b* serving as a pair of electrodes were formed in contact with the oxide insulating film 17.

First, a conductive film was formed over the oxide insulating film 17 and the oxide semiconductor film 19*a*. The conductive film was formed in such a manner that a 400-nm-thick aluminum film was formed over a 50-nm-thick tungsten film and a 100-nm-thick titanium film was formed over the aluminum film. Then, a mask was formed over the conductive film through a photolithography process and part of the conductive film was etched with the use of the mask, whereby the conductive films 21*a* and 21*b* serving as a pair of electrodes were formed.

Next, the substrate was transferred to a treatment chamber in a reduced pressure and heated at 220° C. Then, the oxide insulating film 17 was exposed to oxygen plasma generated in a dinitrogen monoxide atmosphere by supply of a high-frequency power of 150 W to an upper electrode in the treatment chamber with the use of a 27.12 MHz high-frequency power source.

Then, the oxide insulating film was formed over the oxide insulating film 17 and the conductive films 21*a* and 21*b* and then part of the oxide insulating film was etched to form the oxide insulating films 23 and 25.

Here, the oxide insulating films 23 and 25 were formed.

As the oxide insulating film 23, a 50-nm-thick silicon oxynitride film was formed by a plasma CVD method under the following conditions: silane with a flow rate of 30 sccm and dinitrogen monoxide with a flow rate of 2000 sccm were used as a source gas; the pressure in a treatment chamber was 40 Pa; the substrate temperature was 220° C.; and a high-frequency power of 150 W was supplied to parallel plate electrodes.

As the oxide insulating film 25, a 400-nm-thick silicon oxynitride film was formed by a plasma CVD method under the following conditions: silane with a flow rate of 160 sccm and dinitrogen monoxide with a flow rate of 4000 sccm were used as a source gas; the pressure in a treatment chamber was 200 Pa, the substrate temperature was 220° C.; and a high-frequency power of 1500 W was supplied to parallel plate electrodes. Under the above conditions, it is possible to form a silicon oxynitride film in which the oxygen content is higher than that in the stoichiometric composition and from which part of oxygen is released by heating.

Then, heat treatment was performed so that water, nitrogen, hydrogen, or the like was released from the oxide insulating films 23 and 25 and part of oxygen contained in the oxide insulating film 25 was supplied to the oxide semiconductor film. Here, the heat treatment was performed at 350° C. in a mixed gas atmosphere of nitrogen and oxygen for one hour.

Then, after a metal film was formed over the oxide insulating film 25, oxygen was introduced into the metal film to form a metal oxide film.

Here, the metal film formed of an aluminum film was exposed to oxygen plasma generated in a sputtering apparatus to oxidize the metal film, so that a 5-nm-thick aluminum oxide film was formed as the metal oxide film.

Then, a 100-nm-thick nitride insulating film 29 was formed over the metal oxide film. The nitride insulating film was formed by a plasma CVD method under the following conditions: silane with a flow rate of 50 sccm, nitrogen with a flow rate of 5000 sccm, and an ammonia gas with a flow rate of 100 sccm were used as a source gas; the pressure in the treatment chamber was 100 Pa; the substrate temperature was 350° C.; and a high-frequency power of 1000 W was supplied to parallel plate electrodes.

Next, an opening that reaches the conductive film 13 serving as a gate electrode was formed in the nitride insulating film 15, the oxide insulating films 23 and 25, the metal oxide film 27, and the nitride insulating film 29.

Then, the conductive film 31*a* serving as a gate electrode was formed over the nitride insulating film 29. The conductive film 31*a* serving as a gate electrode was provided so as to be electrically connected to the conductive film 13 serving as a gate electrode.

Here, as the conductive film 31*a* serving as a gate electrode, a 100-nm-thick conductive film of an indium oxide-tin oxide compound (ITO-$SiO_2$) containing silicon oxide was formed by a sputtering method. Note that the composition of a sputtering target used for forming the conductive film was $In_2O_3$:$SnO_2$:$SiO_2$=85:10:5 [wt %].

After that, heat treatment was performed at 250° C. in a nitrogen atmosphere for one hour.

Through the above process, the transistor included in Sample E1 was formed.

Note that in this example, the channel widths of the formed transistors were 2 μm, and the channel lengths thereof were 1 μm, 1.25 μm, 1.5 μm, 2 μm, 4 μm, and 6 μm.

<Sample E2>

As a comparative example, a transistor that is different from the transistor 102a in FIG. 16 in that neither the metal oxide film 27 nor the conductive film 31a serving as a gate electrode was provided was formed. A sample including the transistor is referred to as Sample E2.

<Sample E3>

As a comparative example, a transistor that is different from the transistor 102a in FIG. 16 in that the metal oxide film 27 was not provided was formed. A sample including the transistor is referred to as Sample E3.

<Vg-Id Characteristics>

Next, the Vg-Id characteristics of the transistors included in Samples E1 to E3 were measured. Here, changes in characteristics of current flowing between a source and a drain (hereinafter referred to as drain current Id), that is, Vg-Id characteristics were measured under the following conditions: the substrate temperature was 25° C., the potential difference between the source and the drain (hereinafter referred to as drain voltage Vd) was 1 V or 10 V, and the potential difference between the source and the gate (hereinafter referred to as gate voltage Vg) was changed from −15 V to 15 V.

Figure 25A:
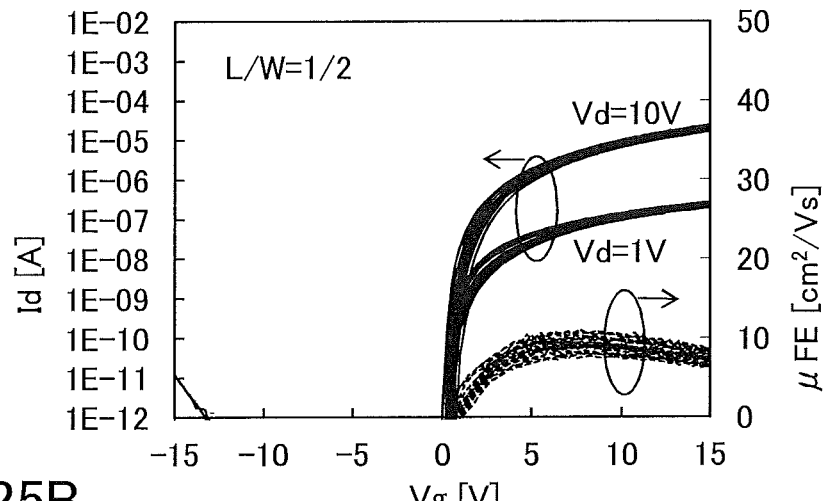
FIGS. 25A to 25C are graphs each showing Vg-Id characteristics.
Figure 25B:
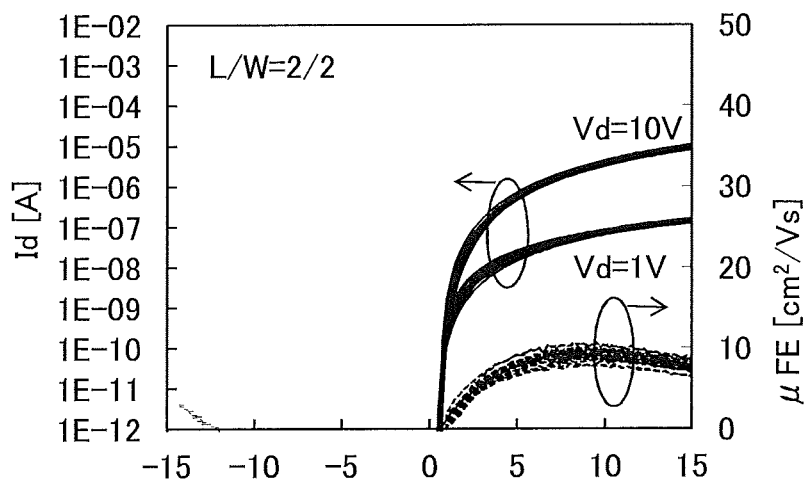
Figure 25C:
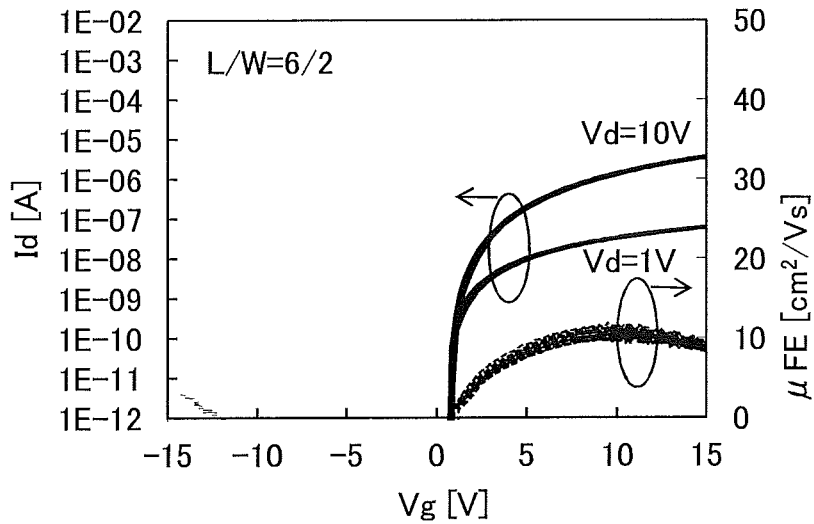

FIG. 25A shows the Vg-Id characteristics of the transistor in Sample E1 with a channel length of 1 μm, FIG. 25B shows the Vg-Id characteristics of the transistor in Sample E1 with a channel length of 2 μm, and FIG. 25C shows the Vg-Id characteristics of the transistor in Sample E1 with a channel length of 6 μm. In FIGS. 25A to 25C, the horizontal axis, the first vertical axis, and the second vertical axis represent gate voltage Vg, drain current Id, and field-effect mobility, respectively. Here, to show field-effect mobility in a saturation region, field-effect mobility calculated when Vd 10 V is shown.

The results shown in FIGS. 25A to 25C indicate that the transistor in Sample E1 had excellent Vg-Id characteristics.

<Relation Between Channel Length and Threshold Voltage>

Figure 26:
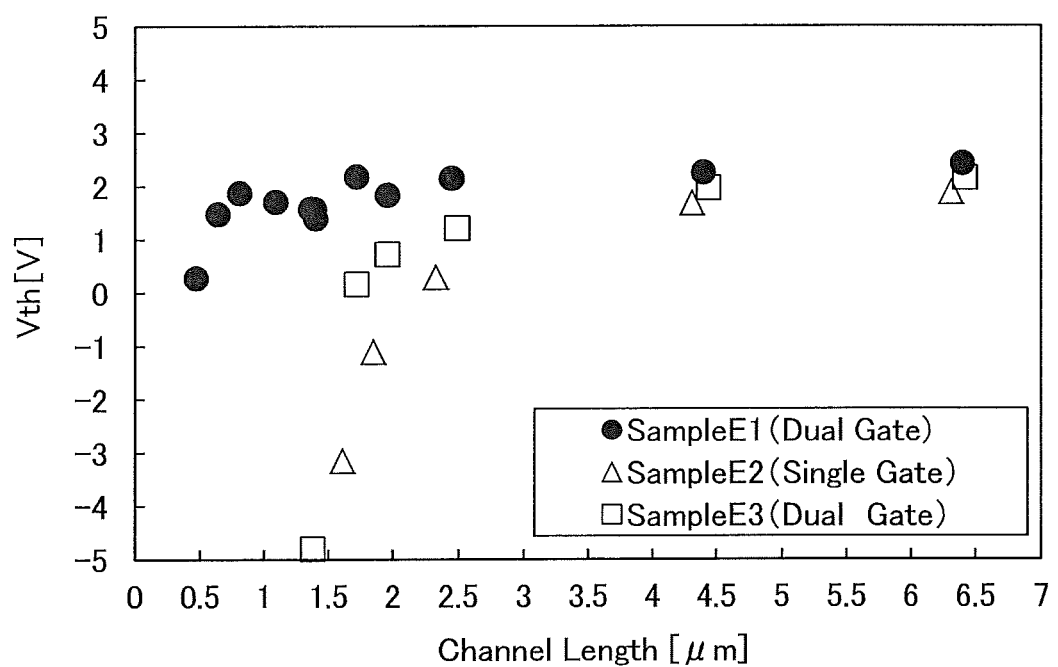
FIG. 26 is a graph showing the relation between channel length and threshold voltage.

The relation between the channel length L and the threshold voltage Vth of the transistors in Samples E1 to E3 will be described. In FIG. 26, the threshold voltages Vth of the transistors in Samples E1 to E3 with respective channel lengths L are plotted, where the horizontal axis represents the measured values of the channel lengths of the transistors and the vertical axis represents the threshold voltages of the transistors.

The amount of change in the threshold voltage of the transistor in Sample E1 is small in the channel length range from 0.64 μm to 6.5 μm. On the other hand, the threshold voltages of the transistors in Sample E2 and E3 over each of which the metal oxide film 27 was not provided shift in the negative direction as the measured value of channel length is smaller; typically, in the channel length range less than 2 μm. These results suggest that in the case where the metal oxide film 27 was formed over the transistor as in Sample E1, oxygen was able to be introduced into the oxide insulating film formed over the oxide semiconductor film in the step of forming the metal oxide film 27 and also suggest that the oxygen transferred to the oxide semiconductor film and thus oxygen vacancies in the oxide semiconductor film was able to be reduced. In such a case, a transistor with a small channel length the threshold voltage of which changes little and which is normally off can be fabricated.

This application is based on Japanese Patent Application serial no. 2013-173867 filed with the Japan Patent Office on Aug. 23, 2013 and Japanese Patent Application serial no. 2014-038563 filed with the Japan Patent Office on Feb. 28, 2014, the entire contents of which are hereby incorporated by reference.

What is claimed is:

1. A semiconductor device comprising:
   a transistor comprising:
      a gate electrode;
      a first insulating film over the gate electrode;
      an oxide semiconductor film including a channel region on the first insulating film; and
      a source electrode and a drain electrode connected to the oxide semiconductor film;
   an oxide insulating film over and in contact with the channel region and over the source electrode and the drain electrode;
   a metal oxide film over the oxide insulating film;
   a light-transmitting conductive film over the metal oxide film; and
   a capacitor comprising:
      a first electrode;
      the metal oxide film serving as a dielectric film over in contact with the first electrode; and
      the light-transmitting conductive film as a second electrode over the metal oxide film,
   wherein the oxide semiconductor film and the first electrode contain a same material, and
   wherein the first electrode has a higher hydrogen concentration than the oxide semiconductor film.

2. The semiconductor device according to claim 1, wherein the oxide semiconductor film and the first electrode each contain indium and a metal element selected from aluminum, gallium, yttrium, zirconium, lanthanum, cerium, and neodymium.

3. The semiconductor device according to claim 1, wherein the metal oxide film contains aluminum oxide, aluminum oxynitride, gallium oxide, gallium oxynitride, yttrium oxide, yttrium oxynitride, hafnium oxide, hafnium oxynitride, titanium oxide, tantalum oxide, or tantalum oxynitride.

4. The semiconductor device according to claim 1, wherein the oxide semiconductor film and the first electrode each have a multilayer structure.

5. The semiconductor device according to claim 1, wherein the oxide insulating film contains silicon and oxygen such that the oxygen content is higher than that in a stoichiometric composition.

6. The semiconductor device according to claim 1, wherein the light-transmitting conductive film is a pixel electrode connected to one of the source electrode and the drain electrode.

7. A semiconductor device comprising:
   a transistor comprising:
      a gate electrode;
      a first insulating film over the gate electrode;
      an oxide semiconductor film including a channel region on the first insulating film; and
      a source electrode and a drain electrode connected to the oxide semiconductor film;
   an oxide insulating film over and in contact with the channel region and over the source electrode and the drain electrode;

a stacked film comprising a metal oxide film and a nitride insulating film over the oxide insulating film;
a light-transmitting conductive film over the stacked film; and
a capacitor comprising:
a first electrode;
the stacked film serving as a dielectric film of the capacitor over in contact with the first electrode; and
the light-transmitting conductive film as a second electrode over the stacked film,
wherein the oxide semiconductor film and the first electrode contain a same material, and
wherein the first electrode has a higher hydrogen concentration than the oxide semiconductor film.

8. The semiconductor device according to claim 7, wherein the nitride insulating film contains hydrogen.

9. The semiconductor device according to claim 7, wherein in the stacked film, the nitride insulating film is over the metal oxide film.

10. The semiconductor device according to claim 7, wherein in the stacked film, the metal oxide film is over the nitride insulating film.

11. The semiconductor device according to claim 7, wherein the oxide semiconductor film and the first electrode each contain indium and a metal element selected from aluminum, gallium, yttrium, zirconium, lanthanum, cerium, and neodymium.

12. The semiconductor device according to claim 7, wherein the metal oxide film contains aluminum oxide, aluminum oxynitride, gallium oxide, gallium oxynitride, yttrium oxide, yttrium oxynitride, hafnium oxide, hafnium oxynitride, titanium oxide, tantalum oxide, or tantalum oxynitride.

13. The semiconductor device according to claim 7, wherein the oxide semiconductor film and the first electrode each have a multilayer structure.

14. The semiconductor device according to claim 7, wherein the oxide insulating film contains silicon and oxygen such that the oxygen content is higher than that in a stoichiometric composition.

15. The semiconductor device according to claim 7, wherein the light-transmitting conductive film is a pixel electrode connected to one of the source electrode and the drain electrode.

16. The semiconductor device according to claim 1,
wherein a concentration of hydrogen contained in the oxide semiconductor film is lower than $5\times10^{19}$ atoms/cm$^3$, and
wherein a concentration of hydrogen contained in the first electrode is higher than or equal to $8\times10^{19}$ atoms/cm$^3$.

17. The semiconductor device according to claim 7,
wherein a concentration of hydrogen contained in the oxide semiconductor film is lower than $5\times10^{19}$ atoms/cm$^3$, and
wherein a concentration of hydrogen contained in the first electrode is higher than or equal to $8\times10^{19}$ atoms/cm$^3$.

18. The semiconductor device according to claim 1, wherein the first electrode has lower resistivity than the oxide semiconductor film.

19. The semiconductor device according to claim 7, wherein the first electrode has lower resistivity than the oxide semiconductor film.

20. The semiconductor device according to claim 1, wherein the semiconductor device further comprises a second oxide insulating film between the oxide insulating film and the metal oxide film.

21. The semiconductor device according to claim 7, wherein the semiconductor device further comprises a second oxide insulating film between the oxide insulating film and the metal oxide film.

22. The semiconductor device according to claim 1, wherein the metal oxide film is partly in contact with the first insulating film.

23. The semiconductor device according to claim 7, wherein the metal oxide film is partly in contact with the first insulating film.

24. The semiconductor device according to claim 1, wherein the metal oxide film is partly in contact with one of the source electrode and the drain electrode.

25. The semiconductor device according to claim 7, wherein the metal oxide film is partly in contact with one of the source electrode and the drain electrode.

26. The semiconductor device according to claim 1, wherein the oxide insulating film is not provided between the first electrode and the light-transmitting conductive film in the capacitor.

27. The semiconductor device according to claim 7, wherein the oxide insulating film is not provided between the first electrode and the light-transmitting conductive film in the capacitor.

28. A semiconductor device comprising:
a transistor comprising:
a gate electrode;
a first insulating film over the gate electrode;
an oxide semiconductor film including a channel region on the first insulating film; and
a source electrode and a drain electrode connected to the oxide semiconductor film;
an oxide insulating film over and in contact with the channel region and over the source electrode and the drain electrode;
a metal oxide film over the oxide insulating film;
a light-transmitting conductive film over the metal oxide film; and
a capacitor comprising:
a first electrode;
the metal oxide film serving as a dielectric film in contact with the first electrode; and
the light-transmitting conductive film as a second electrode over the metal oxide film,
wherein the oxide semiconductor film and the first electrode contain a same material.

29. The semiconductor device according to claim 28, wherein the oxide semiconductor film and the first electrode each contain indium and a metal element selected from aluminum, gallium, yttrium, zirconium, lanthanum, cerium, and neodymium.

30. The semiconductor device according to claim 28, wherein the metal oxide film contains aluminum oxide, aluminum oxynitride, gallium oxide, gallium oxynitride, yttrium oxide, yttrium oxynitride, hafnium oxide, hafnium oxynitride, titanium oxide, tantalum oxide, or tantalum oxynitride.

31. The semiconductor device according to claim 28, wherein the oxide semiconductor film and the first electrode each have a multilayer structure.

32. The semiconductor device according to claim 28, wherein the oxide insulating film contains silicon and oxygen such that the oxygen content is higher than that in a stoichiometric composition.

33. The semiconductor device according to claim 28, wherein the light-transmitting conductive film is a pixel electrode connected to one of the source electrode and the drain electrode.

34. The semiconductor device according to claim 28, wherein the semiconductor device further comprises a second oxide insulating film between the oxide insulating film and the metal oxide film.

35. The semiconductor device according to claim 28, wherein the metal oxide film is partly in contact with the first insulating film.

36. The semiconductor device according to claim 28, wherein the metal oxide film is partly in contact with one of the source electrode and the drain electrode.

37. The semiconductor device according to claim 28, wherein the oxide insulating film is not provided between the first electrode and the light-transmitting conductive film in the capacitor.

38. The semiconductor device according to claim 28, further comprising a nitride insulating film over the metal oxide film,
   wherein part of the nitride insulating film serves as the dielectric film of the capacitor.

* * * * *